(12) United States Patent
Duan et al.

(10) Patent No.: US 11,575,006 B2
(45) Date of Patent: Feb. 7, 2023

(54) VAN DER WAALS INTEGRATION APPROACH FOR MATERIAL INTEGRATION AND DEVICE FABRICATION

(71) Applicant: THE REGENTS OF THE UNIVERSITY OF CALIFORNIA, Oakland, CA (US)

(72) Inventors: Xiangfeng Duan, Los Angeles, CA (US); Yu Huang, Los Angeles, CA (US); Yuan Liu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 100 days.

(21) Appl. No.: 16/982,477

(22) PCT Filed: Mar. 19, 2019

(86) PCT No.: PCT/US2019/022984
§ 371 (c)(1),
(2) Date: Sep. 18, 2020

(87) PCT Pub. No.: WO2019/183105
PCT Pub. Date: Sep. 26, 2019

(65) Prior Publication Data
US 2021/0020744 A1    Jan. 21, 2021

Related U.S. Application Data

(60) Provisional application No. 62/802,005, filed on Feb. 6, 2019, provisional application No. 62/731,607, filed
(Continued)

(51) Int. Cl.
*H01L 29/06* (2006.01)
*H01L 29/66* (2006.01)
(Continued)

(52) U.S. Cl.
CPC ...... *H01L 29/0684* (2013.01); *H01L 29/0665* (2013.01); *H01L 29/66969* (2013.01);
(Continued)

(58) Field of Classification Search
CPC ............ H01L 29/0665; H01L 29/0684; H01L 29/0688; H01L 29/1606; H01L 29/4232;
(Continued)

(56) References Cited

U.S. PATENT DOCUMENTS

2002/0058424 A1    5/2002 Rotondaro
2003/0226996 A1    12/2003 Aramaki et al.
(Continued)

OTHER PUBLICATIONS

Li, X. et al. "Performance potential and limit of MoS2 transistors." Adv. Mater. 27, 1547-1552 (2015).
(Continued)

*Primary Examiner* — Cheung Lee
(74) *Attorney, Agent, or Firm* — Foley & Lardner LLP

(57) ABSTRACT

An electronic or optoelectronic device includes: (1) a layer of a first material; and (2) a layer of a second material disposed on the layer of the first material, wherein the first material is different from the second material, and the layer of the first material is spaced from the layer of the second material by a gap.

20 Claims, 26 Drawing Sheets

Related U.S. Application Data on Sep. 14, 2018, provisional application No. 62/645,521, filed on Mar. 20, 2018.

(51) Int. Cl.
  *H01L 29/786* (2006.01)
  *H01L 51/05* (2006.01)
  *H01L 31/0352* (2006.01)
  *H01L 33/20* (2010.01)

(52) U.S. Cl.
  CPC .... *H01L 29/78696* (2013.01); *H01L 51/0558* (2013.01); *H01L 31/0352* (2013.01); *H01L 33/20* (2013.01)

(58) Field of Classification Search
  CPC ......... H01L 29/42384; H01L 29/66969; H01L 29/772; H01L 29/778; H01L 29/7788; H01L 29/7827; H01L 29/786; H01L 29/78642; H01L 29/78696; H01L 31/0248; H01L 31/0352; H01L 33/20; H01L 51/0558; B82Y 30/00; B82Y 40/00
  See application file for complete search history.

(56) References Cited

U.S. PATENT DOCUMENTS

| | | | |
|---|---|---|---|
| 2010/0110157 A1* | 5/2010 | Yonehara | H01L 21/6835 438/458 |
| 2012/0132885 A1 | 5/2012 | Lippert et al. | |
| 2014/0252415 A1 | 9/2014 | Nayfeh | |
| 2016/0163904 A1 | 6/2016 | Mailoa et al. | |
| 2017/0141194 A1* | 5/2017 | Shah | H01L 29/7787 |

OTHER PUBLICATIONS

Liu, Y. et al. "Pushing the Performance limit of sub-100 nm molybdenum disulfide transistors." Nano Lett. 16, 6337-6342 (2016).
Liu, Y. et al. "Toward barrier free contact to molybdenum disulfide using graphene electrodes.",Nano Lett. 15, 3030-3034 (2015).
Loo, Y.-L et al. "Soft, conformable electrical contacts for organic semiconductors: High-resolution plastic circuits by lamination.", Proc. Natl. Acad. Sci. 99, 10252-10256 (2002).
International Search Report on PCT/US2019/022984 dated Jul. 23, 2019.
Liu et al., "Van der Waals heterostructures and devices": Nature Review Materials, vol. 1, No. 9 (Jul. 2016), p. 1-17 (the entire document).

* cited by examiner

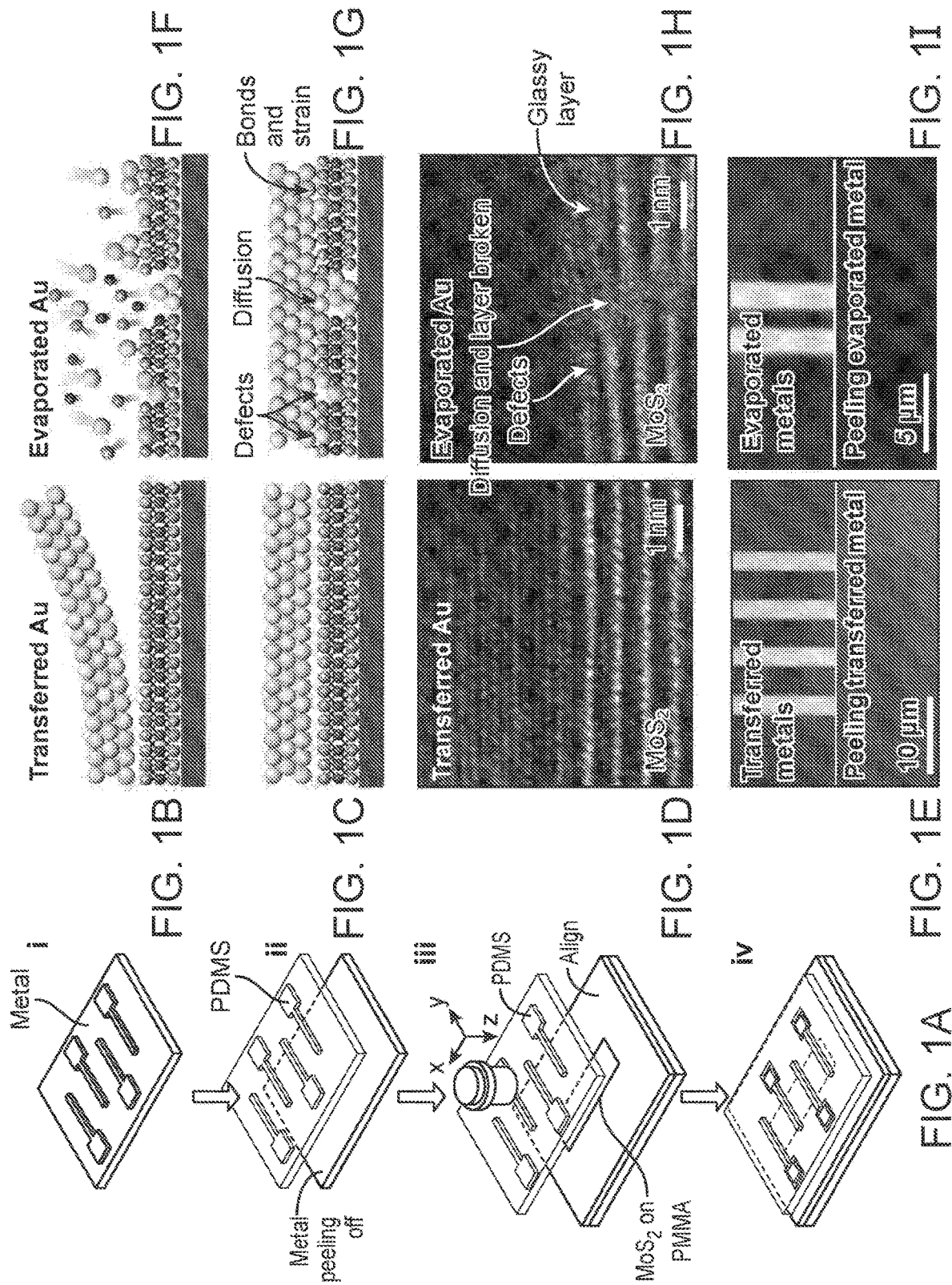

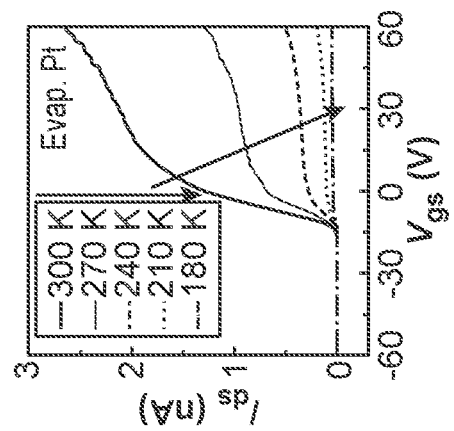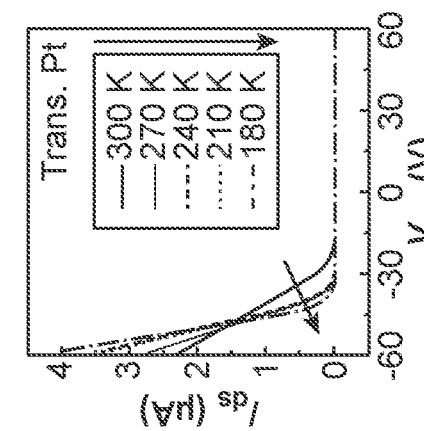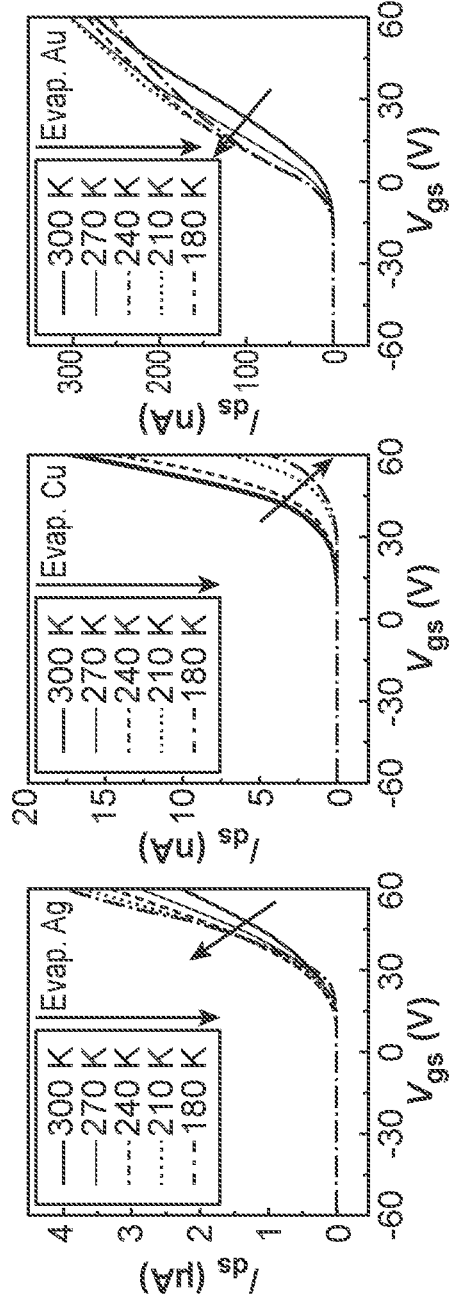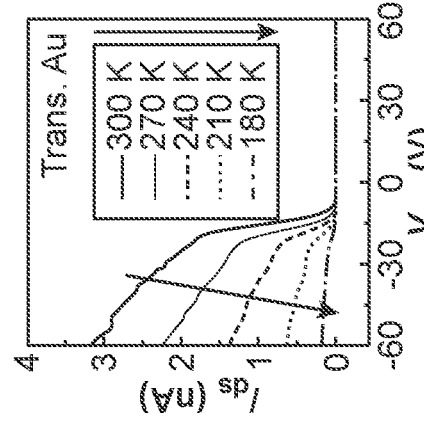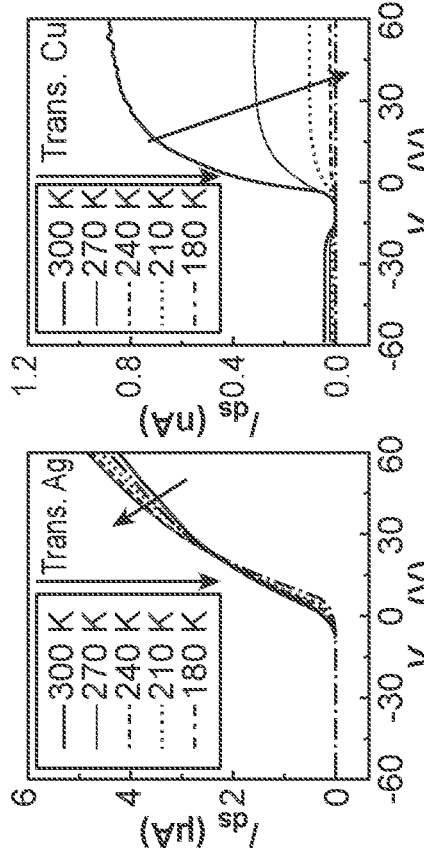

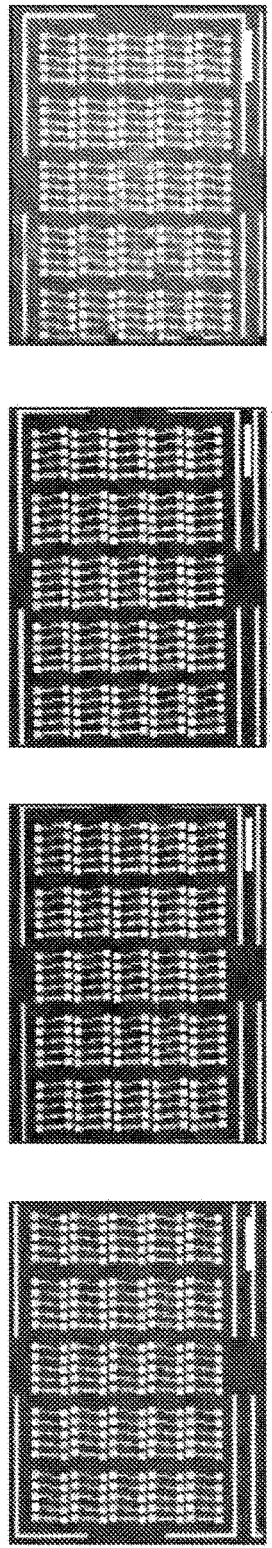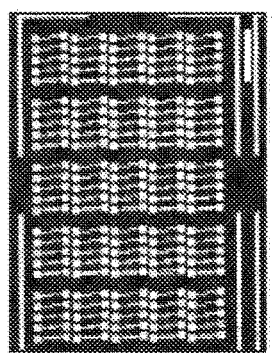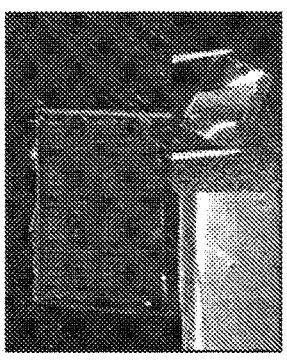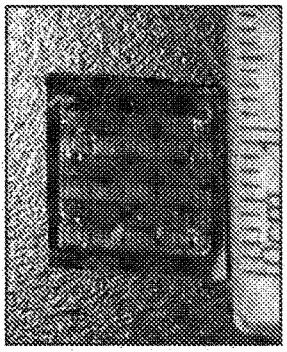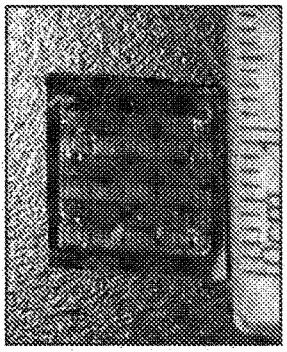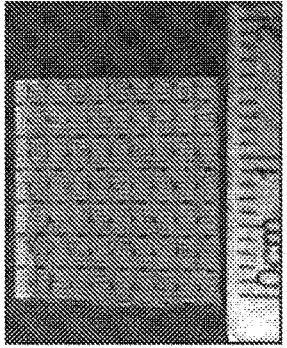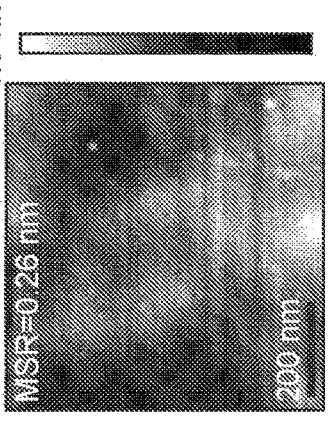

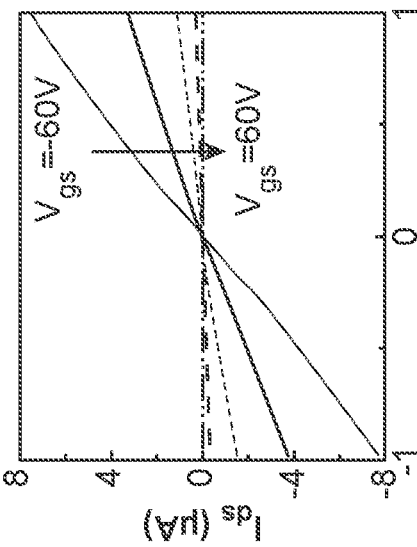
FIG. 7A
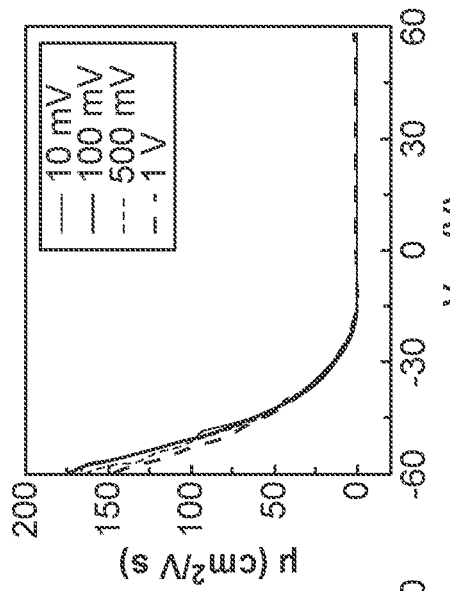
FIG. 7B
FIG. 7C
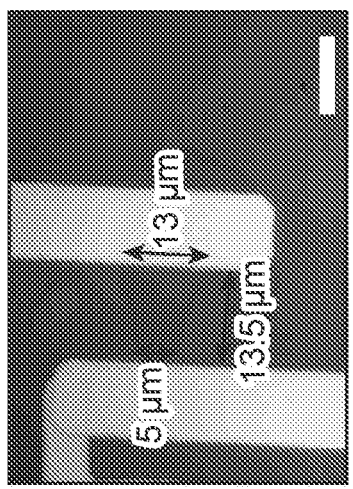
FIG. 7D
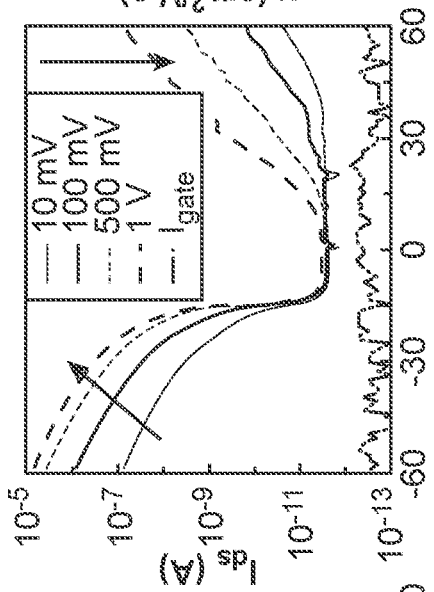
FIG. 7E
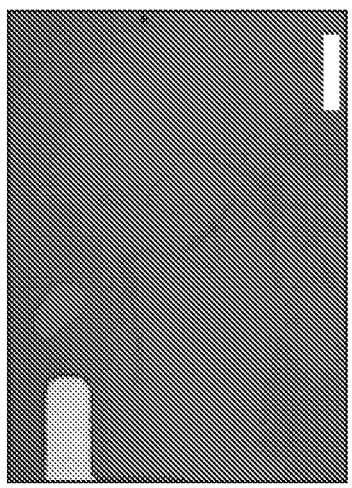
FIG. 7F

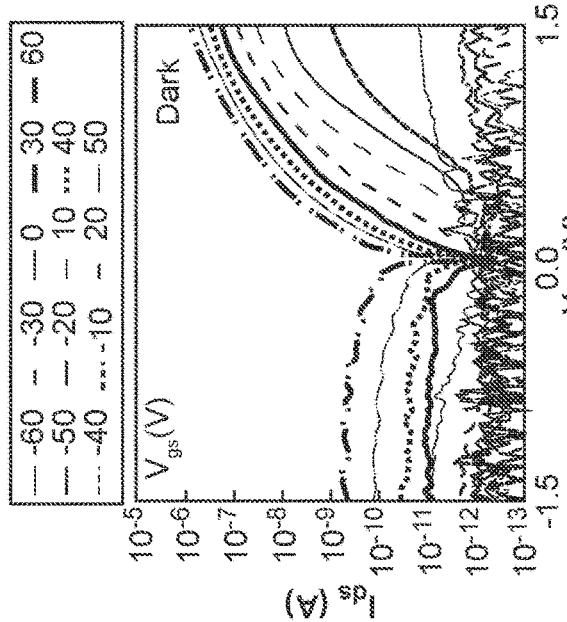
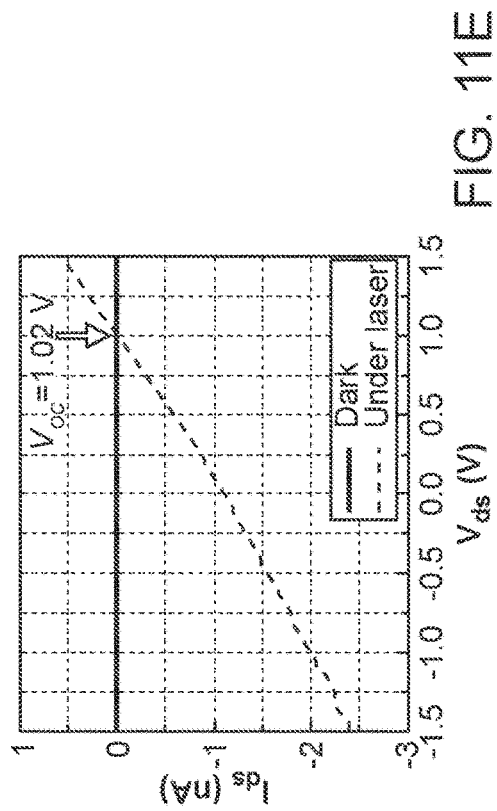
FIG. 11A
FIG. 11B
FIG. 11C
FIG. 11D
FIG. 11E

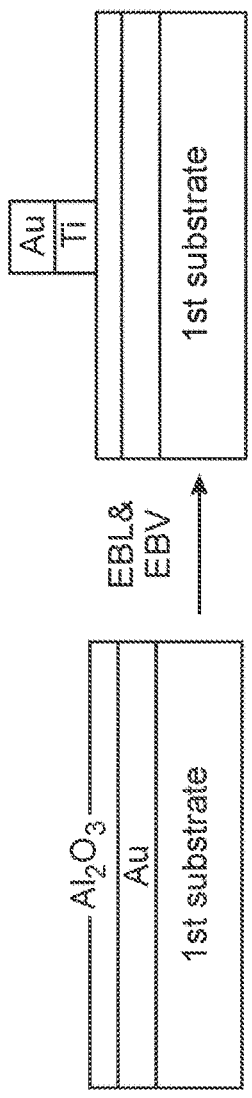
FIG. 14A
FIG. 14B
FIG. 14C
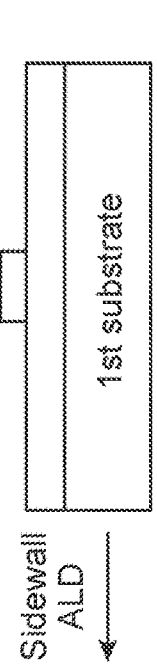
FIG. 14D
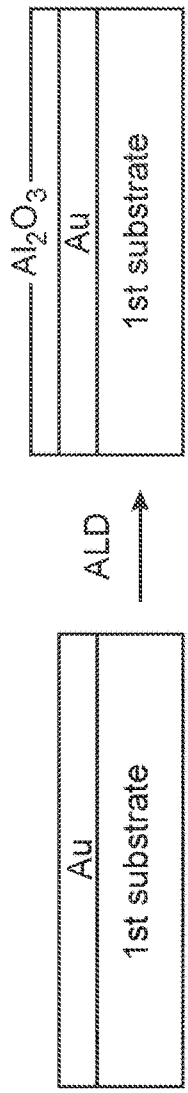
FIG. 14E
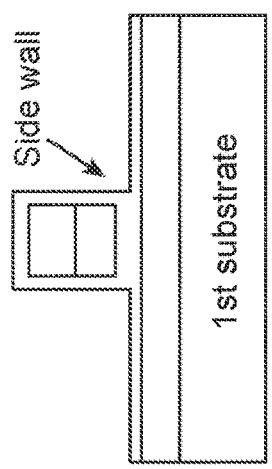
FIG. 14F
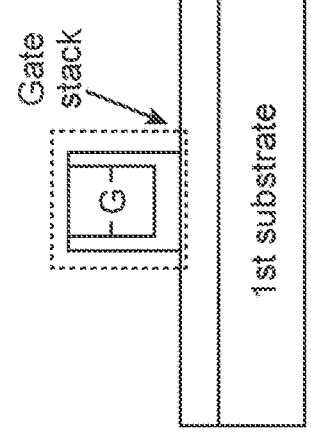
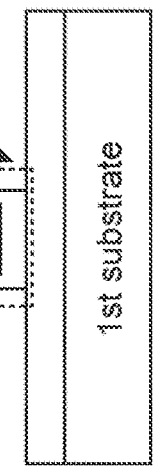

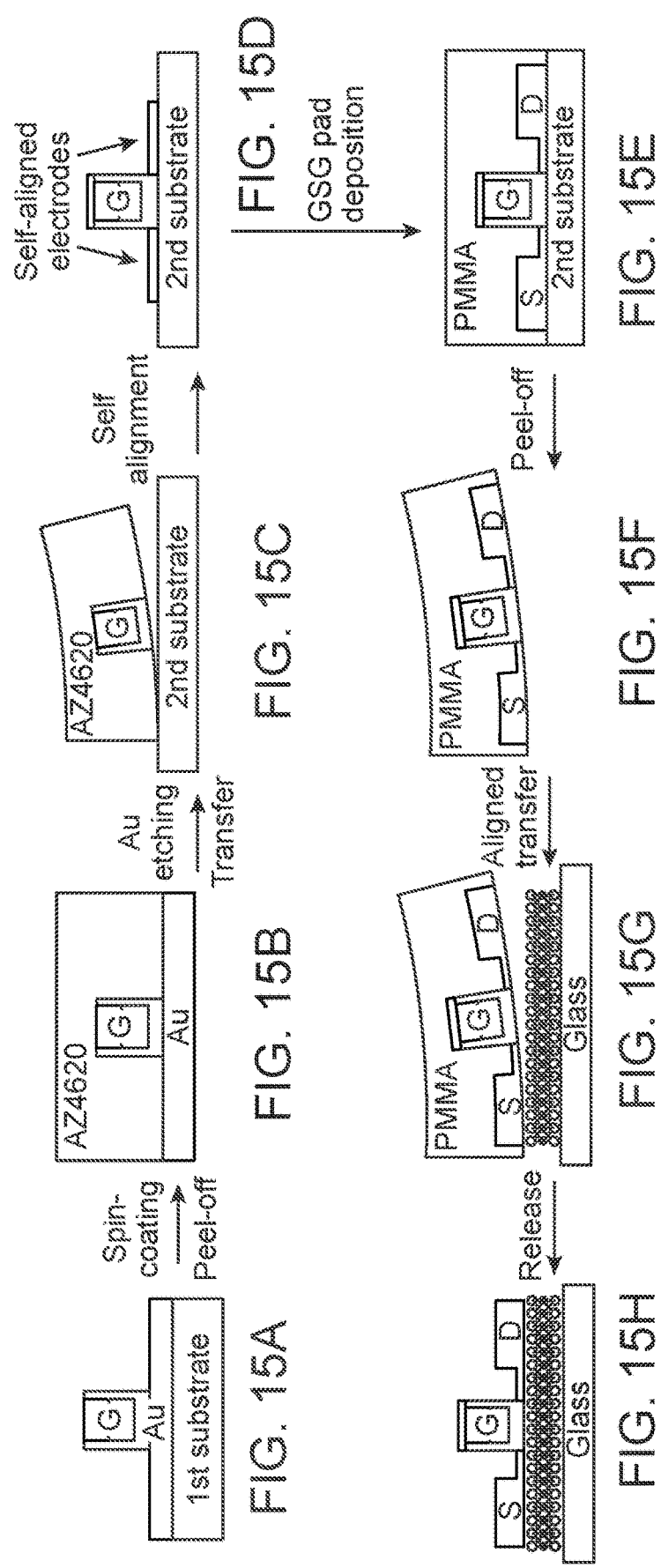

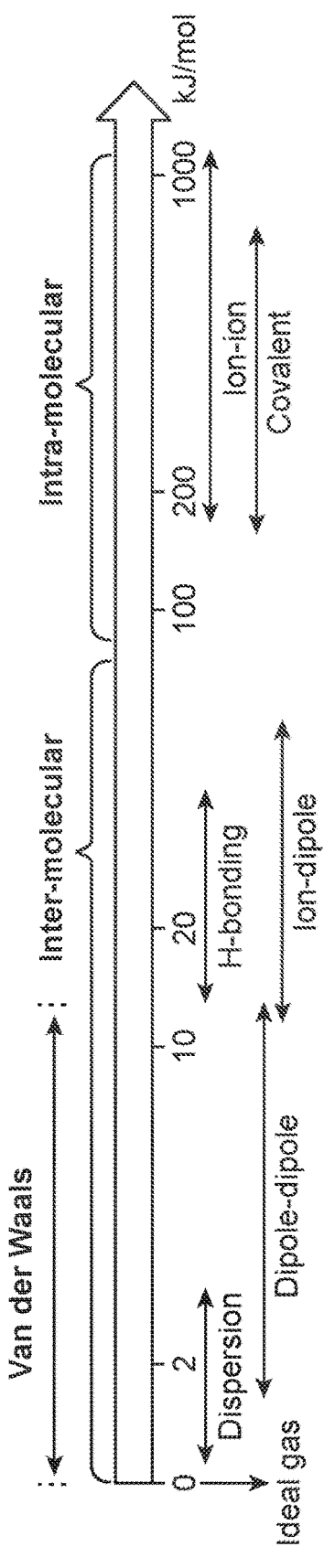
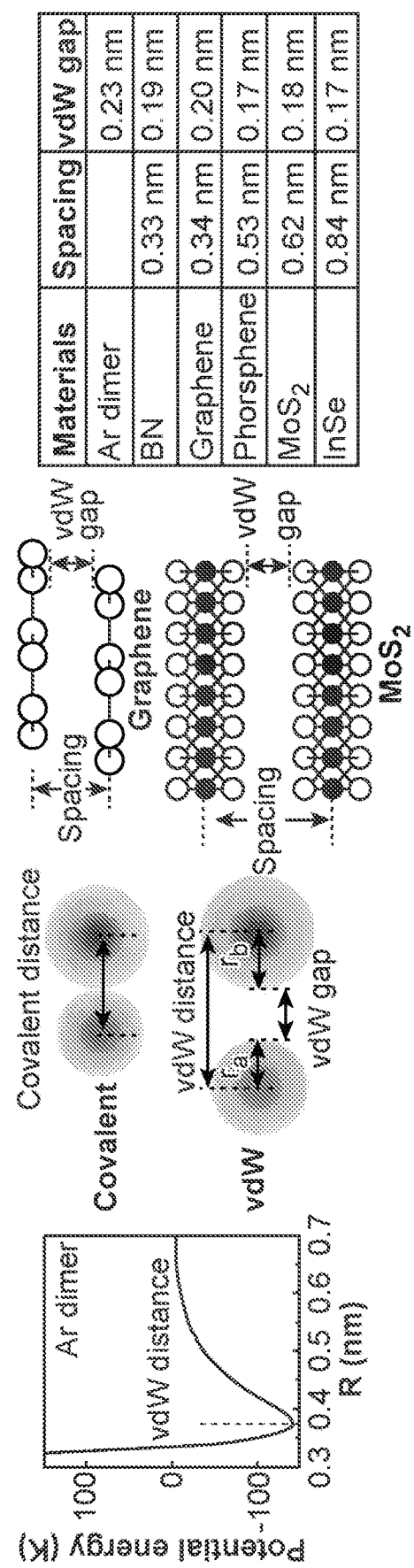
FIG. 19A
FIG. 19B
FIG. 19C
FIG. 19D
FIG. 19E

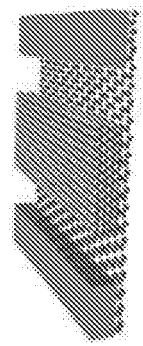
FIG. 20A 2D-2D FET
FIG. 20B 2D-2D GMR
FIG. 20C 0D-2D Photodiode
FIG. 20D 1.5D-2D FET
FIG. 20E 1D-2D HEMT
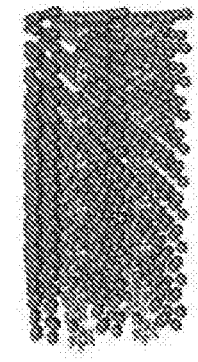
FIG. 20F 2D-0D Superlattice
FIG. 20G 2D-3D TFET
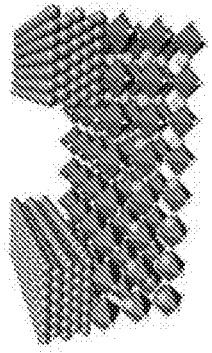
FIG. 20H 3D-3D Photoconductor

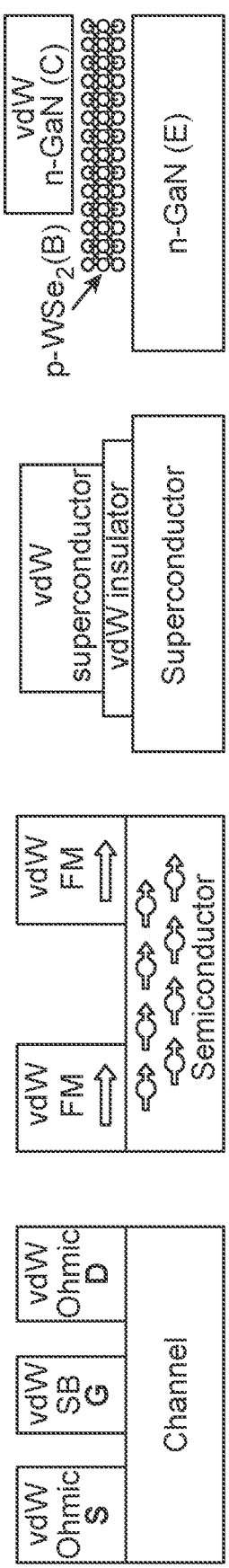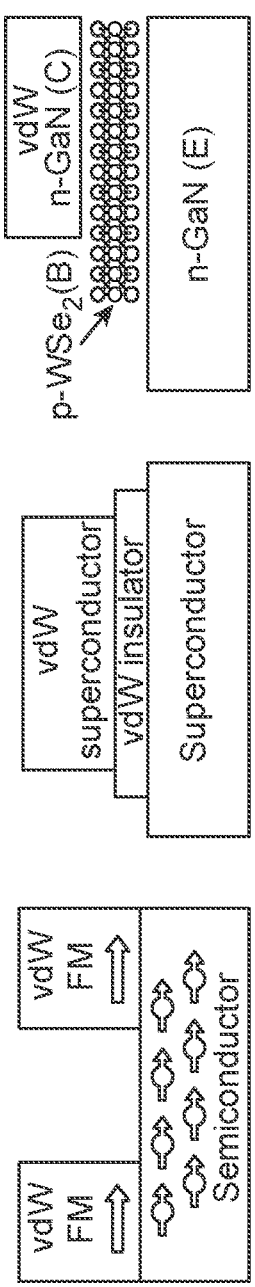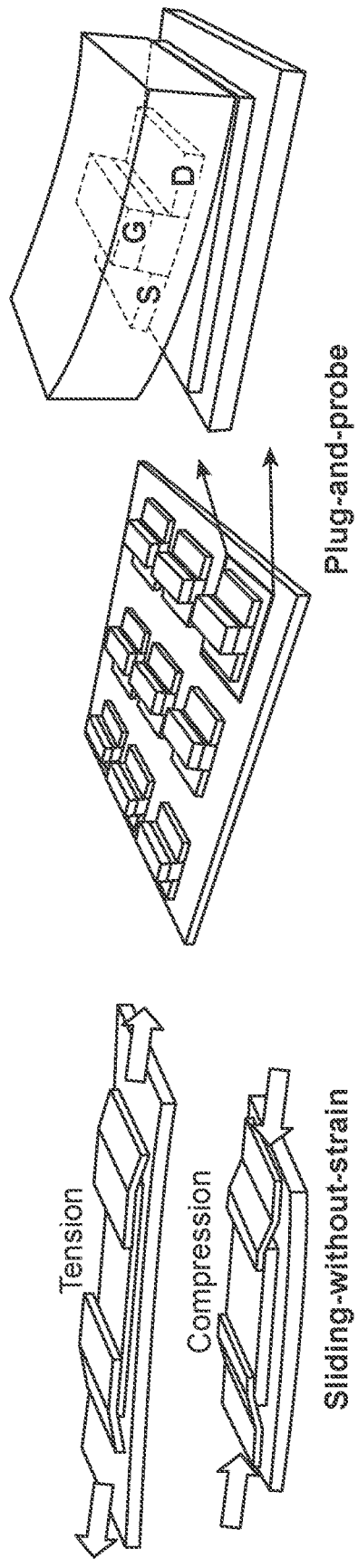

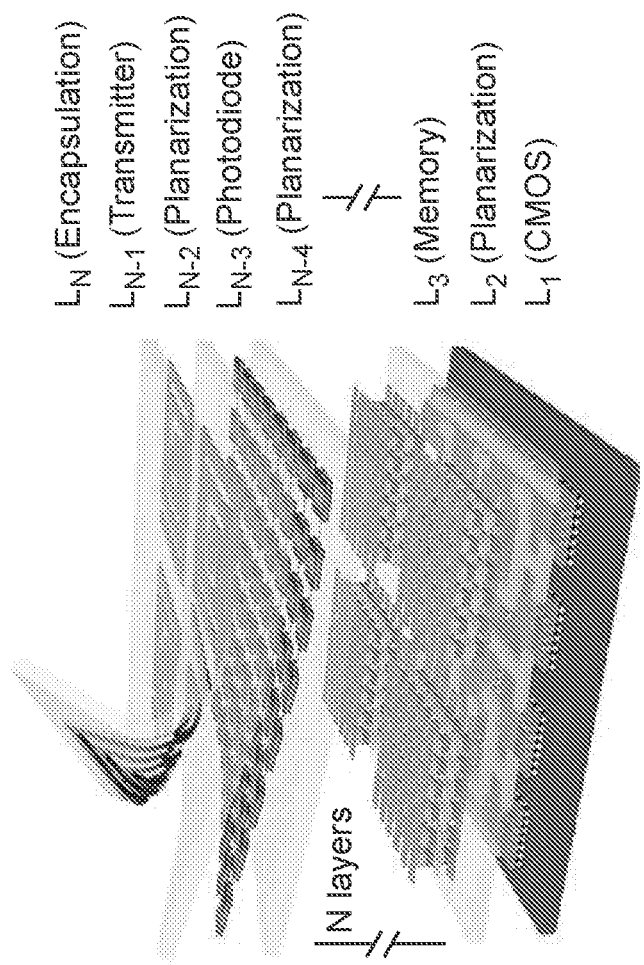
FIG. 22A
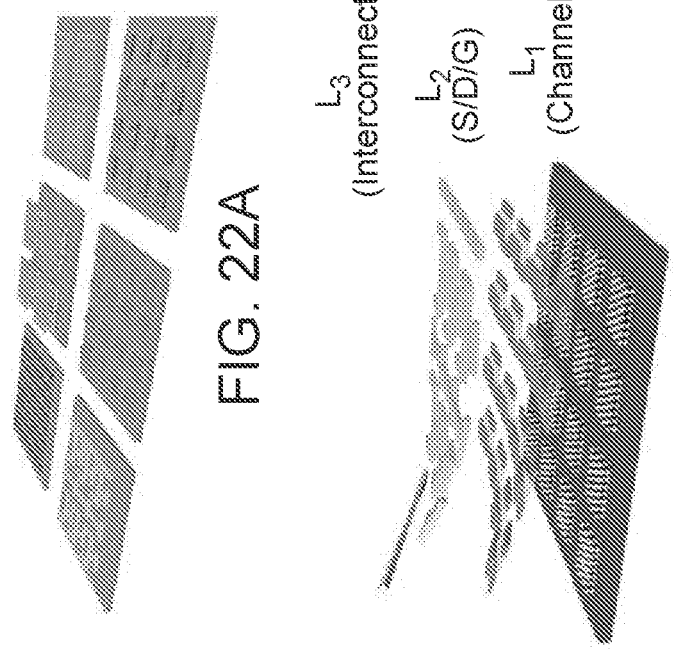
FIG. 22B
3-layer vdW CMOS integration
FIG. 22C
Multilayer vdW system integration

FIG. 23

VAN DER WAALS INTEGRATION APPROACH FOR MATERIAL INTEGRATION AND DEVICE FABRICATION

CROSS-REFERENCE TO RELATED APPLICATIONS

This application is a National Stage Entry of International Application No. PCT/US2019/022984, filed Mar. 19, 2019, which claims the benefit of and priority to U.S. Provisional Application No. 62/645,521, filed Mar. 20, 2018, the benefit of U.S. Provisional Application No. 62/731,607, filed Sep. 14, 2018, and the benefit of U.S. Provisional Application No. 62/802,005, filed Feb. 6, 2019, the contents of which are incorporated herein by reference in their entirety.

STATEMENT REGARDING FEDERALLY SPONSORED RESEARCH OR DEVELOPMENT

This invention was made with government support under Grant Number N00014-15-I-2368, awarded by the U.S. Navy, Office of Naval Research and Grant Number EFRI-1433541, awarded by the National Science Foundation. The government has certain rights in the invention.

TECHNICAL FIELD

This disclosure generally relates to a van der Waals integration approach for material integration and device fabrication.

BACKGROUND

A comparative Ohmic contact is typically achieved through interface or doping engineering to reduce a Schottky barrier width, which typically involves aggressive processes (such as ion implantation and high temperature annealing) and is not applicable for many delicate materials such two-dimensional semiconductors or organic semiconductors. Such high temperature process is involved because ion implantation and metal deposition processes often introduce extensive interface disorder, and a high temperature process is designed for repairing some of the defects, reducing interface disorder, activating dopants and facilitating metal-semiconductor inter-diffusion or silicide formation. Despite such annealing process, a metal-semiconductor interface is still largely plagued by rich disorder and strain, with Fermi level pinning and low S-parameter in semiconductor devices.

It is against this background that a need arose to develop the embodiments described herein.

SUMMARY

In some embodiments, an electronic or optoelectronic device includes: (1) a layer of a first material; and (2) a layer of a second material disposed on the layer of the first material, wherein the first material is different from the second material, and the layer of the first material is spaced from the layer of the second material by a gap.

In some embodiments, a method of forming an electronic or optoelectronic device includes: (1) forming a layer of a second material on a substrate; and (2) transferring the layer of the second material from the substrate so as to be disposed on a layer of a first material.

In some embodiments, a method of forming an electronic or optoelectronic device includes: (1) forming a layer of a second material on a first substrate; (2) transferring the layer of the second material from the first substrate so as to be disposed on a second substrate; (3) forming a layer of a third material on the second substrate laterally adjacent to the layer of the second material; and (4) transferring the layer of the second material and the layer of the third material from the second substrate so as to be disposed on a layer of a first material.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 1. Illustration and structural characterizations of van der Waals metal-semiconductor (MS) contact. a, Schematic illustrations of van der Waals integration of MS contact: (i) metal deposition on sacrificial substrate, (ii) metal peeling-off, (iii) alignment, and (iv) contact lamination and probe window opening. b-d, Cross-sectional schematics and transmission electron microscopy (TEM) images of the transferred Au electrode on top of $MoS_2$, with atomically sharp and clean MS interfaces. e, Optical image of the $MoS_2$ device with transferred electrodes (upper) and with the transferred electrodes mechanically released (lower). The underlying $MoS_2$ layer retains its original shape after physical integration and separation of the Au thin film electrodes, indicating the transferred MS interface is free of direct chemical bonding. f-h, Cross-sectional schematics and TEM images of comparative electron-beam (e-beam) deposited Au electrodes on top of $MoS_2$, where the bombardment of $MoS_2$ surface by high energy Au atoms and clusters creates considerable damage to $MoS_2$ surface, producing a glassy layer with apparent defects, interface diffusion, chemical bonding and atomic disorder. i, Optical image of an $MoS_2$ flake with deposited electrodes (upper) and with the deposited electrodes mechanical released (lower), where the underlying $MoS_2$ surface is destroyed while removing the deposited electrodes, indicating direct chemical bonding and strong MS interaction in deposited MS junctions.

FIG. 2. Transfer characteristic of $MoS_2$ transistors with deposited and transferred metal electrodes. a-d, $I_{ds}$–$V_{gs}$ transfer curve of $MoS_2$ transistors with deposited Ag (a), Cu (b), Au (c) and Pt (d) electrodes by e-beam evaporation. N-type behavior is observed irrespective of the highly distinct work functions of the contact metal used, indicating strong Fermi level pinning near the conduction band edge. e-h, $I_{ds}$–$V_{gs}$ transfer curve of $MoS_2$ transistors with transferred Ag (e), Cu (f), Au (g) and Pt (h) electrodes. The device can be switched from n-type to p-type characteristics with the increasing work function of the contact electrodes, indicating highly tunable electron and hole barriers depending the work function of the transferred contact metal used. The bias voltage is fixed at about 100 mV, and the gate capacitance is composed of about 300 nm thick $SiO_2$ and about 170 nm thick poly(methyl methacrylate) (PMMA) for all measurements.

FIG. 5. Optical images, photos and characterization of metal electrodes transfer process. a-d, The optical images of gold electrodes deposited on SiO$_2$ substrate (a), physically released using about 1 μm thick PMMA (b), attached on polydimethylsiloxane (PDMS) (with PMMA) substrate (c), and alignment transferred on target substrate (d). The scale bar is 200 μm in a-d. e-h, The corresponding photos of gold electrodes deposited on SiO$_2$ substrate (e), physically released using about 1 μm thick PMMA (f), attached on PDMS (with PMMA) substrate (g), and alignment transferred on target substrate (h). i, Atomic force microscopy (AFM) image of transferred Au film bottom side, with a root mean surface roughness of about 0.26 nm.

FIG. 7. Hole-mobility device using transferred Pt as the contact electrodes. a, Optical image of a MoS$_2$ flake on PMMA/SiO$_2$ substrate. b, Optical image of the MoS$_2$ flake after contacted by transferred Pt electrodes. The channel length here is about 13.5 μm and the effective channel width is about 8.37 μm. The scale bar in (a, b) is about 10 μm. $I_{ds}$—$V_{ds}$ output curve of the fabricated MoS$_2$ transistor under various gate voltages from about −60 V to about 60 V. d, e, Linear (d) and semi-log (e) plot $I_{ds}$—$V_{gs}$ transfer curve of the fabricated MoS$_2$ transistor under various bias voltages of about 10 mV, about 100 mV, about 500 mV, and about 1 V. The bottom line is the gate leakage current ($I_g$), which is one order of magnitude smaller (constrained by equipment) compared to $I_{ds}$ and does not noticeably affect the overall carrier transport. Under large gate voltage, the channel majority carrier is inverted to electrons and the carrier concentration is increased exponentially, greatly reducing the electron Schottky barrier width. As a result, the electrons can tunnel through the thin Schottky barrier from source side, which accounts for the observed ambipolar behavior. f, The extracted two-terminal field effect hole mobility at various bias voltages of about 10 mV, about 100 mV, about 500 mV, and about 1 V. The W/L ratio is about 0.62 and the gate capacitance is composed of about 300 nm thick SiO$_2$ and about 170 nm thick PMMA, and is calculated to be about 6.2 nF/cm$^2$. The highest extracted hole mobility is about 175 cm$^2$/V s. All measurements are conducted at room temperature in probe stations.

FIG. 11. Optical response of transferred Ag-Pt asymmetric electrodes on monolayer $MoS_2$. a, Optical image of monolayer $MoS_2$ mechanically peeled on about 170 nm PMMA/300 nm $SiO_2$ substrate. b, Optical image of the device after Ag-Pt asymmetric electrodes are transferred on top of monolayer $MoS_2$. The scale bar in (a, b) is 10 μm. c, The semi-log plot of $I_{ds}$—$V_{ds}$ output curve under various gate voltages (about −60 V to about 60 V, about 10 V step) under dark condition. The Pt is always biased and the Ag is grounded. d, The semi-log plot of $I_{ds}$—$V_{ds}$ output curve under various gate voltages (about −60 V to about 60 V, about 10 V step) under laser illumination. e, The $I_{ds}$—$V_{ds}$ output curve under dark and laser illumination, under gate voltage of about −50 V. Highest open circuit voltage of about 1.02 V is observed in monolayer devices.

FIG. 13. a, Lattice schematics of bulk semiconductor and two-dimensional (2D) semiconductor. b, The mobilities of bulk and 2D semiconductor with reducing body thickness.

FIG. 14. Fabrication of top metal/dielectric stack on sacrificial wafer. a, Depositing about 50 nm thick gold as a sacrificial layer. b, Atomic layer deposition (ALD) of about 30 nm thick $Al_2O_3$ on gold layer as the gate dielectric. c, Define gate metal using high-resolution e-beam lithography and e-beam deposition. d, Reactive ion etching (ME) of $Al_2O_3$. e, ALD of about 10 nm thick $Al_2O_3$ as the side protection wall. f, RIE of $Al_2O_3$.

FIG. 15. Fabrication of high speed two-dimensional transistors based on van der Waals integration. a-c, Spin coating of thick photoresist to mechanically peel fabricated gate stack and transferred on a second wafer. d, Self-align the source-drain electrode by depositing about 10 nm thick metal (about 5 nm/about 5 nm Ag/Au). e-h, Using PMMA polymer to mechanically peel the gate stack and alignment transferred on top of $MoS_2$ on glass substrate.

FIG. 19. Specification of vdW interaction, vdW distance and vdW gap. a, The relative energies for various molecular interactions. VdW interaction is the weakest in inter-molecular interaction (also termed physical interaction), which is much smaller than typical intra-molecular interaction (also termed chemical interaction). b, The vdW energy potential versus distance for Ar dimer system, with a vdW distance value of about 0.38 nm (lowest potential point) and a vdW gap of about 0.23 nm (difference between vdW distance and covalent radius). c, Schematic illustration of vdW gap and vdW distance in covalent bonded system and vdW system. d, e, Comparison of layer spacing and the calculated vdW gap in various layered 2D materials. The calculated vdW gap exhibits a rather similar value of about 0.2 nm, comparable to that of Ar dimer.

FIG. 20. Schematics of vdW integrated electronic and optoelectronic devices. a, 2D/2D planar transistor with 2D semiconductor as the channel ($MoS_2$, yellow and black), 2D dielectric (BN, blue) as the encapsulation layer, and 2D metallic material (graphene, red) as the contact electrodes. b, 2D/2D vdW magnetic tunnel vertical junctions, with atomically thin $CrI_3$ (blue color) as a spin-filter tunnel barrier and graphene (red color) as contact electrodes. c, 0D/2D photodiode based on the vdW integration of quantum dot or plasmonic nanoparticles (blue) on top of graphene (red) without damaging its pristine lattice, allowing greatly enhanced photocurrent. d, 1.5D/2D top gate FET based on the vdW integration of 1.5D $Al_2O_3$ nanoribbon (as the dielectric, blue) on top of graphene (red) without damaging its pristine lattice. e, 1D/2D HEMT transistor obtained by vdW integrating 1D core-shell nanowire (blue) as a self-aligned mask to provide the 2D transistors (graphene, red) with high cut-off frequency. f, 2D/0D high order superlattice by intercalating 0D molecules (CTAB, blue color) into 2D material (phosphorene, red color), resulting in stable superlattice with radically different constituents and tunable interlayer distances. g, 2D/3D tunneling transistor using 2D $MoS_2$ (blue and black) and 3D Ge (red). The vdW integration of $MoS_2$ allows electronically abrupt junction that is desired for high efficiency electron tunneling, and the use of 3D germanium provides well-controlled doping density and desired electron affinity for ultra-small subthreshold swing. h, 3D/3D vdW integration allow damage-free metal contacts (blue) on delicate perovskite (red) with much more efficient charge transport.

FIG. 21. Prospects on opportunities arising in vdW integrated devices. a, A MESFET structure using 'one-stage' vdW integration of pre-fabricated metal electrodes with various work functions, resulting in low Schottky barrier (source and drain) and large Schottky barrier (gate) through a single integration stage. b, c, Schematic illustration of vdW integrated ferromagnetic/semiconductor junction (b) and superconductor/insulator/superconductor junction (c) for coherent charge injection in quantum electronic devices. The defect-free and pinning-free interface can significantly reduce interface disorder and the associated scattering that plague such devices. d, Heterostructure integration of n-GaN/p-$WSe_2$/n-GaN vdW structure for high performance heterojunction bipolar transistor (HBT) by replacing p-GaN with p-type $WSe_2$. e, Schematic illustration of vdW heterostructure (vdW metal, left and right components; stretchable semiconductor, middle component) with distinct stiffness under mechanical compression (lower) and tension (upper). The bonding-free vdW interaction allows two contacted materials to slide with each other and effectively release the local strain at the interface. f, g, 'Plug-and-probe' vdW integration, where the complex structure (e.g., source drain contacts and gate stack) is pre-fabricated on wafer scale. For each time used, one piece of the structure is cut from the wafer and laminated on the target material within a few seconds for directly probing its intrinsic properties.

FIG. 22. Prospects on layer-by-layer vdW assembling 3D electronic system. a, Schematics of building blocks for vdW device integration, and device layers for vdW system integration. b, Schematic illustration of circuit level (complementary metal-oxide-semiconductor (CMOS) circuit) vdW integration by assembling various building blocks including channel material (L1), electrodes and dielectrics (L2), and interconnects (L3) on target semiconductor layer. c, Schematic illustration of high order system level integration by vdW stacking multiple active layers with various functions (CMOS circuit, flash memory, photodiode cell, and transmitter), and low-temperature planarization layers (passive layer) in between.

Figure 23:
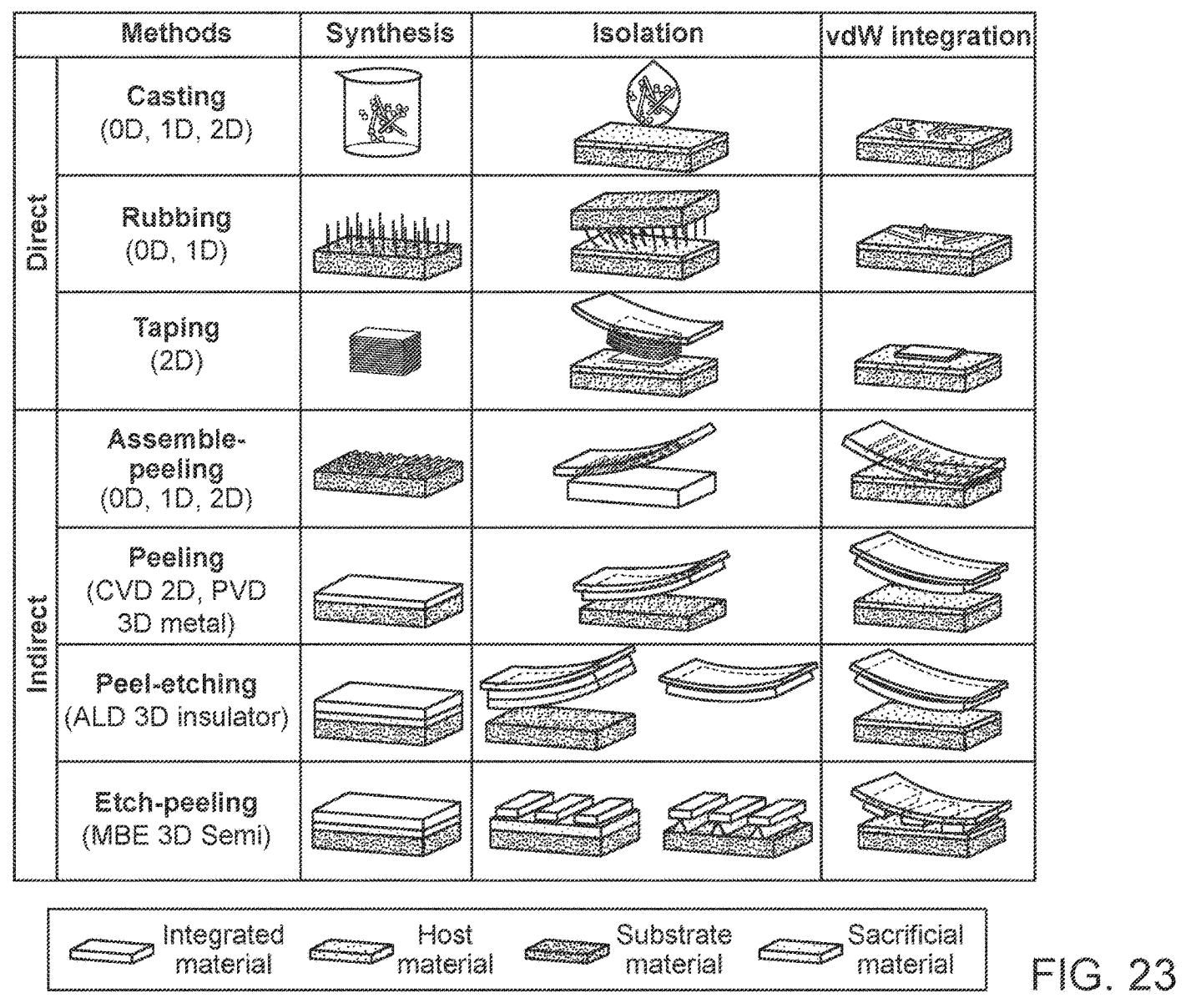

FIG. 23. 0D, 1D, 2D, 3D building blocks for vdW integration. Blue color represents the integrated material, red color represents the host material, dark gray and light gray represent the substrate material and sacrificial layer, respectively. The host material is involved in the isolation process for direct integration, but not involved in the isolation process of indirect integration.

DETAILED DESCRIPTION

Figure 3:
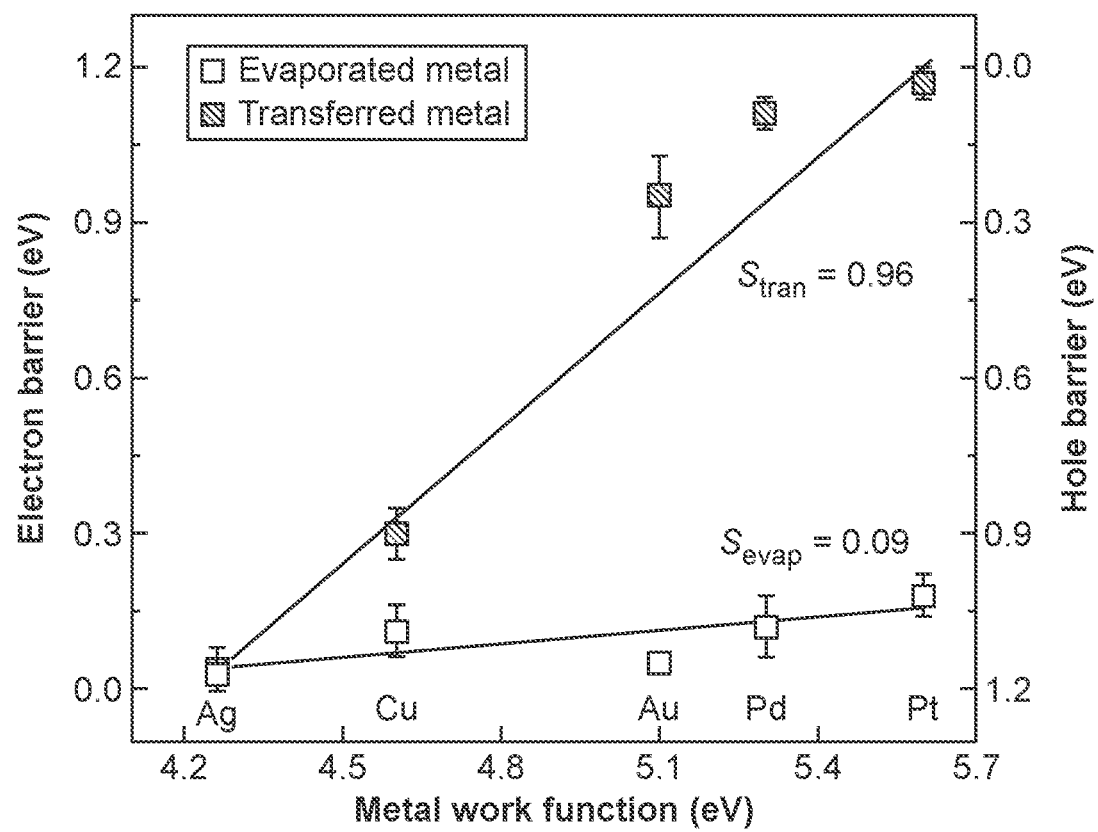
FIG. 3. Experimentally determined Schottky barrier height for different transferred metals and evaporated metals. Using transferred metal electrodes, the majority carrier type and corresponding Schottky barrier height is strongly dependent on the metal work function with a slope S(=about 0.96) approaching unity, indicating an excellent obedience of Schottky-Mott law. With the evaporation deposited metal electrodes, the devices invariably show n-type behavior with a small electron Schottky barrier and an S parameter of about 0.09, indicating the large pinning effect at MS interface fabricated using deposition process.

A comparative Ohmic contact is typically achieved through interface or doping engineering to reduce a Schottky barrier width, which typically involves aggressive processes and is not applicable for many delicate materials such two-dimensional (2D) semiconductors or organic semiconductors. The Ohmic contact is typically achieved by heavy doping to reduce the Schottky barrier width instead of Fermi level matching between a metal and a semiconductor. In contrast, a van der Waals (vdW) integration approach of some embodiments can avoid direct fabrication process on a semiconductor, can mitigate against surface degradation and can omit high temperature annealing process to repair interface defects. Such low temperature integration approach can also omit metals-semiconductor inter-diffusion, can mitigate against chemical bond formation, and therefore can reduce chemical disorder and interface pinning to attain nearly unity S-parameter.

The substantially damage-free vdW metal integration approach is advantageous for creating high performance devices from atomically thin 2D semiconductors and various other delicate semiconductors including, graphene, carbon nanotubes, molecular monolayers, organic thin films/crystals, and halide perovskite materials. Such materials are typically not stable under high temperature, not compatible with traditional micro-fabrication processes (e.g., soluble in various solvents used in lithography processes) or are highly prone to degradation during electrode deposition process (e.g., typical metal deposition process can introduce significant and sometimes fatal damage to resulting devices). Significantly, the vdW integration approach can offer a solution to this challenge. By omitting aggressive processes (e.g., lithography, deposition, spin-coating, or solvent liftoff) on a material of interest, the vdW integration approach can readily allow the formation of reliable and substantially damage-free contacts to such delicate materials to produce high performance devices. Indeed, with the approach, demonstration is made of 2D $MoS_2$ transistors with a high two-terminal electron mobility (e.g., about 260 $cm^2/Vs$) and a high hole mobility (e.g., about 175 $cm^2/Vs$) at room temperature, by selecting transferred metals (e.g., Ag or Pt) with work function matching $MoS_2$ conduction or valence band edge. Furthermore, by transferring asymmetric contact pairs with different work functions, demonstration is made of an Ag—$MoS_2$—Pt photodiode with an open circuit voltage of about 1.02 V. Such advancements timely address the challenges in making contacts to atomically thin 2D semiconductors, which is desired for 2D device engineering. Additionally, the vdW integration approach can be applied to fabricate high-quality devices from perovskite thin films, with a current amplitude more than about 3 orders of magnitude higher than those fabricated with directly deposited metals. Furthermore, as a metal integration method, the substantially damage-free vdW integration approach can be extended for creating other functional junctions (e.g., metal-insulator, magnetic-semiconductor, and superconductor-semiconductor). It can thus open up possibilities for probing the intrinsic properties of these interfaces without the complication of ill-defined interface states, and allow ultra-high efficiency spin injection, high-performing magnetic tunneling devices, superconducting tunneling devices, or various quantum interference devices, amongst other devices and applications.

Embodiments provide a general, low energy metal integration approach that can be extended to other delicate materials constrained by contact fabrication process or other functional interfaces/junctions previously constrained by interface disorder and Fermi level pinning.

More broadly, embodiments provide a general physical integration approach for integrating highly disparate materials to create functional interfaces with reduced interface trapping states, and can impact diverse electronic and optoelectronic applications.

EXAMPLE EMBODIMENTS

Figure 27:
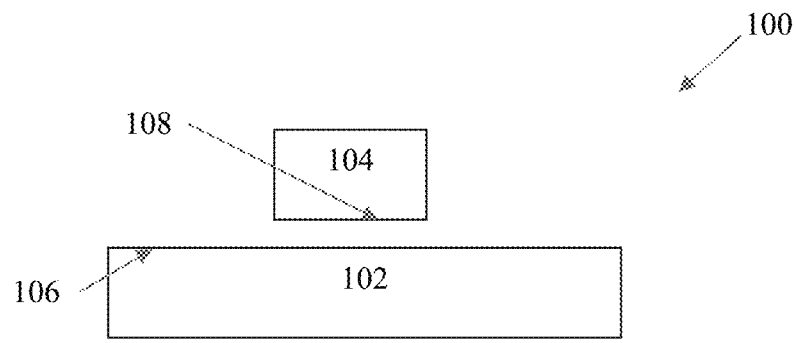
FIG. 27. Schematic of an electronic or optoelectronic device.

In some embodiments and as shown in FIG. 27, an electronic or optoelectronic device 100 includes: (1) a layer 102 of a first material; and (2) a layer 104 of a second material disposed on the layer 102 of the first material, wherein the first material is different from the second material, and the layer 102 of the first material is spaced from the layer 104 of the second material by a gap.

In some embodiments, the layer 102 of the first material has a first surface 106, and the layer 104 of the second material has a second surface 108 facing the first surface 106 and spaced from the first surface 106 by the gap.

In some embodiments, the gap is a non-covalent bonding gap. In some embodiments, the non-covalent bonding gap is substantially devoid of covalent bonding between a first atom included in the first material and a second atom included in the second material.

In some embodiments, the gap has a non-zero thickness. In some embodiments, the gap has a thickness of about 0.05 nm or more, about 0.1 nm or more, or about 0.15 nm or more, and up to about 0.2 nm or more, or up to about 0.25 nm or more.

In some embodiments, the second surface 108 has a root mean surface roughness of up to about 0.5 nm, or up to about 0.45 nm, or up to about 0.4 nm, or up to about 0.35 nm, or up to about 0.3 nm, and down to about 0.25 nm or less, or down to about 0.2 nm or less. In some embodiments, the first surface 106 has a root mean surface roughness of up to about 0.5 nm, or up to about 0.45 nm, or up to about 0.4 nm, or up to about 0.35 nm, or up to about 0.3 nm, and down to about 0.25 nm or less, or down to about 0.2 nm or less.

In some embodiments, a concentration of the first atom within the gap is no greater than about 5 atomic percent (at. %), or no greater than about 3 at. %, or no greater than about 1 at. %, or no greater than about 0.5 at. %, or no greater than about 0.1 at. %, and a concentration of the second atom within the gap is no greater than about 5 at. %, or no greater than about 3 at. %, or no greater than about 1 at. %, or no greater than about 0.5 at. %, or no greater than about 0.1 at. %.

In some embodiments, the first material is a semiconductor.

In some embodiments, the layer 102 of the first material includes one or more monolayers of a two-dimensional atomic crystal.

In some embodiments, the layer 102 of the first material includes one or more monolayers of a metal dichalcogenide, such as a transition metal dichalcogenide like $MoS_2$.

In some embodiments, the layer 102 of the first material includes one or more monolayers of graphene.

In some embodiments, the layer 102 of the first material includes one or more molecular monolayers.

In some embodiments, the first material is an organic semiconductor.

In some embodiments, the first material is a halide perovskite.

In some embodiments, the second material is a metal, such as silver (Ag), gold (Au), platinum (Pt), palladium (Pd), copper (Cu), titanium (Ti), nickel (Ni), chromium (Cr), or a combination of two or more thereof.

In some embodiments, the second material is a magnetic material.

In some embodiments, the second material is a superconductor.

In some embodiments, the second material is an insulator.

In some embodiments, the second material is a dielectric material.

In some embodiments, the first material and the second material are different materials selected from semiconductors, metals, magnetic materials, superconductors, insulators, and dielectric materials.

In some embodiments, the second material is a metal, and the layer 104 of the second material is a metal contact.

Figure 28:
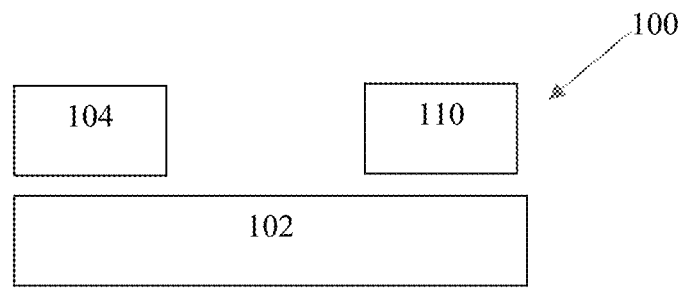
FIG. 28. Schematic of an electronic or optoelectronic device.

In some embodiments and as shown in FIG. 28, the metal contact is a first metal contact, and the device 100 further includes a layer 110 of a third material disposed on the layer 102 of the first material, wherein the third material is different from the first material and is the same as or different from the second material, the layer 102 of the first material is spaced from the layer 110 of the third material by a gap, and the layer 110 of the third material is a second metal contact. In some embodiments, the gap between the layer 102 of the first material and the layer 110 of the third material is a non-covalent bonding gap. In some embodiments, the gap between the layer 102 of the first material and the layer 110 of the third material has a non-zero thickness. In some embodiments, the gap between the layer 102 of the first material and the layer 110 of the third material has a thickness of about 0.05 nm or more, about 0.1 nm or more, or about 0.15 nm or more, and up to about 0.2 nm or more, or up to about 0.25 nm or more.

Figure 29:
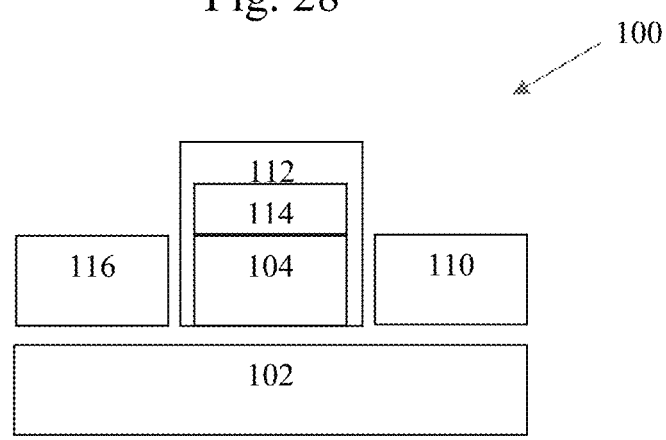
FIG. 29. Schematic of an electronic or optoelectronic device.

In some embodiments and as shown in FIG. 29, the first material is a semiconductor, the device 100 is a transistor and includes a gate stack 112 disposed on the layer 102 of the first material and including the layer 104 of the second material, and the second material is a dielectric material. In some embodiments, the gate stack 112 further includes a gate electrode 114 disposed on the layer 104 of the second material. In some embodiments, the device 100 further includes a layer 110 of a third material disposed on the layer 102 of the first material and spaced from the layer 102 of the first material by a gap, wherein the third material is different from the first material and is different from the second material, and the layer 110 of the third material is a metal contact. In some embodiments, the gap between the layer 102 of the first material and the layer 110 of the third material is a non-covalent bonding gap. In some embodiments, the gap between the layer 102 of the first material and the layer 110 of the third material has a non-zero thickness. In some embodiments, the gap between the layer 102 of the first material and the layer 110 of the third material has a thickness of about 0.05 nm or more, about 0.1 nm or more, or about 0.15 nm or more, and up to about 0.2 nm or more, or up to about 0.25 nm or more. In some embodiments, the metal contact is a first metal contact, and the device 100 further includes a layer 116 of a fourth material disposed on the layer 102 of the first material and spaced from the layer 102 of the first material by a gap, wherein the fourth material is different from the first material, is different from the second material, and is the same as or different from the third material, and the layer 116 of the fourth material is a second metal contact. In some embodiments, the gap between the layer 102 of the first material and the layer 116 of the fourth material is a non-covalent bonding gap. In some embodiments, the gap between the layer 102 of the first material and the layer 116 of the fourth material has a non-zero thickness. In some embodiments, the gap between the layer 102 of the first material and the layer 116 of the fourth material has a thickness of about 0.05 nm or more, about 0.1 nm or more, or about 0.15 nm or more, and up to about 0.2 nm or more, or up to about 0.25 nm or more.

In further embodiments, a method of forming an electronic or optoelectronic device includes: (1) forming a layer of a second material on a substrate; and (2) transferring the layer of the second material from the substrate so as to be disposed on a layer of a first material.

In some embodiments, transferring the layer of the second material from the substrate includes separating the layer of the second material from the substrate.

In some embodiments, transferring the layer of the second material from the substrate includes laminating the layer of the second material to the layer of the first material.

In further embodiments, a method of forming an electronic or optoelectronic device includes: (1) forming a layer of a second material on a first substrate; (2) transferring the layer of the second material from the first substrate so as to be disposed on a second substrate; (3) forming a layer of a third material on the second substrate laterally adjacent to the layer of the second material; and (4) transferring the layer of the second material and the layer of the third material from the second substrate so as to be disposed on a layer of a first material.

In some embodiments, transferring the layer of the second material from the first substrate includes separating the layer of the second material from the first substrate.

In some embodiments, transferring the layer of the second material and the layer of the third material from the second substrate includes laminating the layer of the second material and the layer of the third material to the layer of the first material.

EXAMPLES

The following examples describe specific aspects of some embodiments of this disclosure to illustrate and provide a description for those of ordinary skill in the art. The examples should not be construed as limiting this disclosure, as the examples merely provide specific methodology useful in understanding and practicing some embodiments of this disclosure.

Example 1

Approaching Schottky-Mott limit in van der Waals metal-semiconductor contacts

Overview:

The Schottky barrier at a metal-semiconductor (MS) junction is fundamental for various electronic and optoelectronic devices. The ideal Schottky barrier height is in theory well predicted based on the metal work function and their electrostatic energy alignment with the semiconductor band edge, referred as the Schottky-Mott rule. However, such ideal physics has not been experimentally realized because of the inevitable chemical disorder and Fermi level pinning (FLP) at typical MS interfaces. Here some embodiments are directed to the creation of van der Waals MS contacts, where atomically flat metal thin films are directly laminated onto dangling-bond free two-dimensional (2D) semiconductors substantially without direct chemical bonding, thus realizing an MS interface essentially free of chemical disorder and FLP. Demonstration is made of a highly tunable Schottky barrier height dictated by the metal work function, with the experimentally measured interface S-parameter (S=about 0.96) approaching Schottky-Mott limit. By selecting transferred metals (e.g., Ag or Pt) with work function matching $MoS_2$ conduction or valence band edge, $MoS_2$ transistors are achieved with high two-terminal electron mobility (about 260 $cm^2$/Vs) and hole mobility (about 175 $cm^2$/Vs) at room temperature. Furthermore, by transferring asymmetric contact pairs with distinct work functions, demonstration is made of an Ag—$MoS_2$—Pt photodiode with an open circuit voltage of about 1.02 V. Experimental validation is made of the fundamental limit of the ideal MS junctions, and also a highly efficient, general and damage-free metal integration strategy is presented towards high-performance electronics and optoelectronics.

DISCUSSION

Metal-semiconductor junctions are at the heart of modern electronics and optoelectronics. One of the most important parameters for the MS junction is the Schottky barrier height (SBH, $\Phi_{SB}$), an energy barrier for charge carrier to transport across the junction, which can fundamentally impact device performance. In an ideal MS junction, the SBH ($\Phi_{SB}$) can be well predicted by the Schottky-Mott rule, which is governed by electrostatics in energy-level-alignment:

$$\Phi_{SB,n} = \Phi_M - X_{SC} \tag{1}$$

$$\Phi_{SB,p} = I_{SC} - \Phi_M \tag{2}$$

where $\Phi_M$ is the work function of the metal, $X_{SC}$ and $I_{SC}$ is the electron affinity and ionization potential of the semiconductor, and $\Phi_{SB,n}$ and $\Phi_{SB,p}$ are the SBH for electrons and holes, respectively. These quantities are the intrinsic properties of the isolated materials before they form the junction, and Schottky-Mott model indicates that $\Phi_{SB}$ is linearly dependent on the $\Phi_M$ of metals with a slope of unity.

However, experimentally, the Schottky-Mott model gives incorrect predictions for the SBH. It is found that $\Phi_{SB}$ is usually insensitive to $\Phi_M$, and the Fermi level of the system is typically pinned to a nearly fixed position within the semiconductor band gap, varying little with respect to different metals used. The strength of Fermi level pinning for a given semiconductor can be characterized by the interface S-parameter of the $\Phi_{SB}$ versus $\Phi_M$:

$$S = |d\Phi_{SB}/d\Phi_M| \tag{3}$$

If S=1, the Schottky-Mott limit is achieved. Unfortunately, S is generally far smaller than unity for various semiconductors (about 0.27 for Si; and about 0.07 for GaAs) and the Schottky-Mott limit (S=1) has not been experimentally achieved.

This discrepancy between theory and experiments is given that the Schottky-Mott model depends on ideal physics and neglects several types of practical chemical interactions that are hard to avoid at the interface of two dissimilar materials. First, due to the crystal structure termination and incomplete covalent bonds, surface dangling bonds or surface reconstruction leads to surface states (Bardeen pinning effect or Shockley-Tamm states) within the semiconductor bandgap and results in FLP at these energy levels. Second, the interface of the contact is rarely an atomically sharp discontinuity between the metal and the semiconductor crystal, where chemical bonds take place and modify their original energy levels. Furthermore, the MS chemical bonding and their inter-diffusion create large strain to both crystal lattices and change the band structures as well as the resulting SBH. Third, the typical material integration and device fabrication processes usually lead to additional chemical disorders and defect induced gap states (DIGS) that serve as a reservoir for electrons or holes and therefore pin the Fermi level. The "high energy" metal deposition process involves atom/cluster bombardment and strong local heating to the contact region; it can damage a crystal lattice, as observed in III-V compound semiconductors; and the resist development process can also leave polymer residue within the interface and deviate the overall measured SBH from the predicted value. Fourth, metal induced gap states (MIGS) are formed in the MS junction due to the decaying metallic wave function into the nanometer depth of semiconductors.

Here this example reports the design and creation of van der Waals (vdW) MS contacts, where metal electrodes with atomically flat surface is pre-fabricated and physically laminated onto substantially dangling-bond free 2D semiconductors (FIG. 1) substantially without direct chemical bonding, or the associated chemical disorder, DIGS, thus realizing an ideal MS junction with the experimentally measured interface S-parameter (S=about 0.96) approaching Schottky-Mott limit. The fabrication process flow is illustrated in FIG. 1a (see Methods and FIG. 5 for details). Briefly, a series of about 50-nm thick metal electrodes with various work functions are first prepared on a silicon substrate with atomically flat surface using photolithography and high vacuum e-beam evaporation. A hexamethyldisilazane (HMDS) layer is applied to functionalize the whole wafer and then a poly(methyl methacrylate) (PMMA) layer (about 1 μm thick) is spin-coated on top of the metal electrodes. With the pre-functionalization of HMDS, the PMMA layer has weak adhesion to the sacrificial substrate and can be mechanically released using a polydimethylsiloxane (PDMS) stamp, together with the metal electrodes wrapped underneath (FIG. 1a, ii). The metal released using this method is atomically flat (replicating the atomically flat surface of the sacrificial wafer), with a mean surface roughness of about 0.2-0.3 nm (FIG. 5). Next, few layer $MoS_2$ flakes (about 5-20 nm thick with a bandgap of about 1.2 eV) are mechanically exfoliated on top of highly doped silicon ($p^{++}$) covered with $SiO_2$ (about 300 nm) and PMMA (about 170 nm) as the dielectrics. PMMA here functions as a trap state free dielectric and is desired for retaining the intrinsic properties of $MoS_2$, in contrast to $MoS_2/SiO_2$ interface with rich trap states (FIG. 6). Next, the previously released metal electrodes are aligned under microscopy and physically laminated on top of the $MoS_2$ flake, resulting in an atomically sharp and clean MS interface fully encapsulated in PMMA polymer (FIG. 1a, iii). Finally, the PMMA on top of the contact pad is removed using e-beam lithography and development process, leaving the exposed metal pads for electrical probing and measurements (FIG. 1a, iv). The metal releasing and transfer processes are typically conducted in nitrogen filled glove box to reduce oxidation of the metals.

This vdW integration of metal thin film electrodes and 2D semiconductors displays several advantages that can overcome the FLP constraints and provide atomically sharp and atomically clean MS interface approaching the ideal MS physical model. First, in terms of semiconductor surface, the dangling bond free surface of 2D semiconductors can eliminate the Shockley-Tamm states that dominate a 3D covalent semiconductor surface with rich surface dangling bonds or surface reconstruction. Second, the physical transfer of pre-fabricated metal electrodes provides a gentle "low-energy" material integration strategy without aggressive fabrication processes (e.g., lithography or deposition) to prevent the creation of defects, residues, strains and the associated DIGS on dangling bond free 2D semiconductor surface. This can be highlighted by cross-sectional transmission electron microscopy (TEM) image, where the transferred metal/$MoS_2$ junction features atomically sharp and clean interface (FIG. 1b-d); while the deposited metal/$MoS_2$ interface shows considerable defects, strain, disorder and metal diffusion (FIG. 1f-h). Third, the physical MS contact without direct chemical bonding can greatly suppress interface dipoles and MIGS.

To demonstrate the weak vdW interaction at MS interface, demonstration is made of mechanical separation of the transferred metal electrodes from $MoS_2$ after the device fabrication and electrical measurement, and the underlying semiconductor retains its original shape without any apparent damage (FIG. 1e). In contrast, the deposited metal electrodes typically form strong chemical bonding with $MoS_2$ (such as Au—S bonds), generating a glassy layer dominated by inter-diffusion and strain. When the deposited metal electrodes are mechanically peeled, the underlying $MoS_2$ is destroyed at the same time (FIG. 1i). The reversible physical integration and isolation of the transferred MS junctions is a strong indicator of the ideal MS interface, where two intimately contacted crystals retain their isolated states without direct chemical bonding.

With reduced interface disorder and weak MS interaction, the vdW contacted $MoS_2$ transistors exhibit highly tunable device characteristics directly dictated by the metal work functions. FIG. 2 plots the $I_{ds}$—$V_{gs}$ transfer curve of the $MoS_2$ transistors contacted by a series of transferred metals with various work functions. As a control, characterization is made of the devices using the same metal electrodes but prepared using electron-beam (e-beam) evaporation deposition process. In general, the $MoS_2$ devices contacted by evaporation deposited metals invariably show n-type behavior regardless of the work function of the metal used (FIG. 2a-d), which strongly indicates the Fermi level is pinned near the conduction band of $MoS_2$.

In stark contrast, for the devices with transferred metal electrodes, the majority carrier type can be systematically tailored from electrons to holes by varying the work function of the contact metals (FIG. 2e-h). For example, with low work function silver ($W_{Ag}$=about 4.26 eV), well-behaved n-type transfer curves are observed (FIG. 2e). With reducing temperature, the device demonstrates typical metal-insulator-transition (MIT) behavior, where the conductivity increases with reducing temperature (metallic) at larger gate voltage, and $I_{ds}$ decreases with reducing temperature at smaller gate voltage (insulating), indicating the optimized contact and low electron barrier. Next, by using copper with medium work function ($W_{Cu}$=about 4.6 eV), the device exhibits bipolar transfer curve with preferred n-type behavior (FIG. 2f). Compared with Ag contacted devices, the $I_{ds}$ current is 3 orders of magnitude smaller at room temperature and decreases exponentially with temperature, demonstrating a relatively large n-type Schottky barrier. Further increasing the metal work function with gold electrode ($W_{Au}$=about 5.1 eV), the device exhibits predominantly p-type behavior with small current level (about nA) (FIG. 2g). The $I_{ds}$ drops quickly with reducing temperature, indicating a large p-type Schottky barrier dominates the overall carrier transport. This is in stark contrast to comparative devices (and control samples in FIG. 2c) with deposited Au electrodes as n-type Ohmic contacts to $MoS_2$, owning to formation of Au—S bonding that dominates the carrier transport with strong FLP near the conduction band edge. Finally, by using transferred platinum with the highest work function ($W_{Pt}$=about 5.6 eV), the device shows well behaved p-type characteristics (FIG. 2h) with Ohmic $I_{ds}$—$V_{ds}$ output curve (FIG. 7). Importantly, with reducing temperature, p-type MIT is observed in $MoS_2$, indicating an optimized p-type contact with negligible hole barrier. In contrast, the device with deposited Pt electrodes exhibits poor n-type behavior due to FLP near the conduction band edge (FIG. 2d).

The above results demonstrate that carrier transport in $MoS_2$ transistors can be systematically tailored by using transferred metal contacts with variable work functions. To further quantitatively evaluate the dependence on different metals, the SBH is extracted using the equation:

$$I_{ds}=AA^*T^2 \exp(-\Phi_{SB}/kT) \quad (4)$$

where $I_{ds}$ is the current through the device, A is the Richardson's constant, k is the Boltzmann constant, and T is the temperature. The $\Phi_{SB}$ is the Schottky barrier extracted under flat band condition where the tunneling current across the Schottky barrier can be minimized, and the detailed description of the extraction can be found in Method section and FIG. 8. FIG. 3 shows the extracted SBH for different metals used as a function of the corresponding work functions, and the solid line is the linear fitting of the results, the slope of which corresponds to the interface S parameter. For control devices with deposited metals, the extracted interface S parameter is about 0.09, confirming strong FLP near the conduction band edge at the metal/$MoS_2$ interface (largely due to the fabrication induced defects and gap states, see FIG. 1f-h). In contrast, for the devices with transferred metal electrodes, the $\Phi_{SB}$ value is strongly dependent on the metal work functions, and the Schottky barrier type can also be tuned from electrons to holes. Significantly, the fitted S parameter is about 0.96, approaching the limit of Schottky-Mott law specified by the electrostatic energy alignment. The S parameter is also much larger than reported values of 0.27 for Si and 0.07 for GaAs, indicating a nearly ideal MS interface with physically transferred metal contact on the substantially dangling bond free 2D surface. Notably, such ideal MS contact has not been achieved due to the inevitable chemical disorder and FLP at MS interface.

With the ability to prepare an atomically sharp and atomically clean MS interface and systematically tailor the SBH by design, this approach opens a pathway to overcome universal FLP effect plaguing many semiconductor devices and achieve improved performance. For example, plagued by FLP effect at typical MS interface, metals can hardly be directly used to achieve optimum contact with minimized barrier height regardless of the exact work function of the metal used. The Ohmic contact is generally achieved through sophisticated interface or doping engineering to reduce Schottky barrier width, which typically involves highly aggressive processes (such as ion implantation and high temperature annealing) and is not applicable for many delicate materials such 2D semiconductors or organic semiconductors. In contrast, the vdW integration approach can avoid direct energetic processes on semiconductors, mitigates against surface degradation and therefore reduces chemical disorder and interface pinning to make nearly unity S-parameter possible. With the ability to prepare atomically sharp and atomically clean MS interface and systematically tailor the Schottky barrier by design (using metals of the desired work function), it opens a pathway to overcoming FLP effect plaguing various semiconductor devices and achieve improved performance. Benefited from the weakly pinning vdW MS junctions with transferred metal contacts, either p-channel or n-channel transistors can be formed with reduced contact barrier and optimum carrier mobility from the same semiconductor by selecting metals with work function matching to the semiconductor valence or conduction band edge. For instance, by applying transferred Ag electrodes with low electron barrier, fabrication is made of an n-channel $MoS_2$ transistor with two-terminal electron mobility ($\mu_e$) reaching up to about 260 $cm^2/V$ s (FIG. 9 and Table 1). Furthermore, by shortening the channel length to about 160 nm, the delivering current density is enhanced to about 0.66 mA/μm (FIG. 10) at room temperature. Similarly, by using transferred Pt contacts with reduced barrier for holes in $MoS_2$, a high two-terminal hole mobility ($\mu_h$) of about 175 $cm^2/V$ s is achieved, and a high hole current density of about 0.21 mA/μm in p-channel $MoS_2$ transistors is achieved (FIGS. 7, 10, and Table 1). Although the non-bonding vdW gap may pose an additional series resistance, its value is relatively small (about 0.10-0.15 nm, see Method section) to affect the overall carrier transport and can be largely neglected.

Figure 4A:
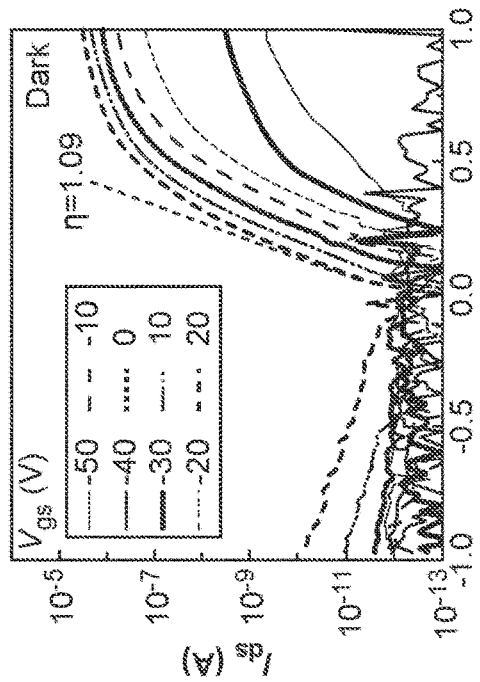
FIG. 4. Ag—MoS$_2$—Pt metal-semiconductor-metal (MSM) photodiode with transferred asymmetric Ag-Pt electrodes. a, Schematic illustration and optical image of transferred asymmetric Ag and Pt electrodes on MoS$_2$. The Ag is grounded and Pt electrode is used as a drain. b, c, Semi-log plot of the $I_{ds}$—$V_{ds}$ output curve of a 7-layer device under dark environment (b), and under about 532-nm laser illumination (c, about 10 nW/μm$^2$), respectively. The diode demonstrates a high rectification ratio >about 10$^8$, near unity ideal factor (η=about 1.09), and a large $V_{oc}$. d, Linear plot of $I_{ds}$—$V_{ds}$ output curve under dark (labeled) and laser illumination (labeled), demonstrating a high $V_{oc}$ of about 1.02 V for monolayer MoS$_2$ (inset) and about 0.78 V for 7-layer MoS$_2$. Gate voltage is about −60 V for monolayer device and about −50 V for the 7-layer device. Dashed rectangle shows the corresponding power area for maximum power conversion. The gate capacitance is composed of about 300 nm thick SiO$_2$ and about 170 nm thick PMMA for all devices in optoelectronic measurement.

Taking a step further, demonstration is made of the transfer of metals with different work functions to provide high performance optoelectronic devices. For example, Schottky barrier based MS or metal-semiconductor-metal (MSM) photodiodes have streamlined device structure and fast switching speed, but typically suffer from low open circuit voltage ($V_{oc}$) and poor quantum efficiency compared with the PN photodiode counterparts, largely due to interface trap states, severe pinning in MS interfaces and the greatly suppressed built-in potential. With the vdW MS interfaces and well-controlled SBH, these constraints can be overcome. To this end, creation is made of an Ag—$MoS_2$—Pt MSM photodiode by using transferred Ag and Pt as vdW contacts (FIG. 4a). With the asymmetric Pt and Ag contacts, the device shows distinct rectification behavior at all gate bias voltages, with a rectification ratio up to about $10^8$ and an ideal factor η of about 1.09 (FIG. 4b and FIG. 11). The near unity ideal factor obtained in transferred MSM diode is much improved over the deposited MSM device with η>about 1.8 (FIG. 12), confirming the high interfacial quality of vdW MS contacts.

Figure 4C:
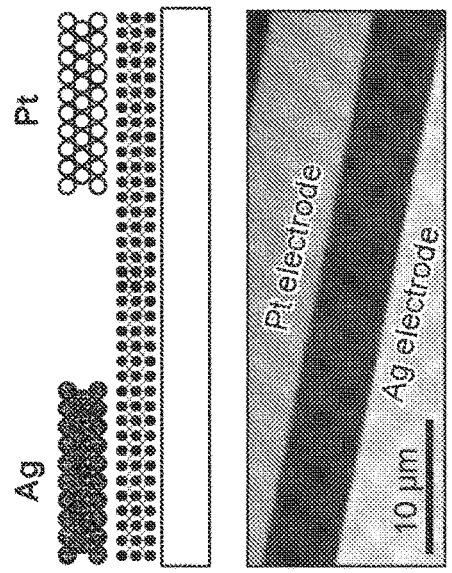
Figure 4B:
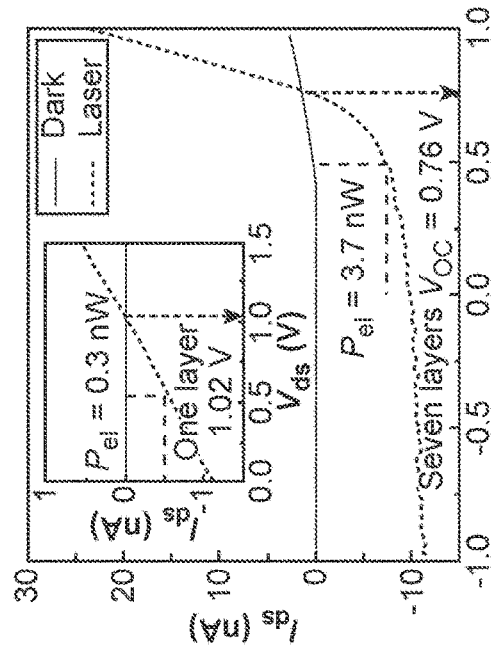
Figure 4D:
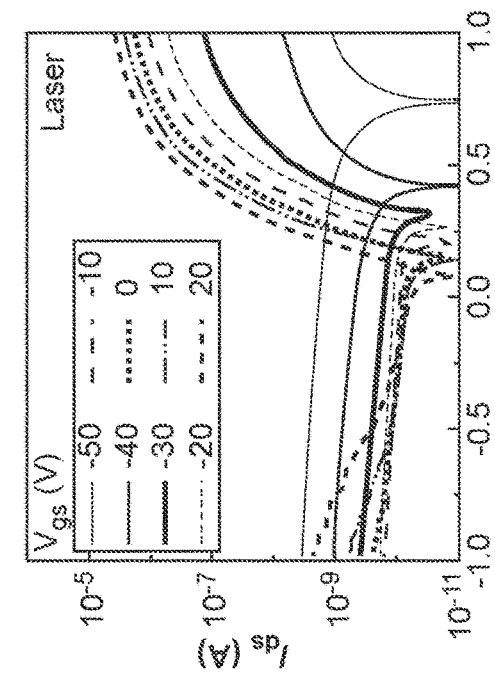
Figure 6A:
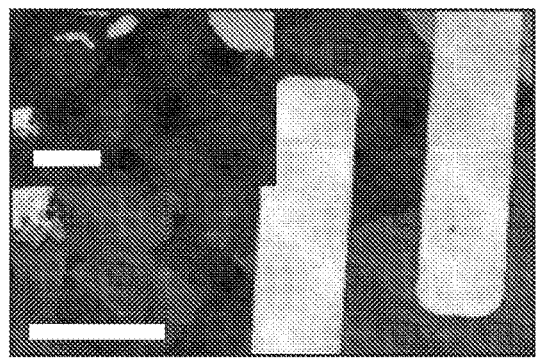
FIG. 6. Substrate doping effect on MoS$_2$. a, Optical image of a 7-layer MoS$_2$ flake on SiO$_2$ substrate contacted with transferred Pt electrodes. The inset is the optical image of MoS$_2$ on SiO$_2$ before the metal contact. Scale bar is 20 μm. b, $I_{ds}$—$V_{gs}$ transfer curve of MoS$_2$ transistor on SiO$_2$ substrate under various bias voltages (from bottom to top) of about 10 mV, about 100 mV, about 500 mV, and about 1 V, demonstrating n-type behavior, indicating the involvement of defect states within SiO$_2$—MoS$_2$ interface. c, Optical image of an about 15-layer MoS$_2$ flake on PMMA substrate contacted with transferred Pt electrodes. The inset is the optical image of MoS$_2$ on PMMA before the metal contact. Scale bar is 20 μm. d, transfer curve of MoS$_2$ transistor encapsulated in PMMA under various bias voltages (from bottom to top) of about 10 mV, about 100 mV, about 500 mV, and about 1 V, demonstrating p-type behavior, indicating the use of PMMA substrate is desired to maintain the intrinsic properties of MoS$_2$ flakes. All measurements are conducted at room temperature in probe stations.
Figure 6B:
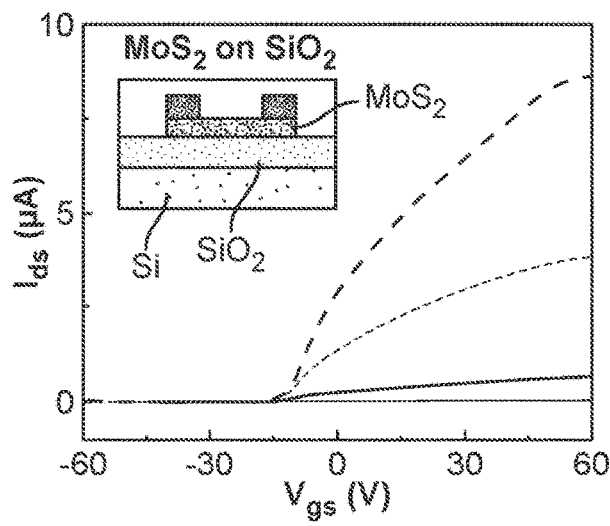
Figure 6C:
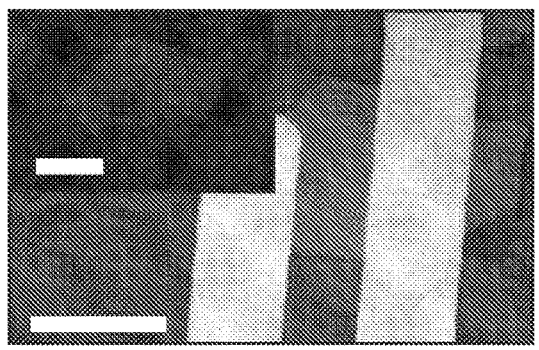
Figure 6D:
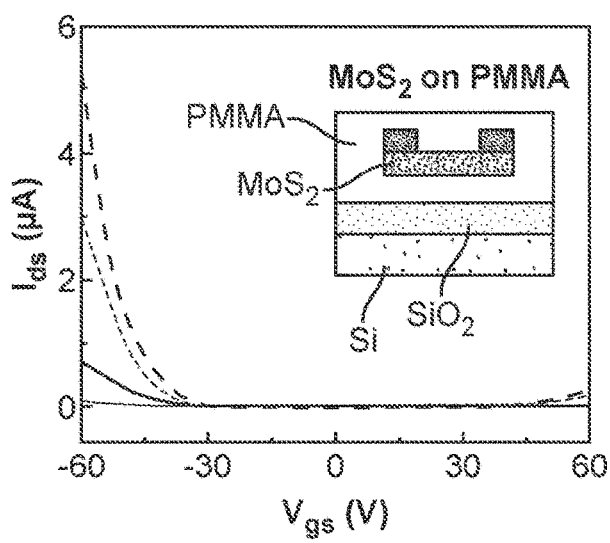

Under wide field laser illumination (about 532 nm, about 10 nW/$μm^2$), the Ag—$MoS_2$—Pt MSM photodiodes with transferred contact produce a remarkable $V_{oc}$ of about 1.02 V in monolayer $MoS_2$ ($E_g$ of about 1.8 V) device and about 0.78 V in a 7-layer $MoS_2$ ($E_g$ of about 1.2 V) device (FIG. 4c and FIG. 11). The $V_{oc}$ of about 1.02 V is more than two times larger than that in control sample with deposited Pt-Ag contacts (FIG. 12) and considerably higher than those reported for 2D semiconductor MSM and PN photodiodes (about 0.1-0.8 V) (Table 2). The lower $V_{oc}$ obtained in other 2D semiconductor photodiodes may be partly attributed to the difficulties in achieving low contact barrier for both electrons and holes in the same device. In contrast, with the asymmetric pinning free vdW contacts in the Ag—$MoS_2$—Pt MSM photodiodes, a reduced contact barrier for electrons is achieved at Ag—$MoS_2$ interface, and a reduced contact barrier for holes is achieved at $MoS_2$—Pt, thus ensuring a high $V_{oc}$. The Ag—MoS$_2$—Pt photodiodes provide about 7.2 mA/W and about 16.6 mA/W, and external quantum efficiency (EQE) of about 1.74% and about 4.5% for the monolayer and 7-layer devices, respectively, higher than those reported for PN junctions (about 0.2%) made by dual-gated WSe$_2$. The maximum electrical output power of about 0.3 nW (about 3.7 nW) is obtained at $V_m$=about 0.54 V (about 0.5 V) for the monolayer (multilayer) device (FIG. 4d), with a power conversion efficiency of about 0.2% (about 0.6%) (see Methods).

In summary, this example has demonstrated a substantially damage-free metal integration strategy by transferring pre-fabricated metal thin films on 2D semiconductors. The resulting metal-MoS$_2$ junction features atomically sharp and atomically clean vdW interface substantially free of direct chemical bonding, atomic disorder, strain and DIGS, thus producing a nearly ideal MS junction. Electrical measurement demonstrates highly tunable Schottky barrier dictated by the work function of the metal used, and realizing an experimentally measured interface S parameter (S=about 0.96) approaching the Schottky-Mott limit. The weak pinning junction provides MoS$_2$ transistors with a high extrinsic carrier mobility ($\mu_e$=about 260, $\mu_h$=about 175 cm$^2$/V s) and MSM photodiodes with a high open circuit voltage ($V_{oc}$=about 1.02 V). The results validate the fundamental limit of metal-semiconductor interfaces, and also provide a general, low energy metal integration approach that can be extended to other delicate materials constrained by fabrication process or other functional interfaces/junctions constrained by interface disorder and Fermi level pinning.

Methods:

Metal Electrodes Releasing, Transferring and Lamination Process.

To release the metal electrodes from atomic flat sacrificial substrate, the wafer (with metal electrodes) is functionalized using HMDS (hexamethyldisilazane) vapor by placing the substrate within a sealed HMDS chamber at about 120° C. for about 2-30 mins, and then spin-coating PMMA polymer with various thickness. The HMDS functionalization time and PMMA thickness is dependent on a metal to be released. For metals with weak adhesion force (e.g., Ag, Au, or Pt) to silicon wafer, the functionalization time is about 20-30 mins and the PMMA polymer is about 1 µm thick. For metals with intermedium adhesion force (e.g., Pd) to silicon wafer, the treatment time is about 5 mins and the PMMA polymer is about 2 µm thick. For metals with larger adhesion force (e.g., Cu) to silicon wafer, the treatment time is about 3 mins and the PMMA polymer is about 5-10 µm thick. For metals with strongest adhesion force (e.g., Ti, Ni, or Cr) to silicon wafer, the treatment time is <about 2 mins and the PMMA polymer is >about 10 µm thick. However, for these metals (e.g., Ti, Ni, or Cr), the releasing yield is low and this releasing method can be further improved. FIG. 5 shows the images during the transfer process. It is noted for Au electrodes transfer, the highest transfer temperature (from PDMS to target substrate) should be kept lower than about 60° C., to retain metal-semiconductor vdW gap and to avoid their strong interaction and chemical bonding formation. The transfer process is conducted in a nitrogen filled glovebox with low oxygen level (<about 0.1 ppm). Furthermore, once the metal is delaminated from the sacrificial substrate, it is physically contacted onto the MoS$_2$ substantially immediately with short exposure time (typically <about 20 sec) to minimize any possible surface oxide formation on oxygen sensitive metals (e.g., Cu and Ag).

Flat Band Schottky Barrier Extraction.

The extraction of Schottky barrier height is based on thermionic model under low doping level as shown in FIG. 8. At low doping level below flat-band voltage ($V_{FB}$), the charge injection to the MoS$_2$ channel is mainly through thermionic emission with the relationship:

$$I_{ds} = AA^*T^2\exp\left[-\frac{\Phi_{SB}}{kT}\right] \quad (5)$$

where $I_{ds}$ is the source-drain current, A is the Richardson's constant, T is the measurement temperature, k is the Boltzmann constant and $\Phi_{SB}$ is the Schottky barrier for carriers to overcome. In this way, the Schottky barrier $\Phi_{SB}$ can be extracted using Arrhenius plots with following equation:

$$\ln\left(\frac{I_{ds}}{T^2}\right) = -\frac{\Phi_{SB}}{kT} + c \quad (6)$$

where c is a constant, and $\Phi_{SB}$ is the slope (between $-1/kT$ and $\ln(I_{ds}/T^2)$) within Arrhenius plots. Using the equations 5 and 6, the Schottky barrier height is extracted under various gate voltages and summarized in FIG. 8c, f.

Figure 8C:
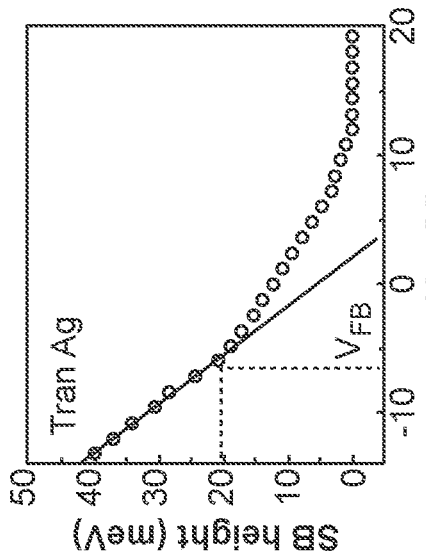
FIG. 8. Flat band Schottky barrier extraction. a, b, $I_{ds}$—$V_{gs}$ transfer curve of MoS$_2$ transistor using transferred Ag electrodes under various temperatures, with the bias voltage fixed at about 100 mV. c, The extracted n-type Schottky barrier height at various gate voltages, where the flat band electron Schottky barrier is measured to be about 20 mV. The flat band voltage and corresponding Schottky barrier are guided by the dashed lines. d, e, $I_{ds}$—$V_{gs}$ transfer curve of MoS$_2$ transistor using transferred Pt electrodes under various temperatures, with the bias voltage fixed at about 100 mV. f, The extracted p-type Schottky barrier height at various gate voltages, where the flat band hole Schottky barrier is measured to be about 67 mV. The flat band voltage and corresponding Schottky barrier are guided by the dashed lines.
Figure 8B:
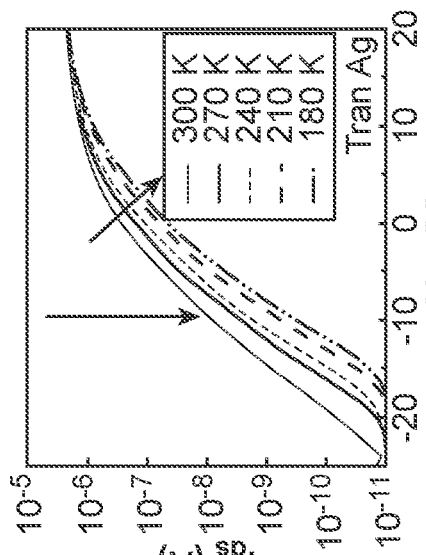
Figure 8A:
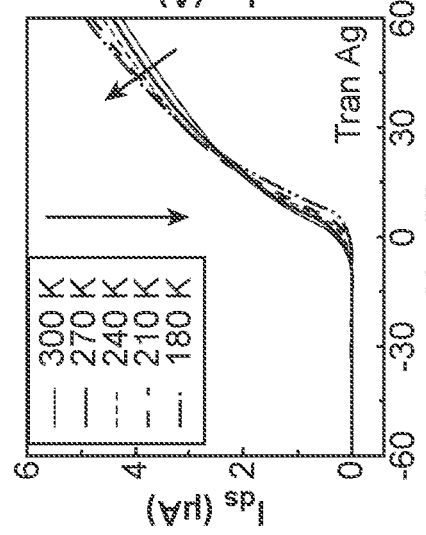
Figure 8F:
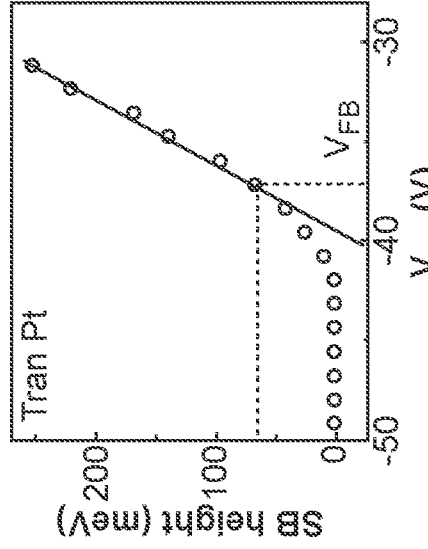
Figure 8E:
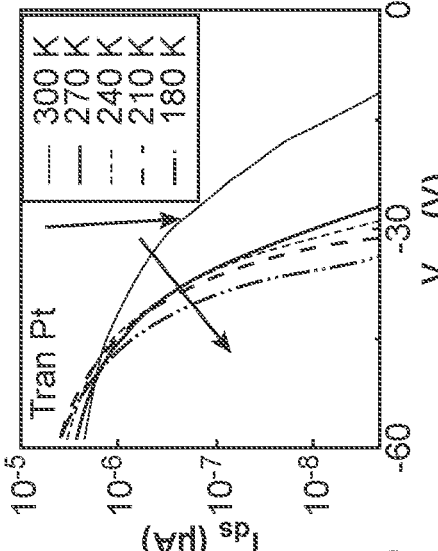
Figure 8D:
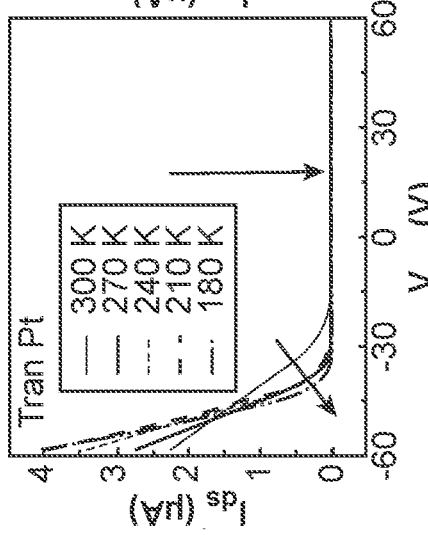
Figure 9A:
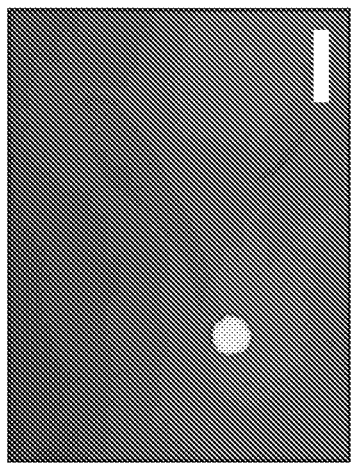
FIG. 9. High electron mobility device using transferred Ag as the contact electrodes. a, Optical image of a MoS$_2$ flake on PMMA/SiO$_2$ substrate. b, Optical image of the MoS$_2$ flake after contacted by transferred Ag electrodes. The channel length here is about 10 μm and the effective channel width is about 5.36 The scale bar in (a, b) is 10 μm. (c) $I_{ds}$—$V_{ds}$ output curve of the fabricated MoS$_2$ transistor under various gate voltages from about −60 V to about 60 V. d, e, Linear (d) and semi-log (e) plot $I_{ds}$—$V_{gs}$ transfer curve of the fabricated MoS$_2$ transistor under various bias voltages of about 10 mV, about 100 mV, about 500 mV, and about 1 V. The bottom line is the gate leakage current ($I_g$), which is one order of magnitude smaller compared to $I_{ds}$ (constrained by equipment) and does not noticeably affect the overall carrier transport. Under large gate voltage, the channel majority carrier is inverted to holes and the carrier concentration is increased exponentially, greatly reducing the hole Schottky barrier width. As a result, the holes can tunnel through the thin Schottky barrier from drain side, which accounts for the observed ambipolar behavior. f, The extracted two-terminal field effect electron mobility using at various bias voltages of about 10 mV, about 100 mV, about 500 mV, and about 1 V (cyan). The W/L ratio is about 0.54 and the gate capacitance is composed of about 300 nm thick SiO$_2$ and about 170 nm thick PMMA, and is calculated to be about 6.2 nF/cm$^2$. The highest extracted electron mobility is about 260 cm$^2$/V s. All measurements are conducted at room temperature in probe stations.
Figure 9B:
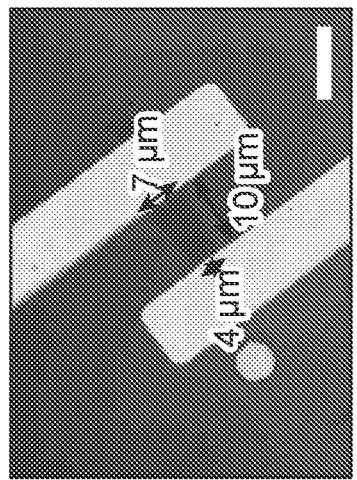
Figure 9C:
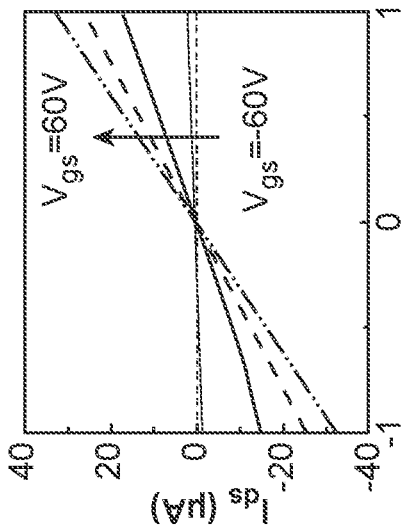
Figure 9D:
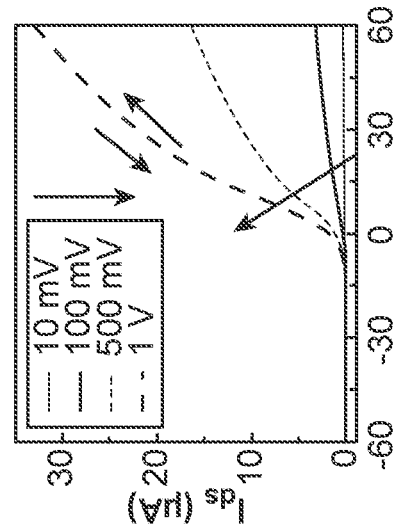
Figure 9E:
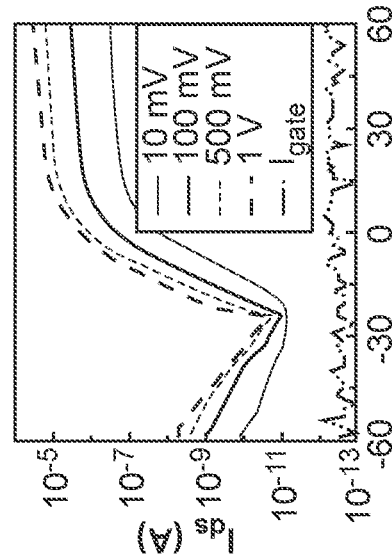
Figure 9F:
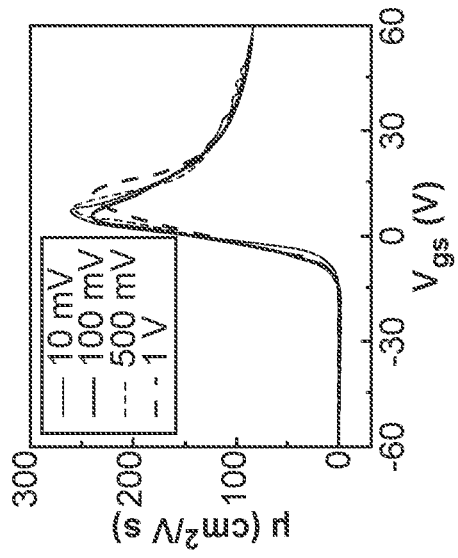
Figure 10A:
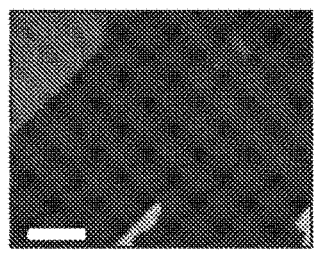
FIG. 10. High n-type current density using transferred Ag and p-type current density using transferred Pt as the contact electrodes. a-c, Optical image of initial thin BN flake (a), after MoS$_2$ dry transferred using alignment transfer technique (b), and the final device with transferred Ag electrodes (c). The channel length is about 160 nm and channel width is about 6 and the gate dielectric is composed of about 5 nm thick BN flake and about 90 nm thick $SiO_2$ (rather than about 300 nm $SiO_2$ and about 170 nm PMMA dielectric) for larger gate capacitance and stronger gate coupling to ensure the highest driving current. d, e, $I_{ds}$—$V_{ds}$ output curve of the fabricated $MoS_2$ transistor under various gate voltages from about −40 V to about 40 V. The highest current density is measured to be about 0.66 mA/μm. f, $I_{ds}$—$V_{gs}$ transfer curve of the fabricated $MoS_2$ transistor under various bias voltages. With increasing bias voltage, the OFF current of the device increases due to short channel effect. g-i, Optical image of initial thin BN flake (g), after $MoS_2$ dry transferred using alignment transfer technique (h), and the final device with transferred Pt electrodes (i). The channel length is about 140 nm and channel width is about 6 and the gate dielectric is composed of about 10 nm thick BN flake and about 90 nm thick $SiO_2$ (rather than about 300 nm $SiO_2$ and about 170 nm PMMA dielectric) for larger gate capacitance and stronger gate coupling to ensure the highest driving current. j, k, $I_{ds}$—$V_{ds}$ output curve of the fabricated $MoS_2$ transistor under various gate voltages from 0 V to about −40 V. The highest current density is measured to be about 0.21 mA/μm. The scale bar in (a-c) and (g-i) is 10 μm. All measurements are conducted at room temperature in probe stations.
Figure 10B:
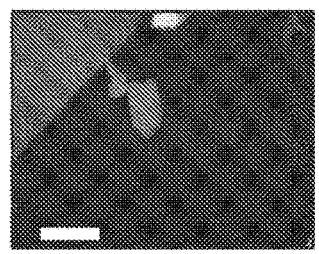
Figure 10C:
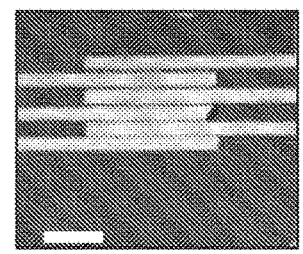
Figure 10D:
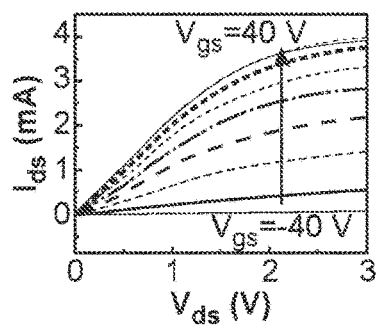
Figure 10E:
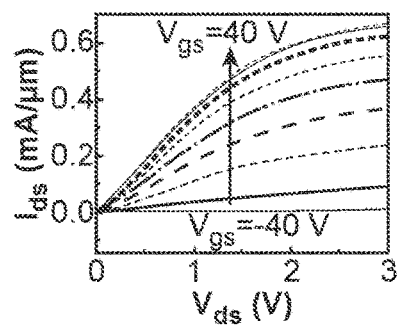
Figure 10F:
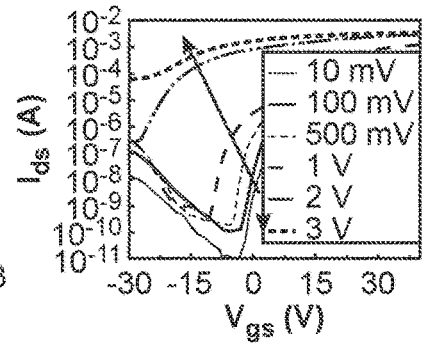
Figure 10G:
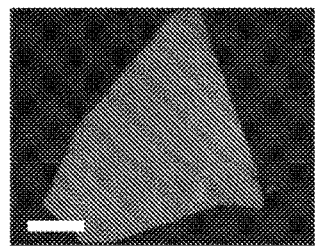
Figure 10H:
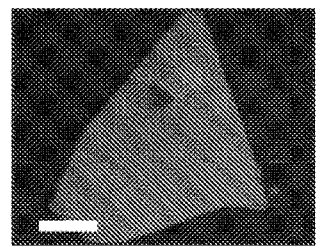
Figure 10I:
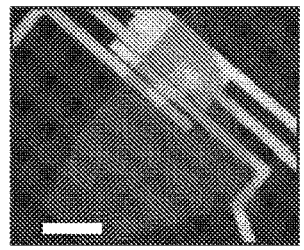
Figure 10J:
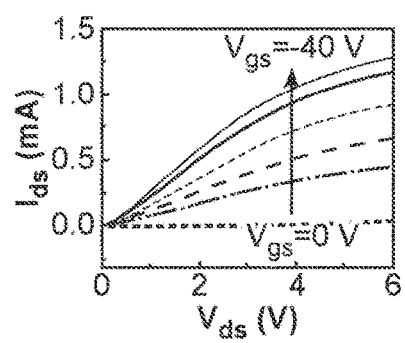
Figure 10K:
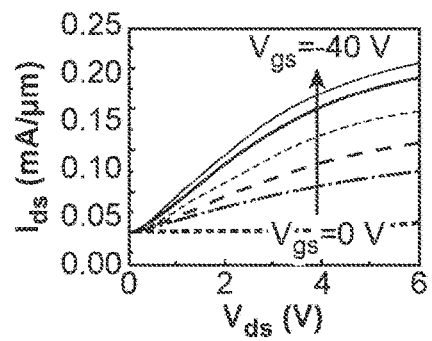
Figure 12A:
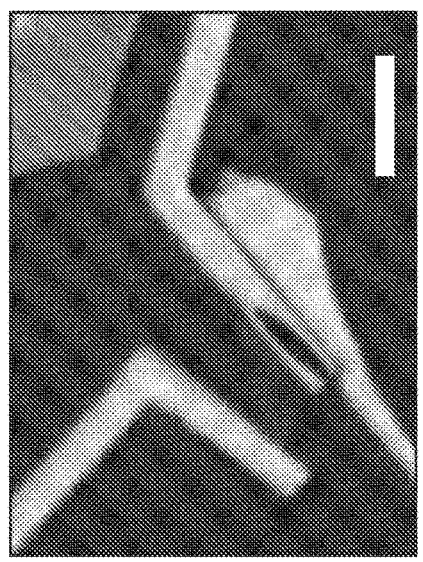
FIG. 12. Optical response of deposited Ag-Pt asymmetric electrodes on multilayer $MoS_2$. a, Optical image of the device after depositing Ag-Pt asymmetric electrodes on top of multilayer $MoS_2$. The scale bar is 5 μm. b, The semi-log plot of $I_{ds}$—$V_{ds}$ output curve under various gate voltages (about −60 V to about 60 V, about 10 V step) under dark condition. The Pt is always biased and the Ag is grounded. c, The semi-log plot of $I_{ds}$—$V_{ds}$ output curve under various gate voltages (about −60 V to about 60 V, about 10 V step) under laser illumination. d, The $I_{ds}$—$V_{ds}$ output curve under dark and laser illumination, under gate voltage of about 10 V. Highest open circuit voltage of about 0.3 V is observed.
Figure 12B:
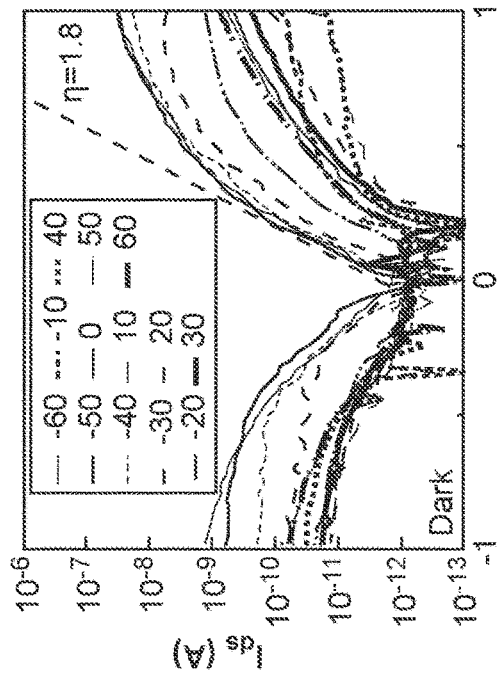
Figure 12C:
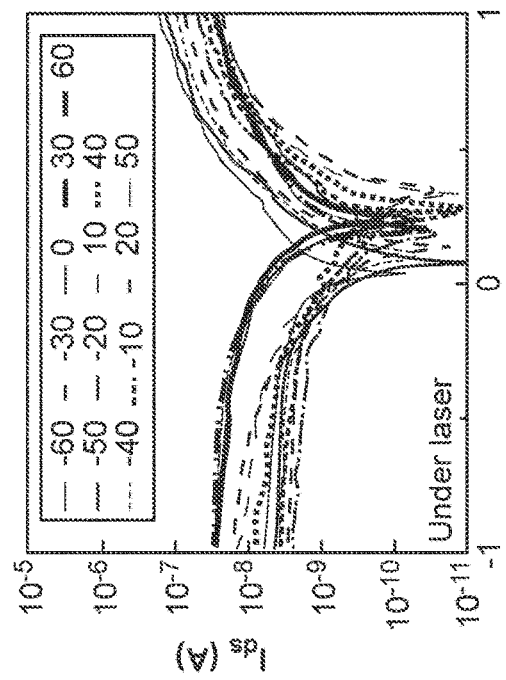
Figure 12D:
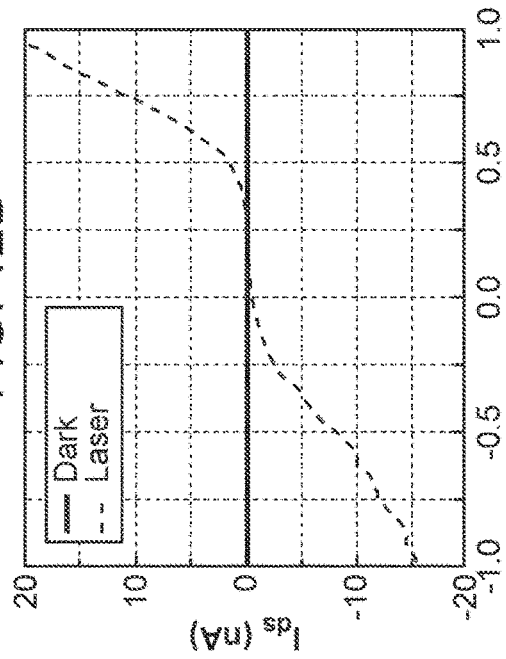

To accurately represent the thermionic emission of MS interface, Schottky barrier under flat-band gate voltage ($V_g=V_{FB}$) is used in FIG. 3. Below flat band voltage ($V_g<V_{FB}$), the device is under subthreshold regime and the channel resistance dominates the carrier transport. While above flat band voltage ($V_g>V_{FB}$), the contact is highly doped and a superimposed tunneling current affects the extracted barrier height, resulting in apparently smaller $\Phi_{SB}$. In theory, the extracted Schottky barrier $\Phi_{SB}$ has a linear relationship with gate voltage in subthreshold regime, and gradually becomes sub-linear above $V_{FB}$. In this way, a guided line can be used to extract the $V_{FB}$, and to accurately determine flat-band Schottky barrier (FIG. 8c,f).

Within the SBH extraction, about 0.1 V bias voltage ($V_{ds}$) is used. The resulting relationship between $I_{ds}$ current and diode saturation current can be expressed using the back-to-back Schottky diodes model with current continuity equation:

$$I_F = I_{sat}\left(e^{\frac{qV_F}{kT}} - 1\right) \quad (7)$$

$$I_R = I_{sat}\left(e^{\frac{-qV_R}{kT}} - 1\right) \quad (8)$$

$$I_{ds} = I_F = -I_R \quad (9)$$

$$V_{ds} = V_F + V_R \quad (10)$$

where $I_F$ is the current of forward bias diode, $V_F$ is the voltage applied on the forward bias diode, $I_R$ is the current of reverse bias diode, $V_R$ is the voltage applied on the reverse bias diode, and $I_{sat}$ is the saturation current to be measured. Based on these equations (7-10) with $V_{ds}$=about 0.1 V, the overall measured current $I_{ds}$ is about 96% of $I_{sat}$, approaching a nearly ideal single diode case, indicating the accurate measurement of $I_{sat}$ under this condition. Therefore, the relatively small bias voltage used here can reduce the superimposed tunneling current to approach an ideal SB based on pure thermionic emission, and is also large enough for the whole system to be viewed as a single diode at source side.

Impact of Ultra-Thin vdW Gap for Carrier Transport.

Although the non-bonding vdW gap may pose an additional series resistance, its value is relatively small (about 0.1 nm to about 0.15 nm) to affect the overall carrier transport and can be largely neglected. To quantitatively verify this proposition, calculation is made of the tunneling resistance of a vdW gap within the MS interface, through a direct tunneling model with following relationship:

$$J_T = \frac{q^3}{16\pi^2 \hbar \varphi_b} F_{vdW}^2 \times \exp\left\{-\frac{4}{3}\frac{\sqrt{2m_{vdW}}\,\varphi_b^{\frac{3}{2}}}{\hbar q F_{vdW}}\left[1-\left(1-\frac{qV_{vdW}}{\varphi_b}\right)^{\frac{3}{2}}\right]\right\} \quad (11)$$

where $J_T$ is the calculated current density, q is the electron charge, $\hbar$ is the reduced Planck constant, $\varphi_b$ is the distance between $MoS_2$ conduction band to vacuum energy, $F_{vdw}$ is the electrical field within the vdW gap, $m_{vdW}$ is electron mass within the vdW gap, and $V_{vdW}$ is the bias voltage applied across the vdW gap.

As shown in equation 11, to accurately evaluate the tunneling resistance, further determination is made of the vdW gap thickness using both theoretical calculations and experimental measurements. In theory, the vdW gap thickness ($T_{theory}$) between metal and $MoS_2$ can be calculated by subtracting the atomic radius from its van der Waals diameter, using following equations:

$$T_{theory}=(r_{vdW(m)}-r_{atom(m)})+(r_{vdW(s)}-r_{atom(s)}) \quad (12)$$

where the $r_{vdW(s)}$, $r_{vdW(m)}$, $r_{atom(s)}$, $r_{atom(m)}$ are the vdW radius of sulfur, vdW radius of metal, atomic radius of sulfur, and atomic radius of metal, respectively. Given the $r_{atom}$ and $r_{vdW}$ values are about 0.88 Å and about 1.8 Å for sulfur; about 1.35 Å and about 1.4 Å for copper; about 1.4 Å and about 1.63 Å for palladium; about 1.6 Å and about 1.72 Å for silver; about 1.35 Å and about 1.66 Å for gold; and about 1.35 Å and about 1.75 Å for platinum, respectively, the calculated vdW gaps are about 0.10-0.14 nm with different metals used.

Additionally, the vdW gap can also be directly determined from the cross-section TEM image (FIG. 1d) using the following equation:

$$T_{vdW}=d_{Mo-Au}-r_{Au}-r_s-dMo-S \quad (13)$$

where $T_{vdW}$ is the vdW gap thickness, $d_{Mo-Au}$ is the measured vdW diameter between Au surface plane and Mo surface plane (about 0.53 nm as measured from FIG. 1d), $r_{Au}$ is the gold atomic radius (about 0.135 nm), $r_S$ is the sulfur atomic radius (about 0.088 nm) and $d_{Mo-S}$ is the center-to-center distance between Mo surface plane and S surface plane (about 0.162 nm).

The experimentally determined $T_{vdW}$ is about 0.15 nm, consistent with theoretical expectations ($T_{theory}$ of about 0.1 to about 0.14 nm). Such a thin tunneling gap will result in a series resistance of about $10^{-10}$ to $10^{-8}$ $\Omega cm^2$ according to equation 11, which is several orders of magnitude smaller than the typical $MoS_2$ contact resistance (about $10^{-5}$ to about $10^{-3}$ $\Omega cm^2$), and therefore could be largely neglected.

Ag—$MoS_2$—Pt MSM Photodiode Analysis.

To fabricate Ag—$MoS_2$—Pt MSM photodiode, asymmetric electrode pairs composed of Pt and Ag are first deposited on a sacrificial wafer, and then physically laminated onto $MoS_2$ using the transfer method described above. To evaluate the photocurrent generation efficiency, extraction is made of the photoresponsivity $$R=I_{SC}/P_{laser} \quad (14)$$

where $I_{sc}$ is the short circuit current and $P_{laser}$ is the input laser power. The measured R values are about 7.2 mA/W for the monolayer and about 16.6 mA/W for the 7-layer $MoS_2$ devices. With R determined, further extraction is made of the external quantum efficiency $$EQE=Rhc/e\lambda \quad (15)$$

where h, c and e are Planck's constant, the speed of light and electron charge, respectively. As the device produces both large $I_{sc}$ and $V_{oc}$, electrical power Pet can also be extracted. As shown in dashed rectangular area in FIG. 4d, a maximum electrical output power of about 0.3 nW (about 3.7 nW) is obtained at $V_m$=about 0.54 V (about 0.5 V) for the monolayer (multilayer) device. For the fill factor (FF), specified as the ratio of maximum obtainable power to the product of the open-circuit voltage $V_{oc}$ and short-circuit current $I_{sc}$, a value of $FF=P_{el,max}/(V_{oc}I_{sc})$ of about 0.26 (about 0.47) is obtained for the monolayer (multi-layer) device. An estimate of the power conversion efficiency also can be provided, which is the percentage of the incident light energy that is converted into electrical energy, $\eta=P_{el,max}/P_{laser}$, where $\eta$=about 0.2% and about 0.61% for the monolayer and 7-layer devices, respectively.

TABLE 1

| $MoS_2$ device electrical performance. | | | |
|---|---|---|---|
| Method | *$L_{ch}$ (nm) | $I_{on}$ (mA/μm) | *Extrinsic mobility ($cm^2$/V s), RT |
| n-type | | | |
| Transferred Ag contact | 160 | 0.66 | 260 (electrons) |
| Sc contact | 5000 | 0.24 | 184 (electrons) |
| Contact Cl doping | 100 | 0.33 | 50 (electrons) |
| Contact DEC doping | 100 | 0.46 | 55 (electrons) |
| Contact phase engineering | 1200 | 0.085 | 46 (electrons) |
| Graphene contact | ~3000 | 0.01 | 70 (electrons) |
| Metal/graphene vdW contact[#] | 80 | 0.83 | 51 (electrons) |
| p-type | | | |
| Transferred Pt contact | 140 | 0.21 | 175 (holes) |
| Pd/$MO_x$ contact | 7000 | 0.00014 | <1 (holes) |
| $AuCl_3$ doping | ~1500 | 0.02 | 68 (holes) |
| Nd doping | NA | NA | 8.5 (holes, Hall) |

TABLE 2

| Photovoltaic effect in 2D semiconductor based diodes. | | |
|---|---|---|
| Method | 2D thickness | $V_{oc}$ (V) |
| Transferred Ag—$MoS_2$—Ag diode | 1 layer | 1.02 |
| Transferred Ag—$MoS_2$—Ag diode | 7 layer | 0.76 |
| Evaporated Pd—$MoS_2$—Au diode | Multilayer | 0.1 |
| Dual-gate $WSe_2$ p-n diode | 1 layer | 0.86 |
| Dual-gate $WSe_2$ p-n diode | 1 layer | 0.7 |
| $MoS_2$—$WSe_2$ vertical p-n diode | 9 layer-10 layer | 0.5 |
| $MoS_2$—$WSe_2$ planar p-n diode | Few layer-1 layer | 0.3 |
| $MoS_2$—$WSe_2$ planar p-n diode | 1 layer-1 layer | 0.59 |
| $MoS_2$—BP planar p-n diode | 1 layer-few layer | 0.27 |
| $WSe_2$—BN-graphene diode | 3 layer-20 layer-3 layer | 0.82 |
| Graphene-$MoS_2$-graphene vertical diode | 1 layer-multilayer-1 layer | 0.3 |

Example 2

A Van Der Waals Integration Approach for Material Integration and Device Fabrication The integration of different materials and the formation of hetero-material interfaces are desired for various modern electronic and optoelectronic devices. A comparative strategy to hetero-material integration generally relies on chemical epitaxial growth (CEG) or physical vapor deposition (PVD). Chemical epitaxial growth, including molecular beam epitaxy (MBE) or metal organic chemical vapor deposition (MOCVD), can provide high quality semiconductor heterostructures that form a material foundation for a wide range of state-of-the-art devices including high electron mobility transistors, light-emitting diodes, laser diodes and quantum cascade lasers. However, such integration relies on one-to-one chemical bonds and is usually constrained to materials with highly similar lattice symmetry, lattice constants and thus similar electronic properties. Materials with substantially different structures or lattice parameters generally cannot be epitaxially grown together without generating too much defects that could seriously alter/degrade their intrinsic electronic properties. On the other hand, physical vapor deposition (e.g., electron beam (e-beam)/thermal evaporation, and sputtering), relying on high energy vaporization of precursor materials for direct deposition, is more flexible on material types and lattice structures, and thus widely used for integrating highly disparate materials (e.g., metal-semiconductor or semiconductor-dielectric) to create functional interfaces in electronic devices. However, the resulting materials (typically amorphous or polycrystalline) and heterostructure interfaces (e.g., metal-semiconductor or semiconductor-dielectric interfaces) are usually plagued by high-energy deposition induced defects and rich chemical disorders that dictate the properties of the resulting devices.

In contrast, van der Waals (vdW) integration, in which pre-formed materials are physically assembled together through vdW interactions, provides a low-energy material integration approach. The flexible physical assembly approach does not rely on one-to-one chemical bonds, and is not constrained to materials that have similar lattice structures or specify similar synthetic conditions. It can thus open vast possibilities for substantially damage-free integration of highly disparate materials beyond the constraints posed by lattice matching or process compatibility conditions. With weak vdW interactions, a wide range of two-dimensional (2D) atomic layers can be isolated, mixed, matched and combined to create a class of vdW heterostructures and superlattices, opening opportunities for manipulating the confinement and transportation of electrons, holes, excitons, photons, and phonons at the limit of single atom thickness. It provides for material integration and improved devices with unprecedented performance or functions beyond the reach of comparative materials.

In general, the low-energy vdW integration approach is not constrained to a particular material type and material dimension, and can be extended beyond creating 2D/2D semiconductor heterostructures as a general approach for integrating materials with different atomic structures, electronic properties (e.g., metals, semiconductors and insulators), or dimensions (e.g., zero-dimensional (0D), one-dimensional (1D), 2D and three-dimensional (3D)) to create high quality heterostructures. For example, the vdW integration approach can be used for creating high quality semiconductor-insulator interface for 2D transistors, or nearly ideal metal-semiconductor interface for validation of the Schottky-Mott rule. The vdW integration can be extended as a general material integration approach beyond 2D materials for creating diverse heterostructure interfaces with little integration induced damage and minimum interface traps, providing high quality interfaces and high-performing devices that are difficult to achieve with chemical epitaxial growth or physical vapor deposition approaches, and thus open diverse opportunities:

(1) Reliable contacts. The vdW integration can function as an effective strategy to address the standing challenges in making reliable contacts, gate stacks and high performance devices from delicate materials including atomically thin 2D semiconductors, organic crystals, perovskite materials and molecular monolayers, or inorganic semiconductor thin films such as quantum dots thin films, solution processed semiconductor thin films, or virtually any electronic thin films. Many of these materials are soluble in various solvents or too delicate to withstand typical dielectric deposition, metal deposition/sputtering or lithographic process, without generating excessive defects at an interface that can adversely alter electronic properties of the respective materials.

(2) Scalable integration over large area and in 3D. By using the vdW integration approach, device fabrications stages and device components (including gate, dielectrics, contact electrodes, interconnect) can be fabricated on a sacrificial substrate and then transferred/laminated directly to large area thin film 2D semiconductors, organic crystals, perovskite materials and molecular monolayers for scalable device fabrication. After such physical transfer and vdW assembly process, minimum lithographic stages can be used to isolate/interconnect each device in areas without affecting an active device area. This process can be further expanded for 3D circuit integration. For example, a first layer of a semiconductor is first applied (e.g., transfer, printing, or spin-coating) on a substrate, next a complete device stack (including gate, dielectrics, contact electrodes, interconnect) is fabricated on a sacrificial substrate and transferred on top of the semiconductor layer. Next a single lithographic stage is conducted to isolate/interconnect each device in areas without affecting an active device area to complete a first layer of circuit. After that, a passivation layer can be deposited on the entire circuit and then planarized, on which a second, third or fourth layer of circuits can be created by repeating the above processes. Different layers can be further interconnected by opening vias for vertical connections. Such room temperature or moderate temperature vdW assembly approach can be applied to many delicate materials for 3D integration. The vdW integration and layer-by-layer assembly approach can be conducted using an equipment similar to a photolithography aligner to ensure proper alignment and registration of each incoming layer with an existing layer on a surface. The releasing mechanism can be thermal, chemical, or stress induced by external stimulations (e.g., moderate heating, light illumination, solvent exposure, and so forth)

(3) Organic electronics and heterostructure integration. Solution-processed organic electronics and heterostructures hold the promise for low cost, solution-based, flexible microelectronics and optoelectronics. However, the fabrication of organic devices and heterostructures are constrained by the solvent compatibility when spin-coating each layer, and it is of great challenge to coat a second layer without degrading or dissolving a first layer. For example, in tandem solar cell fabrication, an inorganic protection layer (evaporated or spin-coated using alcohol-based solvent) is typically inserted between adjoining layers to suppress solvent damage, which greatly decreases the overall cell efficiency. This compatibility constraint also occurs in devices such as all-organic transistor and organic light-emitting diodes (OLEDs) between an organic substrate, a channel, as well as a dielectric. By using the vdW integration approach, organic components/layers can be pre-fabricated and then physically assembled with each other without involving an organic solvent, and therefore would provide more freedom in material selection and greatly increase an overall device performance.

(4) Vertical diode for photovoltaic LEDs. With the vdW integration approach, one or more semiconductor/active/functional layers (e.g., organic semiconductors, perovskites, semiconductor quantum dots, nanocrystalline thin films, or thin film semiconductors) can be assembled between two electrodes: one with a low work function (e.g., Si or graphene), one with a high work function (e.g., Au or Pt) to create a diode with asymmetric charge transport, one optimum for electrons, and the other optimum for holes. Such devices can be particularly useful for creating high performance photovoltaic devices, LEDs and laser diodes with minimum interface damage to ensure efficient charge transport. A challenge in making devices is an evaporation induced damage to a functional layer (e.g., organic semiconductors, perovskites, semiconductor quantum dots, nanocrystalline thin films, or thin film semiconductors) that is usually rather delicate. Therefore, the vdW integration or physical lamination approach can be applied to create a thin film metal contact for such devices with minimum damage to an active layer to ensure optimum device performance.

(5) Flexible electronics. Wearable electronic devices should be flexible and stretchable; while typical silicon and III-V wafers are not. Other approaches to address this challenge include two conceptually different ways. One relies on the use of structures that lend flexibility (such as wavy silicon membrane), and the other relies on synthesizing materials that are intrinsically flexible (such as organic polymers). Although these approaches can improve the flexibility of an individual material component itself, they largely neglect an interface strain in heterostructures that dominate an overall device flexibility. When a chemical bonded heterostructure is stretched, large internal strains can build up on an interface between two dissimilar materials that typically have distinct Young's moduli and other mechanical properties. Hence, the malfunction or failure of a given flexible device often first happens from tears in various interfaces (e.g., metal-semiconductor or dielectric-semiconductor), rather than an individual material itself. Overcoming this fundamental mismatch in mechanics is difficult using other approaches, which is typically based on strong one-to-one chemical bonds. Alternatively, the vdW integration with non-bonded system can bypass these two approaches and improve flexible electronics. When a vdW heterostructure is bent or stretched, components with distinct mechanical properties tend to slide towards each other owning to weak vdW interaction. Such sliding junction can effectively release a localized strain in an interface, and therefore overcomes this fundamental mechanical mismatch within a functional system.

(6) Low-k capacitor. Capacitors composed of low-k dielectrics using amorphous or porous materials are used in modern electronics to mitigate against high frequency signal crosstalk. However, compared to $SiO_2$, low-k materials can be mechanically weak, poorly compatible with other materials, and prone to absorb chemicals, and hence integrating a secondary material on top of non-flat low-k materials is challenging using techniques such as PVD, CVD, or electrodeposition, where integrated materials will typically be deposited into voids and gaps (within a porous low-k). With vdW integration, this constraint can be bypassed by integrating pre-fabricated structures onto various materials with surface roughness, topography, or even film crack without constraint of integrated film continuity.

(7) Pinning free interface of coherent charge injection. Coherent charge injection is desired for a number of quantum electronic devices that specify phase coherence, but is often plagued by interface scattering due to high disorder at an electrode interface. In spintronic devices based on polarized carrier transport across various heterostructure interfaces such as ferromagnetic-conductor-ferromagnetic, ferromagnetic-insulator-ferromagnetic, or ferromagnetic-semiconductor-ferromagnetic, a spin injection efficiency is dedicated by interface quality and largely suppressed by interfacial roughness, impurities and other types of disorders such as inter-diffusion, grain boundaries, stacking faults, and vacancies at an interface. For example, in deposited Fe—Si magnetic junction, high energy Fe atoms (during vacuum deposition) tend to diffuse into a Si crystal lattice and lead to random oriented local magnetic moment, greatly scattering injected spin polarized electrons and degrading overall spin polarization. In contrast, within vdW magnetic junctions, atom inter-diffusion induced scattering effect and interface states can be reduced by physically integrating various functional components (e.g., ferromagnetic metal, insulator, and semiconductor) with clean and sharp interfaces, thus providing high efficiency, coherent spin injection. Beyond magnetic junctions, the vdW integration approach can also be extended for creating other functional junctions, which are previously plagued by interface disorder. Possible directions include vdW superconductor-semiconductor junctions, metal-insulator tunneling junction and Josephson tunneling junction. High performance magnetic tunneling devices, superconducting tunneling devices, or various quantum interference devices can benefit from vdW integrated pinning free interfaces.

(8) System-level vdW integration. Besides integrating high quality components into one device, vdW integration can be further extended to system-level by assembling multiple pre-fabricated device layers into a functional system. Various active or passive device layers can be layer-by-layer assembled by repeated lamination of pre-fabricated vdW building blocks (e.g., semiconductor, gate dielectric, and contact) or pre-assembled device layers (e.g., complementary metal-oxide-semiconductor (CMOS) circuit, flash memory, photodiode cell). Each active device layer can be separated by planarization layers with various thickness (e.g., thicker when reduced crosstalk is desired), and can be further connected with each other using via through holes. Within this heterogeneous stacking geometry, functional layers are vdW integrated without process incompatibilities, thus providing 3D electronics integration with reduced process cost and device footprint.

Together, vdW integration provides a low-energy material integration approach (in contrast to more aggressive chemical integration strategy), thereby opening vast possibilities for damage-free integration of highly distinct materials beyond the constraints posed by lattice matching or process compatibility conditions, and thus greatly improve the performance of various devices, including transistors, diodes, photovoltaics, LEDs, and laser diodes, amongst others.

Example 3

Two-Dimensional Semiconductor Transistors Through Van Der Waals Integration

Introduction

Two-dimensional (2D) semiconductors (2DSCs) are an attractive material candidate for electronic devices. Efforts on 2D radio frequency (RF) transistors primarily focused on graphene owning to its combination of several important characteristics not readily achievable in other materials, including: (1) Graphene exhibits the highest carrier mobilities (>about 200,000 cm$^2$/V s) among various materials, which is about 100 times higher than that of silicon, but also over about 10 times higher than that of the high mobility group III-V semiconductors. (2) A potential advantage of graphene over carbon nanotubes is that a 2D structure of graphene can allow for scalable integration without sophisticated assembly stages. Experimentally handling and precisely assembling one-dimensional (1D) nanostructures (e.g., nanotubes) into highly integrated circuits can be challenging, and represents a technical barrier impeding the wide-spread application of carbon nanotubes in practical electronic circuits. (3) Large area graphene can be grown on a metal foil through chemical vapor deposition (CVD) and transferred onto various substrates to allow the fabrication of high performance large area electronics on different substrates. (4) The exceptional mechanical strength and flexibility of monolayer graphene can allow robust integration with plastic substrates to provide high performance flexible electronics. Therefore, graphene is considered for ultra-high speed electronics operating up to the terahertz regime. The intrinsic properties of graphene can provide transistors with excellent cut-off frequency ($f_T$).

Besides $f_T$, another RF transistor figure of merit is the maximum oscillation frequency $f_{MAX}$ (the frequency at which the unilateral power gain U equals unity), following:

$$f_{MAX} = \frac{f_T}{2\sqrt{(g_d(R_g + R_{sd}) + 2\pi f_T R_g C_g)}}$$

where $f_T$ is the current of frequency, $g_d$ is the channel conductance, $R_g$ is the gate resistance. $C_g$ is the gate capacitance and $R_{ds}$ is the source-drain resistance. In contrast to their impressive $f_T$ performance, graphene transistors can behave rather poorly in terms of the maximum frequency of oscillation $f_{MAX}$. The highest $f_{MAX}$ data reported is in the range of about 40-50 GHz, compared to several hundreds of GHz for other field-effect transistor (FET) types. The reason for the relatively low $f_{MAX}$ of graphene transistor lies in a weak saturation of the drain current of its direct current (DC) output characteristics, and therefore the relatively large $g_d$ and low oscillation frequency. The poor drain current saturation is a consequence of a gapless nature of graphene, and a moderate bandgap of about 100 meV could improve this issue.

Beyond graphene, a family of 2DSCs can be considered (e.g., MoS$_2$, WSe$_2$, and black phosphorus), composed of a single- or few-atom-thick, covalently bonded lattice. Similar to graphene with atomic body thickness, these dangling-bond-free semiconductors exhibit extraordinary electronic and optical properties and provide advantages, which is in great contrast to silicon or III-V compounds that are plagued by dangling bonds and trapping states at a surface and interfaces. For example, with a body thickness $t_{body}$<1 nm, layered MoS$_2$ shows smaller gate screening length ($\lambda$~$t_{body}^{0.5}$) and larger bandgap (about 1.9 vs. about 1.1 eV) compared to silicon, both of which can suppress short channel effects and reduce resulting heat generation. Layered black phosphorus (BP) exhibits high carrier mobility μ>about 1,000 cm$^2$V$^{-1}$ s$^{-1}$ at room temperature, in contrast to the poor electrical performance of bulk silicon <about 500 cm$^2$V$^{-1}$ s$^{-1}$) when shrinking down to about 10 nm body thickness. Due to the thickness variation, extensive surface dangling bonds and strong surface scattering (FIG. 13a), a substantial degradation of charge transport characteristics can occur in a bulk semiconductor, where the carrier mobility decreases proportional to the sixth power of the body thickness ($t_b$) in the sub-5 nm regime (μ~$t_b^6$, FIG. 13b), posing a scaling constraint of 3D bulk semiconductors.

In contrast, with an atomically thin body, 2DSCs are substantially free of surface roughness and dangling bonds; therefore, a measured mobility value varies little with body thickness, and is much higher than bulk materials in sub-5 nm regime. Importantly, the dangling-bond-free surface and weak van der Waals (vdW) interaction in 2DSC ensure excellent electronic properties and great flexibility in terms of 2DSC growth, dielectric deposition and substrate integration without constraints of lattice matching and other material/processing compatibility issues. Furthermore, a merit of 2DSC in terms of RF performance is the presence of a finite bandgap, which is desired for current saturation and can overcome the constraint of graphene. Taking advantage of these attributes, layered MoS$_2$ can function in high performance transistors with excellent current saturation ON/OFF ratio exceeding 7 orders of magnitude, and intrinsic cutoff frequency up to about 40 GHz, and maximum power gain up to about 50 GHz. Importantly, with atomically thin thickness and excellent mechanical flexibility, such MoS$_2$ transistors can be used to create flexible electronic circuits functioning in the gigahertz regime with voltage gain on a plastic substrate.

Although demonstration is made of advantages of 2DSC for atomically thin RF electronics, the electrical performance is still inadequate and is still considerably lower compared with silicon devices. For example, the current density of metal contacted MoS$_2$ transistor is about 0.3 mA/μm, and is nearly five times lower than that of silicon devices (about 0.3 vs. about 1.6 mA/μm). Consequently, the highest demonstrated cut-off frequency ($f_T$) and oscillating frequency of about 42 GHz and about 50 GHz are about an order of magnitude lower compared to that of high performance silicon RF devices (about 360 and about 420 GHz). These performance parameters of 2DSCs are constrained by a large contact resistance ($R_c$) at an interface between 2DSC and a bulk contact metal. For high-performance electronics, contact electrodes should have trap-free interfaces with reduced $R_c$.

In silicon-based microelectronics, two approaches are generally applied to achieve such contact properties: using work function matched silicides/metals or highly doped contact regions. The former approach reduces the corresponding Schottky barrier height and enhances the electron injection through a thermionic emission, while the latter approach reduces the barrier width through a tunneling process. Similar strategies are also used for III-V semiconductors. However, applying such approaches to improve contact properties in 2DSC is not straightforward and remains a substantial challenge in 2D electronics. For example, although 2DSC is free of surface dangling bonds and trap states, Fermi level pining and non-negligible Schottky barrier are still observed and dominate a metal-2DSC interface, most likely due to metal deposition induced defects and surface states. On the other hand, high doping level at a contact area is also challenging for 2DSCs, since ion implementation processes can significantly damage an atomic surface in 2DSC and create additional dangling bonds. Therefore, a metal-2DSC contact resistance is typically about 3-5 kΩμm, and is over one order of magnitude larger than that of silicon devices (about 0.1 kΩμm), greatly constraining a practical application of 2DSC electronic devices, especially for RF transistors. Although certain chemical doping methods can successfully reduce a contact resistance, it still suffers from poor chemical stability and challenges remain to apply this approach for creating ultra-short channel devices without degrading electronic properties of a channel area. To this end, a van der Waals integration approach is proposed to create 2DSC-metal contact and 2DSC-dielectric interface and create high-speed transistors from 2DSCs with unprecedented performance. Specifically, to omit direct lithography on a delicate 2DSC surface, an entire gate stack and contact electrodes are fabricated on a sacrificial substrate and physically transferred onto 2DSC with reduced damage within a dielectric-2DSC interface and a metal-2DSC interface.

Technical Approach:

In order to overcome constraints and achieve superior RF performance, an approach is proposed to fabricate $MoS_2$ transistors with sub-100 nm gate length using a metal-dielectric stack as a self-aligned top gate, and a van der Waal transferred metal as self-aligned source and drain electrodes, both of which are integrated with $MoS_2$ through a physical assembly process while substantially avoiding damaging a delicate 2DSC surface. In particular, the physical assembly and vdW integration of both gate stack and contact electrodes omit any direct aggressive processes on $MoS_2$ to mitigate against integration-induced damage to the atomically thin 2DSC, thus ensuring pristine 2DSC-dielectric interface with little trapping states and excellent channel mobility, and nearly ideal metal-semiconductor interface substantially free of interface Fermi level pinning and with reduced contact resistance. The self-aligned source and drain electrodes reduce access resistance and parasitic capacitance and enhance device transconductance. It can therefore provide $MoS_2$ transistors with reduced interface defects and optimized device geometry and provide unprecedented driving current, transconductance and frequency response. Demonstration is made of $MoS_2$ transistors with an ON-current up to about 0.83 mA/μm, more than doubling those achieved with deposited metal contact and paving a path for 2DSC transistors with cut-off frequency >about 100 GHz. With this approach, it is proposed to (1) fabricate and characterize sub-100 nm channel length $MoS_2$ transistors with a transferred gate stack, transferred self-aligned source and drain electrodes and an intrinsic cutoff frequency $f_T$ and $f_{MAX}$ up to about 150 GHz; (2) explore other high mobility 2D semiconductors (such as black phosphors, $WSe_2$, InSe, and SnSe) in vdW integrated transistors with further improved device performance; and (3) develop a scalable process for the fabrication of self-aligned high-speed 2D transistor arrays and circuits on glass or flexible plastic substrates.

Results:

Graphene Contact for 2D Semiconductor.

To demonstrate the advantage of vdW contact to 2DSCs, a $MoS_2$ transistor is created using bottom graphene electrodes and investigation is made of its electrical characteristics. Two strips of single layer graphene are first mechanically exfoliated onto a substrate as back contact electrodes, followed by integration of $MoS_2$ using dry alignment transfer technique. This direct vdW integration of graphene contact with the exfoliated $MoS_2$ is desired for avoiding lithography process introducing polymeric residues that can adversely impact the charge transport behavior across the graphene-$MoS_2$ interface. Without any post-fabrication annealing process, this device exhibits linear $I_{ds}$—$V_{ds}$ output curve for both monolayer and multilayer $MoS_2$ down to about 1.9 K, indicating a transparent and barrier free contact for $MoS_2$. With the optimized contact at low temperature, further fabrication is made of a long channel device using BN/$MoS_2$/graphene/BN sandwich structure and demonstration is made that the two-terminal $MoS_2$ extrinsic mobility can reach up to about 1300 $cm^2$/V s at about 1.9 K.

Metal-Graphene Hybrid Van Der Waals Contact.

Although graphene-based vdW contacts successfully reduce the Schottky barrier height and provide transparent contact under low temperature, these devices do not typically show lower $R_c$ at room temperature. The $R_c$ of an optimized, barrier-free graphene contact is typically about 10 kΩμm, whereas that of an optimized metal contact is about 3-5 kΩμm. To overcome this constraint, fabrication is made of $MoS_2$ transistors using graphene-metal hybrid contact. The achieved $R_c$ in a metal-graphene-$MoS_2$ stack (about 0.54 kΩμm) is more than one order of magnitude smaller over a graphene-$MoS_2$ contact. This is attributed to a reduced interlayer van der Waals gap due to the continued bombardment of metal atoms on graphene during a metal deposition process, as well as the elimination of series resistance of graphene electrodes. Additionally, compared with graphene-$MoS_2$ contact, the presence of a metal layer increases the density of states in the hybrid stack system, thus enhancing the electron tunneling probability.

With the optimized contact resistance, further performance of $MoS_2$ transistors is attained by fabricating sub-100 nm channel length. A synthetic nanowire is used as a selective etching mask to define an ultra-short channel device with self-aligned graphene-metal hybrid contact. The physical assembly and removal of the nanowire mask allows the fabrication of ultrashort device with a channel length specified by the diameter, and retaining the pristine electronic properties of $MoS_2$ channel. With simultaneous reduction of the contact resistance and channel length, an about 80 nm channel length $MoS_2$ transistor is demonstrated to deliver record high ON-current density of about 0.83 mA/μm at room temperature, demonstrating significant potential of $MoS_2$ and other 2DSCs for electronic applications.

Transferred Metal Van Der Waals Contact.

Metal integration and device fabrication processes can lead to chemical disorders and defect induced gap states (DIGS) that can strongly pin the Fermi level of a semiconductor. The high-energy lithography process can damage crystal lattice; metal deposition process involves atom/cluster bombardment and strong local heating to a contact region; and a resist development process can also leave polymer residue within an interface. Plagued by Fermi level pinning effect at metal-semiconductor interfaces, deposited metals generally cannot be directly used to achieve optimum contact with reduced barrier height regardless of a work function of the metals used. An Ohmic contact is generally achieved through sophisticated interface or doping engineering to reduce Schottky barrier width, which typically involves highly aggressive processes (such as ion implantation and high temperature annealing) and is not applicable for many delicate materials such 2DSCs or organic semiconductors.

In order to overcome this Schottky barrier constraint and to achieve optimized metal-semiconductor interface, preparation is made of a van der Waals metal-semiconductor contact, where metal electrodes with atomically flat surface is pre-fabricated and physically laminated onto dangling-bond free 2DSCs substantially without direct chemical bonding, and associated interface states and DIGS. This vdW integration approach avoids direct energetic processes on semiconductors, mitigates against surface degradation and therefore reduces chemical disorder and interface pinning to attain nearly unity S-parameter. Importantly, benefited from the weakly pinning vdW junction with transferred metal contacts, it is shown that optimum contact can be achieved by selecting transferred metals with proper work function matching with $MoS_2$ conduction or valence band edges, providing both p-channel and n-channel $MoS_2$ transistors with high two-terminal electron mobility (e.g., about 260 $cm^2$/Vs) and hole mobility (e.g., about 175 $cm^2$/Vs) at room temperature.

Top Gate Stack Fabrication:

Demonstration is made of low contact barrier, small contact resistance and ultra-high ON-current density using van der Waals contact architecture. It can therefore provide a high operation speed. A high-speed transistor typically specifies a larger delivering current (low contact and access resistance), and a local gate layout to reduce parasite capacitance. A nanowire gate can be used as a shadow mask for self-aligned source and drain electrodes to effectively reduce an access resistance and a parasitic capacitance, but can be constrained by a relatively high contact resistance due to non-ideal contact from deposition induced damage to 2DSCs. On the other hand, transfer contact in a back gate geometry is demonstrated to be an effective approach to achieve optimum contact without damage to 2DSC, but is constrained by large parasite capacitance and is less suitable for high speed electronics.

Here a scalable approach is proposed for high-performance local top gate 2D transistors by transferring lithographically patterned gate stacks and van der Waals contact. FIG. 14 illustrates the proposed approach to fabrication of self-aligned $MoS_2$ transistors with transferred gate stacks and van der Waals contacts. (1) An about 50 nm gold thin film is deposited on a Si/$SiO_2$ substrate using e-beam evaporation (FIG. 14a). (2) Next, about 25 nm $Al_2O_3$ top-gate dielectric film is then deposited on the gold surface by atomic layer deposition (ALD) at about 250° C. (FIG. 14b). (3) Top-gate electrodes (with gate length <about 100 nm) are then formed using high-resolution e-beam lithography and e-beam deposition of about 20 nm/about 30 nm Ti/Au as a gate electrode (FIG. 14c). (4) $Al_2O_3$ top-gate dielectric film is then patterned by anisotropic reactive ion etching (RIE) using gate electrode metal strips as an etching mask to form a metal-dielectric stack structure (FIG. 14d). (5) An about 15 nm thick $Al_2O_3$ sidewall is formed by using ALD at about 250° C. (FIG. 14e). (6) Anisotropic RIE process is employed to etch away the dielectric on top of the gold, leaving the rest covered on the sidewall of the gate stack (FIG. 14f). Here, the sidewall protection of the gate stack is desired for later self-alignment process, which would otherwise result in short circuit between gate and source and drain electrodes.

In contrast to other 2D RF transistors formed using self-aligned nanowire gates, the proposed transferred gate stack can overcome two constraints. First, a gate length is determined by an e-beam lithography resolution and can reach sub-10 nm, which is nearly 1 order of magnitude smaller compared to a nanowire gate length (about 100 nm). Smaller gate length can achieve smaller gate capacitance and higher operation speed. Although in principle the gate length can be reduced to sub-10 nm or sub-5 nm using state-of-the-art high-resolution e-beam lithography, a practical gate length may be longer, which is specified by an aspect ratio between gate length and gate stack height. In order to mitigate against the transferred gate stack from falling down, an aspect ratio larger than about 1 is specified. Since the gate stack height of about 30 nm to about 40 nm is specified for successful self-alignment process, a targeted gate length can be about 50-100 nm. Second, compared to complex nanowire-assembly processes, the top gate stack transfer process is highly scalable, and therefore can be applied to large-scale fabrication of 2D RF transistor arrays.

Van Der Waals Self-Aligned Contacts and Gate Stack Integration:

After the gate stack is fabricated on the first sacrificial substrate (as shown in FIG. 14), a physical metal electrode transfer process is proposed. (1) A thin layer of AZ4620 photoresist is first spin-coated onto a substrate to wrap around the gate stack. Then a thermal release tape (TRT) is attached onto the top of the substrate, and the whole structure is immersed in deionized (DI) water at room temperature, followed by the peeling of an edge of the TRT, owning to a weak adhesion between gold and the first sacrificial substrate. The gold layer can be peeled and is then etched away using gold etchant. (FIG. 15a, b). (2) The TRT and the attached top-gate stack are laminated onto a second $SiO_2$ sacrificial substrate, followed by 14 repeated acetone rinsing in order to remove the photoresist (FIG. 15c). (3) A thin layer of Ag/Au (about 5 nm/about 5 nm) metal is then deposited across the gate stack to form self-aligned source and drain electrodes (FIG. 15d), followed by e-beam lithography and vacuum metallization of thick Au (about 70 nm) to define GSG (ground-signal-ground) RF probing pads (FIG. 15e). (4) A thin layer of poly(methyl methacrylate) (PMMA) A8 polymer is then spin-coated onto the substrate to wrap the gate stack and self-aligned electrodes, and then mechanical peeling from the second substrate. It is noted that the metal released using this method is atomically flat (in the back side) with a mean surface roughness of about 0.2-0.3 nm (FIG. 15f). (5) Few layer of $MoS_2$ is first mechanical peeled onto a glass substrate, and the PMMA wrapped gate stack and electrodes are then aligned and transferred on top using a dry transfer technique (FIG. 15g, h).

Figure 16B:
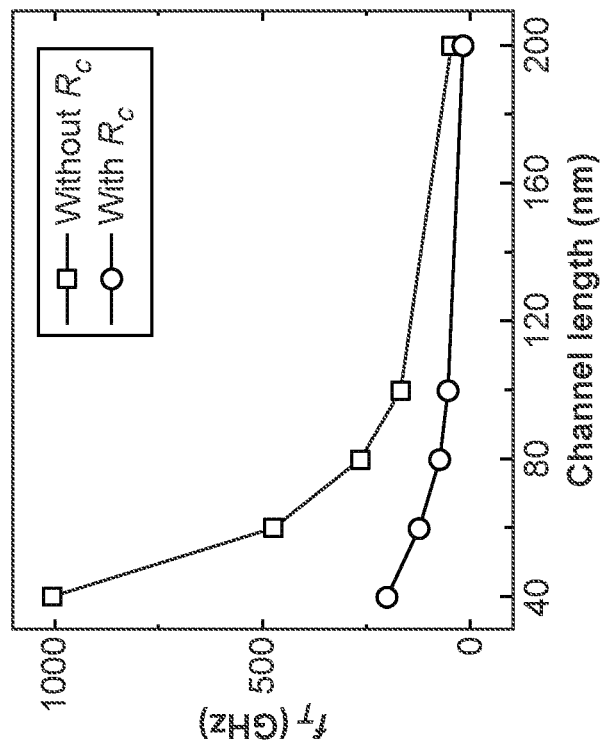
FIG. 16. a, Projected cut-off frequency $f_T$ as a function of bias voltage. b, Projected $f_T$ as a function of channel length, with and without the influence of contact series resistance.
Figure 16A:
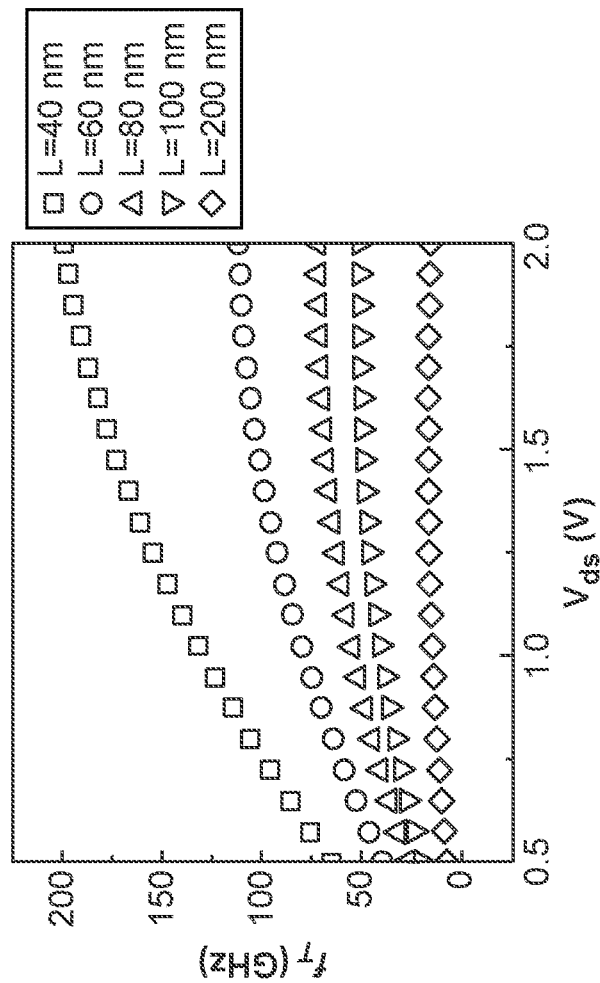

Evaluation the Speed Using DC Characterization and Analysis:

The design of transferred gate and van der Waals contacts opens a pathway to high-speed 2DSC electronics through contact engineering. To this end, evaluation should be made of the scaling relationship between switching speed and device dimension. On-chip microwave measurements can be conducted to evaluate the frequency response of such device. A rough analysis of the intrinsic delay ($\tau$) of the resulting device can be achieved using the equation $\tau = CV/I$, where C is the total parasite capacitance between a gate electrode and a channel, V is the applied source-drain bias voltage, and I is the source-drain current. In a preliminary result, it is demonstrated that nickel-graphene hybrid contact can provide an ultra-low $R_c$ of about 0.54 k$\Omega\mu$m, and an about 80-nm $MoS_2$ transistor can deliver ION of about 0.83 mA/$\mu$m at room temperature. With these parameters as references and about 25 nm thick $Al_2O_3$ as the gate dielectric, the speed of this transistor can be projected and shown in FIG. 16. The cut-off frequency ($f_T$) of an about 40 nm channel device can reach up to about 200 GHz, which is comparable with a silicon transistor using a similar channel length. In FIG. 16b the influence of channel length scaling is projected. Without the impact of $R_c$, the $f_T$ follows a relationship with channel length $f_T \sim 1/L_{ch}$, and can reach over about 1 THz, as shown in the bottom curve in FIG. 16b. When taking consideration of the $R_c$, the resulting $f_T$ will be much lower, especially at short channel region ($L_{ch}$=about 40 nm), where the device behavior is dominated by contact resistance. From this projection, it can be observed that reducing contact resistance can improve the total RF behavior. Further optimization can be made by using high-k dielectric to screen phonon scattering or using boron nitride encapsulation to reduce interface-trapping scattering.

With the comparable operation speed, low leakage current and high flexibility, the projection indicates $MoS_2$ as promising in extending performance scaling. It is noted that $MoS_2$ is explained as a semiconductor in the above fabrication and analysis, for the simplicity of the discussion. A similar transfer top gate and contact process and non-damaging van der Waals contact geometry can be extended to other 2DSCs (such as $WSe_2$, $WS_2$, black phosphorus (BP), InSe, SnSe, and so forth). Additionally, owing to the exceptional flexibility of 2D material and the transfer gate technique, devices can be fabricated on various substrates such as glass, plastic, or even human skin. Development is proposed of an about 150 GHz $f_T$ and $f_{MAX}$ for $MoS_2$ or BP single transistor and about 10 GHz RFID circuit for flexible and wearable electronics.

High Frequency RF Characterization and Analysis:

To assess RF characteristics of proposed self-aligned transistors, on-chip microwave measurements can be carried out using a GSG testing structure. Measurement of frequency response can be made up to about 67 GHz. Due to small dimension of devices and potential high speed, devices can be fabricated on insulating glass or sapphire substrate. To accurately determine the intrinsic $f_T$ values involves careful de-embedding procedures to exclude parasitics. Specifically, to ensure high fidelity in the de-embedding process, the measured S-parameters can be de-embedded using specific "short" and "open" structures with identical layouts, excluding the $MoS_2$ channel, to remove the effects of the parasitic capacitance, resistance and inductance associated with the pads and connections. The "through" calibration can also be done with exact pad layout with gate shorted to drain, and the "load" calibration can be done with standard calibration pad.

The de-embedded S-parameters constitute a complete set of coefficients describing the intrinsic input and output characteristics of the transistors. The current gain as a function of frequency will be determined from these measurements using:

$$h_{21} = \frac{-2S_{21}}{(1-S_{11})(1+S_{22})+S_{12}S_{21}}$$

Additionally, the two port S parameters can be converted to other two port parameters such as admittance parameters (Y parameters) and impedance parameters (Z parameters) using the following formula.

$$\begin{bmatrix} y_{11} & y_{12} \\ y_{21} & y_{22} \end{bmatrix} = \frac{1}{Z_0} \begin{bmatrix} \frac{1-s_{11}+s_{22}-\Delta s}{1+s_{11}+s_{22}+\Delta s} & \frac{-2s_{12}}{1+s_{11}+s_{22}+\Delta s} \\ \frac{-2s_{21}}{1+s_{11}+s_{22}+\Delta s} & \frac{1+s_{11}-s_{22}-\Delta s}{1+s_{11}+s_{22}+\Delta s} \end{bmatrix}$$

$$\begin{bmatrix} z_{11} & z_{12} \\ z_{21} & z_{22} \end{bmatrix} = Z_0 \begin{bmatrix} \frac{1+s_{11}-s_{22}-\Delta s}{1-s_{11}-s_{22}+\Delta s} & \frac{2s_{12}}{1-s_{11}-s_{22}+\Delta s} \\ \frac{2s_{21}}{1-s_{11}-s_{22}+\Delta s} & \frac{1-s_{11}+s_{22}-\Delta s}{1-s_{11}-s_{22}+\Delta s} \end{bmatrix}$$

where $\Delta s = s_{11}s_{22} - s_{12}s_{21}$, and $Z_0$ is the system transmission line impedance. The Y and Z parameters are complex numbers with real and imaginary parts. Based on the corresponding circuit topology of the device, device component values (including: gate and drain parasitic capacitance $C_{pg}$ and $C_{pd}$; the source, drain and gate electrode resistance $R_s$, $R_d$, and $R_g$; the source, drain and gate electrode inductance $L_s$, $L_d$, and $L_g$; the top-gate to source and top-gate to drain capacitance $C_{gs}$ and Co; the capacitance and resistance between drain and source $C_{ds}$ and $R_{ds}$; and the resistance of dielectrics $R_i$ can be extracted from S-parameter measurement using the following microwave formulas:

$$\begin{bmatrix} Y_{11} & Y_{12} \\ Y_{21} & Y_{22} \end{bmatrix} = \begin{bmatrix} y_{11}+j\omega C_{pg} & y_{12} \\ y_{21} & y_{22}+j\omega C_{pd} \end{bmatrix}$$

$$y_{int\,rinsic} = [(Y_{DUT} - Y_{open})^{-1} + (Y_{short} - Y_{open})^{-1}]^{-1}$$

$$y_{11} = \frac{R_i\omega^2 C_{gs}^2}{1+R_i\omega^2 C_{gs}^2} + j\omega\left(\frac{C_{gs}}{1+R_i\omega^2 C_{gs}^2} + C_{gd}\right)$$

$$Im(y_{12}) = -\omega(C_{gd})$$

$$Im(y_{11}+y_{12}) \approx \omega(C_{gs})$$

$$Im(y_{22}+Y_{12}) \approx \omega(C_{ds})$$

$$g_m = g_{mo}\exp(-j\omega\tau)$$

$$Re(y_{21}) \approx \frac{g_{mo}}{\sqrt{1+(R_i 2\pi f C_{gs})^2}} \approx g_{mo}$$

$$Re(y_{11}) \approx R_i\omega^2 C_{gs}^2 \approx R_i(2\pi f)^2 C_{gs}^2$$

$$Real(y_{22}) \approx g_{ds}$$

$$Z_{12} - z_{12} = R_s + jwL_s$$

$$Z_{11} - z_{11} = R_s + R_g + jw(L_s + L_g)$$

$$Z_{22} - z_{22} = R_s + R_d + jw(L_s + L_d)$$

Here Y and y, and Z and z are respective parameters of the device before and after de-embedding process. These device parameters extracted from measured S-parameters can then be compared with the values determined from DC measurements or electrostatic simulations to determine the fidelity of the de-embedding process. Importantly, preliminary analysis based on graphene transistor shows that the device component values (including parasitic capacitance, gate capacitance and transconductance) derived from the RF measurements are consistent with those obtained from the DC measurements or electrostatic simulations, thereby validating the proposed de-embedding procedures.

$MoS_2$ RF Devices and Circuits:

With excellent ON-OFF current ratio, intrinsic gain, intrinsic cut-off frequency, power gain performance, as well as high extrinsic cut-off and maximum oscillation frequency on glass substrates, $MoS_2$ transistors can be used to construct digital and analog electronics in the gigahertz regime. Fabrication is made of an inverter circuit by connecting an enhancement-mode (E-mode) $MoS_2$ transistor with a resistor (formed by connecting a gate of a transistor directly to a source electrode). To reduce the parasitic capacitance for high-frequency measurement, the inverter circuit was fabricated on a glass substrate. An inverter circuit is a basic logic element that outputs a voltage representing the opposite logic level to its input. The quality of a logic inverter is often evaluated using its voltage transfer curve, which is a plot of input voltage versus output voltage. The slope of the transition region in the transfer curve specifies voltage gain. Importantly, a voltage gain of about 410 is achieved in the $MoS_2$-based inverter circuit. The achievement of a larger than unity gain demonstrates that the self-aligned $MoS_2$ devices can be used for the fabrication of integrated circuits for high-performance logic operations at room temperature.

Other $MoS_2$ transistor-based circuits typically operate within a few megahertz or even lower frequency regime. With excellent DC performance and reduced parasitic capacitance on quartz substrate, $MoS_2$ transistors created with transferred gate stack can be used to construct RF circuits up to the gigahertz frequency regime. For example, with input signal of about 200 MHz square wave applied to the input electrode of the $MoS_2$ inverter, an inverted signal with a relative voltage gain of about 2 (about 6 dB) can be obtained at an operating frequency of about 200 MHz without any noticeable delay. It is noted that the inverter performance does not exclude any parasitic capacitances or series resistance, which highly depend on an exact circuit design. An optimized circuit design, a thinner dielectric layer or a larger bias can further improve the high-frequency performance of $MoS_2$ based inverters.

With much higher voltage gain than graphene transistors, the $MoS_2$ transistors can also be used to construct RF amplifiers. The amplifier is obtained by integrating two transistors in series, where an upper one acts as a 'load' and a lower one acts as an active 'switch'. The gate of the 'switch' transistor acts as input, whereas the gate of the 'load' transistor is connected to the central lead and acts as the output. To enhance the performance of the amplifier, the power supply of the amplifier is set at about 6 V. A small sinusoidal signal VIN is superimposed on the DC bias $V_g$ via a bias-T. The output signal VOUT is connected to and monitored by an oscilloscope via a DC blocker. When an about 100 MHz sinusoidal wave with amplitude of about 100 mV peak-to-peak voltage applied on the input electrode, a sinusoidal wave with larger amplitude can be observed in the output signal. Comparing the output signal versus the input signal, a relative voltage gain of about 2 can be achieved. Furthermore, the amplifier exhibited a larger than unity gain (about 1.07) with an input of sinusoidal wave with a frequency of about 1 GHz, demonstrating that the amplifier can operate in the gigahertz regime with voltage gain, which is advantageous over graphene transistors with which the voltage gain is lacking due to the lack of current saturation. Measurements are performed from about 60 MHz to about 1.5 GHz and the relative voltage gain of the amplifier is determined versus the frequency. It is observed that the amplifier preserves the relative voltage gain of about 2 (about 6 dB) up to about 500 MHz, and retains a relative voltage gain of about 41 at about 1 GHz. With the further improved device performance from the vdW integrated 2DSC transistors, further evaluation can be made of such transistors for higher frequency RF circuits up to about 10 GHz or higher.

Flexible 2D RF Electronics:

$MoS_2$ can be used as a flexible semiconductor for large area electronic applications. Leveraging large scale CVD growth of 2DSCs and their heterostructures, device fabrication process described above can be applied to flexible substrates, for large-scale fabrication of high performance RF electronics on flexible substrates and creating a flexible form factor for applications such as light-weight wearable electronics.

Conclusion:

A van der Waals integration approach is proposed for creating high performance 2D transistors. By exploring van der Waals integration as a "low-energy" material integration approach, the proposed approach can provide substantially damage-free, atomically thin 2DSCs with ultra-narrow gate stack with reduced damage to a fragile 2D channel and self-aligned source and drain electrodes with optimized contact resistance. The device layout ensures that the edges of the source, drain, and gate electrodes are precisely and automatically positioned such that no overlapping or significant gaps exist between these electrodes. The fabrication approach allows integration of a top-gate electrode without introducing damage into 2D atomic lattice and thus retains the high electronic performance of 2DSCs, to provide 2D transistors with several significant advantages, including high driving current, transconductance and high frequency response. The proposed approach allows for scalable fabrication of ultra-high speed 2D transistors and functional circuits, and can pave a path for 2DSC-based high frequency circuits for various applications, including imaging technology, radar technology, and terahertz spectroscopy for chemical detection and military communications.

Example 4

Van Der Waals Integration Before and Beyond Two-Dimensional Materials

Overview:

The heterogeneous integration of dissimilar materials is a long pursuit of material science community and has provided the material foundation for modern electronics and optoelectronics. Comparative material integration strategy such as chemical epitaxial growth usually involves strong chemical bonds and is typically constrained to materials with strict structure matching and processing compatibility. Materials with substantially different lattice structures generally cannot be epitaxially grown together without generating too much interfacial defects that seriously alter/degrade their intrinsic properties. Alternatively, van der Waals (vdW) integration, in which pre-formed building blocks are physically assembled together through weak vdW interactions, provides a bond-free material integration approach beyond the traditional constraints of lattice matching or processing compatibility criteria, as demonstrated in two-dimensional (2D) vdW heterostructures. In this example, the fundamental concepts regarding the vdW interaction and vdW integration are presented, and developments of this emerging approach are presented. Generalization is made of the vdW integration strategy for seamless combination of distinct materials with radically different lattice structures, electronic properties, and physical dimensions beyond 2D materials to create diverse artificial heterostructures with atomically clean and electronically sharp interfaces. Also presented is the potential of such heterostructures to unlock physical constraints and provide devices with unprecedented performance or functions beyond the reach of other materials.

Introduction

Figure 17D:
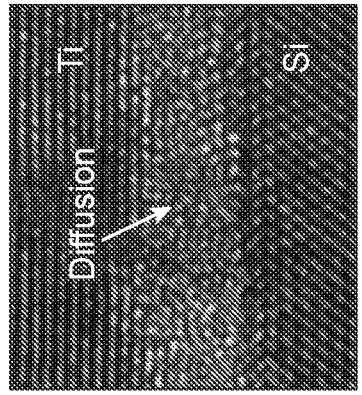
FIG. 17. Structural characteristics of comparative bonded heterostructure interfaces. a, Schematic illustrations of bonded heterostructure interfaces with lattice matched interface (upper) and lattice mismatched interface (lower). b, Cross-sectional image of lattice matched interface (STO/LSMO) grown using pulsed laser deposition (PLD), with low interfacial strain and one-on-one chemical bonds. c, Cross-sectional image of InAs/AlSb interface grown using molecular beam epitaxy (MBE), with clear interface strains and interface roughness. d, Cross-sectional image of III-Sb/Si interface grown using MBE. Misfit dislocations are observed owing to the lattice mismatch. e, Cross-sectional image of GaN(AlN)/AlN/Si superlattice grown by MBE. Threading dislocations are observed due to large lattice mismatch. f, Cross-sectional image of $HfO_2$/Si interface fabricated using ALD. Poor nucleation is observed on H-terminated silicon surface with discontinuous $HfO_2$ islands. g, Cross-sectional image of Ti/Si interface fabricated using high vacuum deposition, with a clear interfacial layer.
Figure 17G:
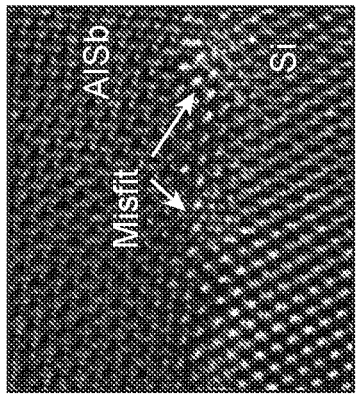
Figure 17C:
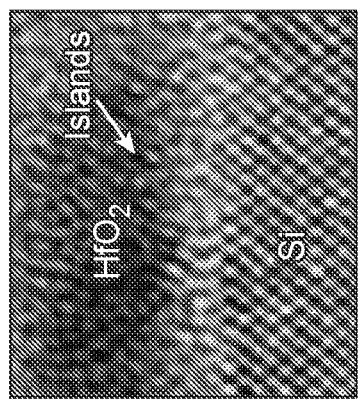
Figure 17F:
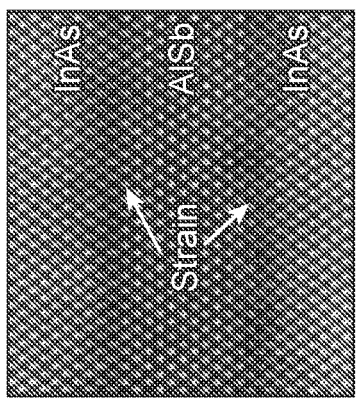
Figure 17B:
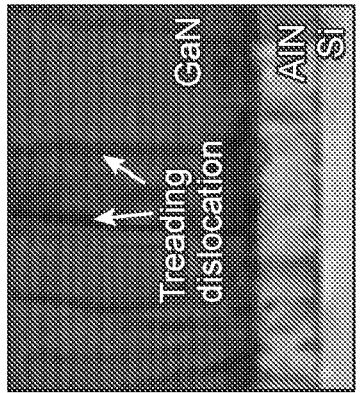
Figure 17E:
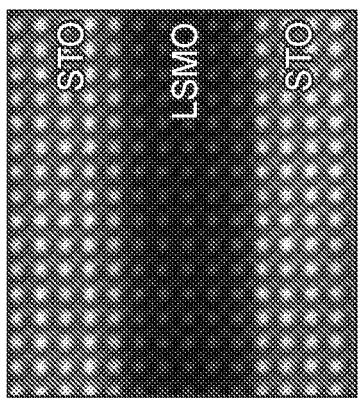
Figure 17A:
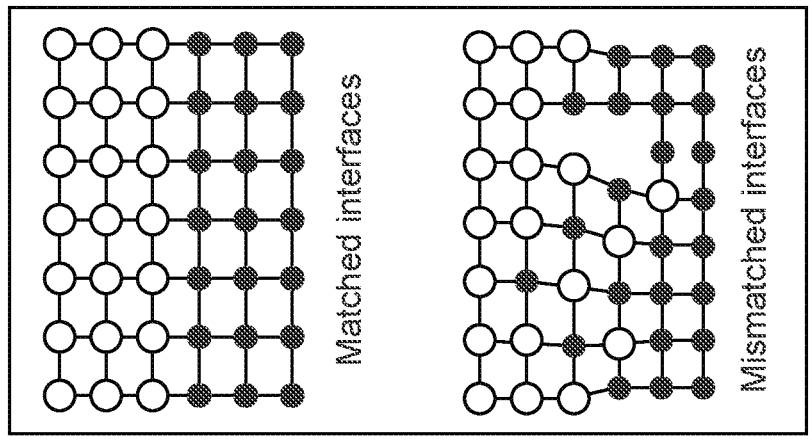

Semiconductor heterostructures and superlattices represent the material foundation for modern electronics and optoelectronics. Integrating dissimilar materials with pristine interfaces is desired for creating functional devices by design and is a long pursuit of material science community. The comparative strategy to hetero-material integration generally relies on chemical epitaxial growth (CEG) or physical vapor deposition (PVD). Chemical epitaxial growth, such as molecular beam epitaxy (MBE) and metal organic chemical vapor deposition (MOCVD), has provided the highest quality heterostructures for a wide range of state-of-the-art devices including high electron mobility transistors (HEMTs), light-emitting diodes (LEDs), and quantum cascade lasers (QCLs). However, such integration relies on one-to-one chemical bonds and is usually constrained to materials with highly similar lattice symmetry, lattice constants and thus similar electronic properties (FIG. 17a, b). Materials with substantially different lattice structures generally cannot be epitaxially grown together without generating too much interface disorders that could severely alter their intrinsic properties (FIG. 17a, lower panel). For example, MBE has strict constraints on the lattice constant or film thickness of the epitaxial layer, where the lattice mismatch f should typically be smaller than about 5% to prevent polycrystalline phase formation, and the epitaxial layer should be thinner than a critical thickness $d_c$ (e.g., about 10 nm for about 1% f) to prevent the formation of misfit dislocations. Even with these criteria met, the resulting interface is still plagued by strain in both lattices, as can be observed in a typical two-dimensional electron gas (2DEG) superlattice (FIG. 17c). For thicker epitaxial layers, slight mismatching normally leads to misfit dislocations at interface (FIG. 17d), which could propagate well beyond the interface and result in extensive threading dislocations when the mismatch increases (FIG. 17e). These constraints imposed by MBE are also valid for other chemical integration techniques such as MOCVD, or atomic layer deposition (ALD). For example, due to substantial lattice structure difference, high quality dielectric thin film cannot be readily integrated on top of crystalline semiconductor with pristine surface (e.g., silicon or graphene). The striking lattice differences often result in islands formation during the nucleation stage and prevent uniform thin film deposition (FIG. 17f).

On the other hand, physical vapor deposition, relying on high-energy vaporization of precursor materials, is more flexible on material types and lattice structures, and thus can be used for integrating highly disparate materials to create functional interfaces. However, the deposited materials are typically amorphous or polycrystalline and the resulting heterostructure interfaces are usually plagued by unavoidable deposition induced defects and rich chemical disorders that dictate the interface properties. For example, vacuum evaporation or sputtering are processes for depositing metal contacts on various semiconductors. Such high-energy integration processes involve continued bombardment of the contact region by high energy metal atoms, clusters and strong local heating, typically producing a disordered glassy layer at the metal/semiconductor interface (FIG. 17g) that leads to the Fermi level pinning (FLP) effect and uncontrollable Schottky barrier plaguing the semiconductor devices.

Figures 18A, 18B, 18D, 18E, 18F, 18G:
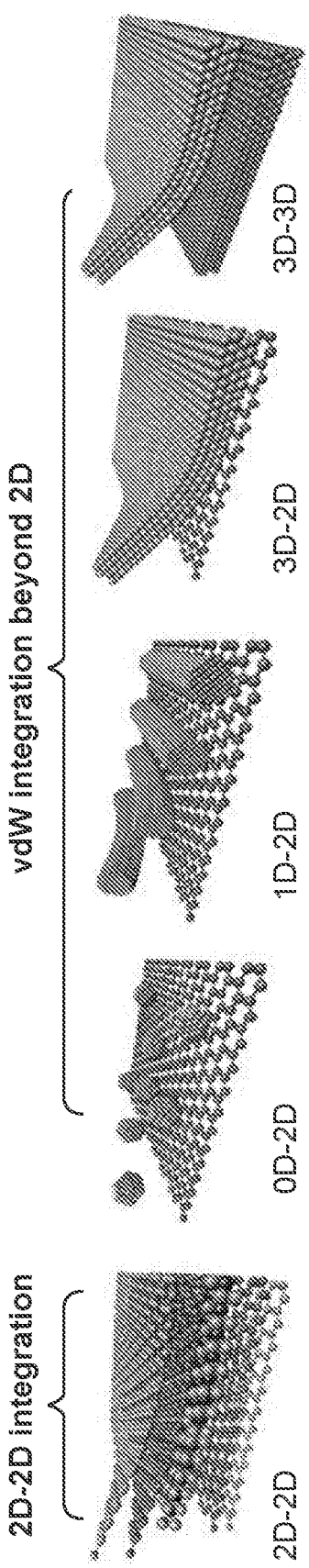
FIG. 18. Illustration and structural characteristics of van der Waals (vdW) integrated interfaces. a, b, Schematic illustrations of 2D/2D integration (a) and vdW integration beyond 2D materials (b). c, Schematic illustrations of the bonding-free atomic structure at vdW interface. d-g, Cross-sectional images of vdW contacted interfaces with various material dimensions, including $Bi_2Se_3$/FeTe (d), $Al_2O_3$/graphene (e), Au/$MoS_2$ (f), high order superlattice (phosphorene/CTAB molecular vdW system, g). These weakly interacted vdW interfaces feature atomically clean and electronically sharp interfaces.

Van Der Waals Integration:

Alternatively, van der Waals (vdW) integration, in which pre-formed building blocks are physically assembled together through weak vdW interactions, provides an alternative low-energy material integration approach. Such physical assembly method does not rely on one-to-one chemical bonds and does not involve direct chemical processing on materials, thus is not constrained to materials that have similar lattice structures or specify compatible synthetic conditions. It, therefore, is of considerable interest for integrating diverse two-dimensional (2D) atomic crystals with highly distinct lattice structures yet little chemical disorders at the interface (FIG. 18a). Although the vdW integration is explored in 2D materials, its applicability to other materials system (beyond 2D materials) as well as its prospects for scalable integration and practical applications are not fully appreciated.

Figure 18C:
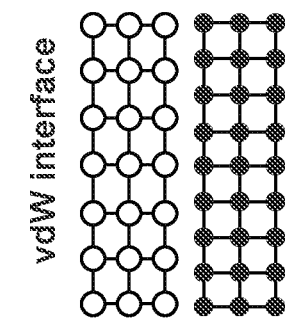

In principle, without the lattice match or processing compatibility criteria, such bond-free integration strategy is not constrained to a particular material dimension, and could be generally applicable for flexible integration of radically different materials with distinct crystal structures (e.g., crystallinity, lattice symmetry, or lattice constant), electronic properties (e.g., metals, semiconductors, insulators and superconductors), or material dimensions (e.g., 0D, 1D, 2D and 3D) (FIG. 18b). Without direct chemical bonding (FIG. 18c), the vdW integration can provide a series of artificial heterostructures and superlattices with atomically clean and electronically sharp interfaces between highly disparate materials, as demonstrated in various vdW interfaces (e.g., $Bi_2Te_3$/FeTe, graphene/$Al_2O_3$, $MoS_2$/Au, and phosphorene/cetyltrimethylammonium bromide (CTAB)) (FIG. 18d-h).

In this example, presentation starts with the fundamental concepts of vdW distance, vdW interaction, and vdW gap to generalize the criteria for vdW integration, and summarization is made of vdW building blocks. Next, vdW heterostructures with various material dimensions are highlighted, ranging from 1D/1D, 0D/2D, 1D/2D, 2D/2D to 2D/3D and 3D/3D, and then discussion is made of potential opportunities and challenges arising in these defect-free and pinning-free vdW interfaces. Together, the bond-free vdW integration is highlighted as a general low-energy integration approach (as opposed to comparative high-energy chemical integration) that can impart unparalleled freedom to integrate distinct materials beyond the constraints of comparative material integration approaches, opening opportunities for fundamental studies and allowing unprecedented device functions or performance.

Bonded Versus vdW Gapped:

The vdW interaction, named after Dutch scientist Johannes Diderik van der Waals, generally includes three different types of inter-molecular interactions: dipole-dipole interaction (Keesom force), dipole-induced dipole interaction (Debye force), and instantaneous induced dipole interaction (London force) (FIG. 19a). The vdW interaction has been modeled and approximated using Lennard-Jones potential, with a lowest potential at an equilibrium center-to-center distance between two vdW interacted atoms or molecules (e.g., about 0.38 nm for argon dimer) (FIG. 19b), which is referred to as the vdW distance ($d_{vdW}$) (FIG. 19c).

The vdW interaction strength is typically on the order of about 0.1 to about 10 kJ/mol, about 2-3 orders of magnitude smaller than that of ionic or covalent bonds (about 100 to about 1000 kJ/mol). Although being the weakest interaction, the vdW force (>about $10^{-12}$ N/bond or >10 N/cm$^2$) between an intimately contacted interface are much larger than gravity force of typical integrated structures, and are strong enough to hold bulk materials (about 1-10 N/cm$^2$ for 1-meter thick material) together from gravitational movement or falling apart. Nonetheless, due to finite surface roughness, most interfaces between two rigid 3D bulk materials don't exhibit intimate contacts to reach vdW distance and fully activate the vdW interaction. Therefore, low-dimensional materials or thin films are usually more compliant to ensure intimate contact to activate the vdW interaction, and thus are more applicable for the vdW integration.

The vdW gap is explained as different from 2D layer thickness or 2D layer-to-layer distance. To ensure the consistency, here the vdW gap is specified as the difference between the vdW distance and covalent radii (as labeled in FIG. 19c,d). Hence, the vdW gap (gvdW) can be approximated using equation:

$$g_{vdW} \sim d_{vdW} - r_{(a)} - r_{(b)} \qquad (1)$$

where $r_{(a)}$ and $r_{(b)}$ are the covalent radius of individual atoms, and $d_{vdW}$ is the vdW distance. Using this equation, the $g_{vdW}$ value of argon dimers can be calculated as about 0.23 nm. From this point of view, the vdW gap in layered materials is much smaller than their layer-to-layer spacing. As shown in FIG. 19d, the interlayer spacing of graphite is about 0.34 nm and the calculated $g_{vdW}$ is about 0.2 nm using equation 1. For other layered materials with rather different interlayer spacings ranging from about 0.3 nm to about 0.8 nm (FIG. 19e), the calculated $g_{vdW}$ exhibits a rather similar value of about 0.2 nm, comparable to that of argon dimer or graphite layers. Additionally, the $g_{vdW}$ between artificially assembled vdW interfaces (e.g., Au/MoS$_2$, BN/graphene, WSe$_2$/Bi$_2$Se$_3$) is also about 0.2 nm.

Van Der Waals Devices Before and Beyond 2D:

Efforts of vdW integration include various synthetic nanostructures being integrated into functional devices using physical assembly approaches (such as drop-casting, rubbing, or stamping), which has allowed the blossom of nanoscale electronic and optoelectronic devices assembled from carbon nanotubes or semiconducting nanowires. These efforts show the opportunities of vdW integration in breaking the constraint of comparative approaches relying on strong chemical bonds and to seamlessly combine highly disparate materials that are otherwise incompatible (e.g., GaN, CdS, or CdSe on Si) and hence allow vdW devices with unprecedented functions or performance.

With the isolation of graphene and expansion into diverse 2D atomic crystals with dangling-bond free surface, the vdW integration allows for creating a wide range of heterostructures with atomically clean and electronically sharp interfaces (FIG. 20).

2D/2D vdW heterostructures with atomically clean, electronically sharp interfaces provide a system for fundamental studies and electronic device demonstrations. For example, by encapsulating graphene in a BN/graphene/BN vdW heterostructure, ultra-high carrier mobility of about 140,000 and up to about 1,000,000 cm$^2$ V$^{-1}$s$^{-1}$ can be achieved at room temperature and cryogenic temperature, respectively. Similar vdW structure can be created by vdW integrating 2D semiconducting channel, 2D insulating dielectric, and 2D metallic contacts (FIG. 20a), allowing the realization of quantum oscillation and the highest carrier mobility in various 2D semiconductors. Besides a planar structure, another development in 2D vdW devices is the demonstration of vertical transistors by sandwiching 2D insulator or semiconductor channel between graphene electrodes, allowing a switchable vertical transport mechanism based on tunable tunneling or thermionic barrier. Similarly, vertical graphene/MoS$_2$ junctions allow gate-tunable photodiodes, and MoS$_2$/BN quantum well structure is used to create LEDs.

Besides high performance devices, vdW heterostructures also provide a platform for fundamental studies. For example, vdW assembled hetero-bilayers host electrically tunable interlayer excitons with electrons and holes localized in different layers, inheriting valley-contrasting physics from their monolayers but with much longer exciton lifetime. VdW heterostructures of 2D magnetic materials allow probing the intrinsic 2D magnetism (e.g., CrI$_3$) and realizing giant tunneling magnetoresistance endowed by the multiple spin filtering effect. In addition, the discovery of 2D magnetic materials could provide vdW magnetic heterostructures through proximity effect, which can be strong in 2D materials for exploring a variety of phenomena and functionalities. Beyond the chemical composition of constituent layers, the twist angles between different layers in the 2D vdW heterostructures provide another degree of freedom to tailor their electronic properties for exotic physics, as highlighted by the observation of correlated insulator behavior and superconductivity in magic angled bi-layer graphene heterostructures.

Beyond 2D materials, the vdW integration of 2D atomic layers with other dimensional material components such as 0D, 1D or 3D bulk materials is desired for integrating 2D materials into functional devices. PVD integration can usually damage underlying monolayer atomic lattices and degrade their electronic properties; hence, the development of damage-free vdW integration approach is desired for capturing the intrinsic merits of 2D materials in functional devices. For example, damage-free vdW integration of 0D plasmonic nanostructures (Au) or quantum dots (PbS) on graphene provides graphene photodetectors with greatly enhanced photocurrent (FIG. 20c). VdW integration of 1.5D (referred to nanoribbon) Al$_2$O$_3$ on graphene opens a bond-free, damage-free dielectric integration pathway to high mobility top-gated graphene transistors (FIG. 20d). Similar approaches are also used to integrate nanowire gates with graphene nanoribbons to ensure high performance graphene nanoribbon transistors. Furthermore, vdW integrating metal/oxide core-shell nanowire or 1D metal/oxide gate stack provides a self-aligned ultrashort channel length without damaging the underlying 2D semiconductors (FIG. 20e), allowing the fastest transistors from graphene and MoS$_2$ with an intrinsic cut-off frequency of about 420 GHz and about 42 GHz, respectively. In particular, the physical assembly of the lithographically specified gate arrays on large area 2D atomic layers opens a pathway to scalable vdW integration. Beyond the low-dimensional nanostructures, molecules or ions can be chemically absorbed onto 2D materials to form self-assembled monolayer (SAM) and 2D/SAM vdW heterostructures, or intercalated into the layered crystals or 2D/2D vdW heterostructures, generating high order bond-free vdW superlattices between radically different constituents with highly tunable interlayer distances and tailored electronic properties (FIG. 20f).

The vdW integrated devices can also be extended to 3D materials. This approach combines the merits of atomically sharp interfaces in vdW integration, and the 3D system with rich material choices and designable properties. One example is the creation of a tunneling transistor with ultra-low sub-threshold swing from 2D/3D MoS$_2$/Ge vdW heterostructure (FIG. 20g). The vdW integration of 2D MoS$_2$ provides an electronically abrupt junction that is desired for efficient electron tunneling (not readily achievable within ion implanted heterostructures), and the use of 3D germanium provides well-controlled doping density and desired electron affinity (difficult to achieve using 2D semiconductors) to maximize the ON-state current, while retaining low OFF-state current and small sub-threshold swing. Another example is the demonstration of vdW integrated metal/semiconductor junctions (3D/2D) with highly tunable barrier height approaching Schottky-Mott limit. The use of dangling bonds-free 2D semiconductor is desired for avoiding Schottky-Taam surface states (not readily achievable in covalent bonded 3D semiconductors), and the use of 3D metal provides rich material options with proper work functions for designed band alignments (not yet available in 2D metals). In optoelectronics, various devices are also demonstrated by vdW integrating 2D graphene with 3D Si waveguide, SiN$_x$ ring resonator, or optical fiber, allowing the realization of gate tunable optical modulator, frequency combs and Q-switched laser, respectively. Besides electron transport and electron-photon interaction, strong electron-phonon coupling in 2D/3D vdW structure can also provide a rich system for exploring physics and devices, such as strong Raman scattering (WSe$_2$/SiO$_2$) and high Tc superconductivity (FeSe/STO).

3D/3D vdW heterostructures can also be created to provide desirable attributes. For example, 3D metal thin films can be vdW integrated onto 3D semiconductors as contact electrodes with low interfacial disorder, greatly reducing the interface states and pinning effects in typical metal/semiconductor junctions, allowing highly tunable Schottky barrier largely dictated by the metal work function. This low-energy metal integration is desired for delicate materials such as perovskites to form 3D/3D vdW metal/semiconductor contacts (FIG. 20h), where the contact area of perovskite could be seriously damaged by high-energy metal deposition process. Preliminary analysis shows that vdW metal/perovskite contact features a damage-free and atomically clean interface, allowing much more efficient charge transport and achievement of the highest optical gain over $10^9$.

Integration by Design:

The vdW integration and vdW heterostructures provide many opportunities. By further extending vdW integration to include 3D materials and other low-dimensional materials, a much broader range of material components can be isolated, mixed, matched and combined to create highly engineered heterostructures and provide a class of electronic, optoelectronic, or magnetic devices with unprecedented performance or functions beyond the reach of other materials. Here discussion is made of some opportunities arising from the vdW integrated heterostructures.

vdW Metal/Semiconductor Junction with Designed Barrier Height.

In vdW MS junctions, a metal thin film is pre-fabricated and physically laminated onto a semiconductor surface with little integration induced damage and minimized FLP effect, thus ensuring a highly tunable barrier height by design. Therefore, Ohmic contacts to various 2D semiconductors may be realized by vdW integrating specific metals with proper work function matching the respective semiconductor band edges. In this way, the majority carrier type can be tailored from electrons to holes by tuning work function of the contact metals, and complementary metal-oxide-semiconductor (CMOS) circuits can be created with the same 2D channel material by integrating metals with work function matching the conduction or valence band position. CMOS integration using a single 2D semiconductor is a challenge in 2D device community since there is little physical space for impurity dopants in these atomically thin semiconductors.

The vdW metal integration can also be extended for improving the contacts to various 3D semiconductors; however, the effect may not be as straightforward as 2D semiconductors. Typical 3D semiconductors could suffer from surface dangling bonds due to the crystal lattice termination at the surface, leading to unavoidable interface states. Specifically, for covalent semiconductor (e.g., Si and GaAs) with little electronegativity difference, dangling bonds result in a large number of gap states, serving as a reservoir for carriers to pin the Fermi level. Under this case, the vdW integration may show finite improvement, but could still be observable once the surface dangling bonds are passivated (e.g., H-terminated). On the other hand, for covalent semiconductors with stronger electronegativity difference (e.g., SiC and GaN) or ionic semiconductors, reduced FLP with improved contact behavior can be achieved. This can be particularly useful for large bandgap III-V semiconductor (e.g., GaN) where the optimized p-type contact is difficult to achieve using a doping approach.

Besides enhancing carrier transport efficiency, the vdW integrated MS junctions could also benefit devices specifying high Schottky barrier to hinder charge transport. For example, in metal-semiconductor field-effect transistor (MESFET), the MS Schottky barrier is used as the gate to modulate carrier concentration inside the channel. In this case, a large Schottky barrier is desired for the gate to ensure smaller gate leakage and larger gate voltage operation range, but can be difficult to realize using deposited MS junction due to FLP effect. With the ability to create vdW MS junctions with tunable barrier height, optimized Ohmic contacts and Schottky gate can be achieved at the same time, by integrating metals with work functions matching either band edges (small barrier for contacts) or forbidden gap middle (large barrier for gate) (FIG. 21a). Furthermore, designable Schottky barriers at the vdW MS interfaces can also provide devices such as hot electron photodetectors with tunable and designable detection edge or multi-level memory cells.

Pinning Free Interface for Coherent Charge Injection in Quantum Electronic Devices.

Coherent charge injection is desired for various quantum electronic devices that specify phase coherence, but is often plagued by interface scattering due to structural disorder at the electrode interfaces. For example, in magnetoresistance and spintronic devices based on polarized carrier transport across various heterostructure interfaces such as ferromagnetic/conductor/ferromagnetic (giant magnetoresistance), ferromagnetic/insulator/ferromagnetic (tunnel magnetoresistance), or ferromagnetic/semiconductor/ferromagnetic (spin transistor), the spin injection efficiency is dictated by the interface quality and largely suppressed by interfacial roughness, impurities and other types of interface disorders. For instance, in deposited Fe/Si magnetic junction, high energy Fe atoms (during vacuum deposition) tend to diffuse into Si lattice and lead to randomly oriented local magnetic moment, severely scattering the injected spin polarized electrons and degrading overall spin polarization. In contrast, within vdW magnetic junctions, the interface states and the atom inter-diffusion induced scattering effects can be reduced by physically integrating various functional components (ferromagnetic metal, insulator, semiconductor) with atomically clean and magnetically sharp interfaces, allowing efficient coherent spin injection (FIG. 21b). Beyond the magnetic junctions, the vdW integration approach can also be extended for creating other functional junctions that are previously plagued by interface disorder. Possible directions include vdW superconductor/semiconductor junctions, Josephson tunneling junctions (FIG. 21c), and metal/insulator tunneling junctions.

Heterogeneous Layer Assembling by Design.

One of the most attracting attributes of the vdW integration is the freedom in 'assembling-by-design'. An example for such vdW integration, therefore, are stacks of III-V based devices that cannot be readily grown (through MBE or MOCVD). For instance, wide bandgap GaN based heterojunction bipolar transistor (HBT) is important for high-frequency, high-power amplification, but the overall performance is severely constrained by the low conductivity of MOCVD grown p-type GaN base region. Using the vdW layer-by-layer integration, an approach can be taken to replace the poor p-GaN layer with another material of improved p-type conductivity (e.g., p-type WSe$_2$ or p-type Si), leading to heterogeneous n-GaN/p-WSe$_2$/n-GaN structure (FIG. 21d). Similarly, vdW stacking can also play an important role in organic polymer stacks that typically share similar material solubilities and are difficult to be integrated without dissolving others, or amorphous oxide stacks that share similar etchants and are constrained by the lack of selective etching process. Possible applications include vdW vertical memory, vdW tandem photovoltaics (PV), vdW OLED (organic LED), bipolar OFET (organic FET) and organic CMOS circuits.

vdW Sliding Interface.

Flexibility and stretchability are important features for wearable electronic devices, but are difficult to achieve in typical silicon or III-V wafers. Approaches to this challenge include two conceptually different ways. One relies on the use of structures (such as wavy silicon membrane), and the other relies on materials that are intrinsically flexible (organic polymer). Although these approaches have improved the flexibility of individual building blocks, interface strain in heterostructures that could dictate the overall device flexibility are largely overlooked. When a chemical bonded heterostructure is stretched, large internal strains are usually built up at the interface between two dissimilar materials (e.g., semiconductor/dielectric, semiconductor/metal) that typically have distinct Young's moduli, where the failure often occurs first. In contrast, within vdW integrated devices, the constituent components with distinct mechanical properties can slide over each other when compressed or stretched (FIG. 21e), while retaining clean and sharp vdW interfaces with optimized charge transport. Such sliding junction can effectively release the local strain at the interface, and therefore overcome the fundamental mechanical mismatch in the functional systems. Other sliding related effects, such as triboelectric effect and frictional heat generation, also can be exploited in functional devices.

Plug-and-Probe the Intrinsic Material Properties.

The vdW integration can also be extended to integrate multiple functional components through a 'one-stage' assembly process without additional lithography. For example, all main components of a typical metal-oxide semiconductor field-effect transistor (MOSFET) (gate metal, dielectric insulator, contact metal, encapsulation polymer, as shown in FIG. 21f, g) can be pre-fabricated in large scale, and directly laminated on a target semiconductor surface. Besides allowing optimized contact and dielectric interfaces, this vdW integration provides an effective 'plug-and-probe' approach for investigating intrinsic material properties. The top gate and contact structures can be integrated on the target material without any fabrication stages or exposure to any solvent, and more importantly, the entire pre-fabricated structures can be integrated within a few seconds at room temperature, which would be desirable for many unstable materials (such as silicene or germanene) that degrade with time or fabrication stages. Besides these exotic 2D materials, other 2D materials (e.g., graphene, transition metal dichalcogenides) also can be exploited through this 'plug-and-probe' approach. Preliminary analysis demonstrates the effective field-effect mobility of CVD grown monolayer $WSe_2$ can be significantly improved (with a value up to about 200 $cm^2V^{-1}s^{-1}$) by immediately 'plugging-and-probing', indicating the performance of other 2D materials may be largely underestimated due to unnoticed time-related or fabrication-related degradations.

Beyond 2D materials, this low temperature, solvent-free, low-energy integration strategy can be useful for other delicate materials including molecular monolayers, organic thin films or crystals, and metal halide perovskite materials. Such materials are usually not stable under high temperature, not compatible with traditional micro-fabrication processes (e.g., soluble in various solvents), or highly prone to metal-deposition induced degradation. Importantly, the 'plug-and-probe' approach provides a lithography-free, solvent-free and damage-free pathway to rapid device prototype from these delicate materials, which is desired for investigating their intrinsic properties and pushing the performance of various devices (OFET, OLED, OPV; or perovskite FET, PV and LED) usually plagued by fabrication induced degradations.

Another advantage of the 'plug-and-probe' approach is its energy and cost efficiency. In comparative micro/nano-electronics, each device fabrication involves time-consuming, expensive lithography and vacuum deposition process that may not be readily accessible. Furthermore, precious metals (e.g., Au and Pt) have to be deposited uniformly across the meter-scale vacuum chamber, even when there are typically just a few micrometer-scale devices being fabricated each time. In contrast, using the 'plug-and-probe' approach, a large array of standard device structures could be batch processed on the wafer scale using lithography with high throughput. When specified for each sample, a small area of the device structures is isolated from the wafer (FIG. 21f, g) and laminated onto a target material as a tattoo tape with greatly reduced time and cost. This is especially desired for structures involving more sophisticated processes such as extreme ultraviolet (EUV) photolithography processed ultra-short gate, ultra-thin dielectric, or specialized structure (e.g., optical metamaterial, T-gate). These complex pre-fabricated wafers can be products for 'plug-and-probe' implementation and standardization, which may further lower the entry barrier, greatly accelerate device prototype process from materials and stimulate opportunities in nanoelectronic and nanophotonic research field.

Outlook:

Demonstrations of vdW integration of large array of lithographically specified microstructures of 3D materials can alter the landscape and provide an outlet, by combining the advantages of the vdW integration (e.g., atomically clean and electronically sharp interfaces), with scalable and reliable 3D materials and established fabrication techniques. For example, the vdW integrated 3D metal/$MoS_2$ interface provides a nearly ideal pinning-free metal-semiconductor interface that is difficult to achieve with comparative fabrication approaches, allowing the experimental validation of Schottky-Mott limit predicted many decades ago. The creation of such high performance devices with the vdW integration approach highlights the robustness of this approach and its merits for creating pristine interfaces not otherwise readily accessible.

The vdW integration can be further extended for scalable system level integration. Various active or passive device layers can be assembled by repeatedly laminating pre-fabricated vdW building blocks (e.g., semiconductor, gate dielectric, contacts) or pre-assembled device layers (e.g., CMOS circuit, flash memory, photodiode cell) using a layer-by-layer stacking process (FIG. 22). Each active device layer can be separated by a planarization passive layer, and may be further connected with each other using VIA (vertical interconnect access) holes. Within this heterogeneous stacking geometry, functional layers are vdW interacted without the constrains set by lattice matching or process compatibility, thus can allow 3D electronic integration with much reduced process cost and device footprint. Hence, such combination of vdW integration with mature and reliable 3D devices or systems is advantageous.

Consideration should be made for pushing the performance of individual devices, and also for improving the integration yield, processability, stability and scalability. Although the ability to physically assemble individual building blocks into vdW heterostructure has opened vast flexibility for heterogeneous material integration and considerably accelerated both fundamental studies and proof-of-concept demonstrations, consideration should be made for scalable vdW integration of heterostructure device arrays with high yield and high throughput. For example, the state-of-the-art vdW stacking process largely relies on a manual alignment-transfer technique using a soft stamp (e.g., PDMS or PMMA), which typically has a large mechanical expansion coefficient and can constrain the alignment resolution in large-scale integration. Additionally, for various vdW interfaces, consideration should be made regarding the size, uniformity, wrinkles, surface contaminations, and the interfacial air bubbles, which can constrain device yield. These considerations can be made in terms of synthesis and fabrication of vdW building blocks with high uniformity, atomic flatness and elaborated structure design, and in the development of automatic stamping machine with proper mechanical design, which can reduce defects, improve the integration yield and achieve better alignment resolution over large scale.

Another consideration is the reliability and stability of the weakly bonded vdW heterostructures. As noted above, the vdW interactions between two fully contacted surface are strong enough to hold bulk materials together from gravitational movement or falling apart. Therefore, the instability or delamination of two vdW interacted interface is unlikely unless there is strong enough external force or interfacial strain. On a related matter, thermal expansion and contraction of the individual vdW building blocks should be considered, since mismatched thermal properties can lead to interfacial strain and interfacial sliding when temperature changes. In this regard, the mild vdW integration process is advantageous since it normally does not involve large temperature swing typically inevitable in comparative integration process. However, such thermal effect should still be considered during device operation, and strain releasing structures or heat dissipation layer can be integrated to prevent accumulated strain in large area integration. Despite these and other considerations, the bond-free vdW integration opens a dimension for material integration with unparalleled freedom to integrate materials that cannot be otherwise readily combined, opening up possibilities to approach physical constraints otherwise inaccessible and provide devices with unprecedented performance or functions beyond the reach of other materials and systems.

VdW Building Blocks:

A variety of materials can function as the building blocks for vdW integration (FIG. 23). Although the exact integration methods may vary, they share similar integration process with three stages: (1) pre-fabrication of the vdW building blocks, (2) isolation from the sacrificial substrate, and (3) physical assembly (or lamination) on the target material.

Molecules, 0D, 1D Materials.

Molecules, 0D and 1D materials are generally produced from bottom-up chemical synthesis as freestanding objects in solution or with low bonding forces towards a growth substrate. They can function as the vdW building blocks and be directly integrated on the target material using surface adsorption, dip-coating, drop-casting or physical rubbing processes. Scalable integration may also be achieved by assembling these nanostructures (using fluid, electrical or magnetic field guided) directly on the target material, or first created on a sacrificial substrate using advanced lithography and then transferred onto the target material.

2D Materials.

For various 2D layered materials (e.g., graphite and $MoS_2$), they can be directed integrated on target material using top-down methods such as rubbing or mechanical exfoliation. On the other hand, 2D building blocks and more complicated heterostructures can be synthesized using various bottom-up approaches (such as CVD) on a sacrificial substrate, and then isolated using mechanical-peel (dry transfer), solution-assisted peeling, metal-assisted transfer, or etching process (wet transfer), and then laminated onto the target material. Large-scale 2D vdW thin films are also achieved through solution assembly of colloidal 2D nanosheets, featuring broad-area dangling-bond free 2D/2D contacts (between nanosheets) with few interfacial trapping states.

3D Materials.

A consideration for vdW integration of 3D materials is their rigidity and relatively large surface roughness, leading to partially-contacted interface that is undesirable for stable vdW integration and charge transport. For 3D metals pre-deposited using PVD or 3D polymer pre-fabricated using solution coating, they typically demonstrate weak bonding with the substrate, and can be mechanically isolated using similar 'peeling' method as 2D building blocks. The back surface of these 3D materials replicates that of the sacrificial substrate and can be atomically flat for effective vdW integration. However, the top surface of PVD metals typically exhibits nanometer scale roughness, and may not be readily applicable for vdW integration.

For 3D semiconductors pre-fabricated through chemical approaches (MOCVD, MBE) with strong interface bonds, selective etching of the sacrificial layer is performed for their isolation. For example, single crystal silicon with smooth surface can be isolated from silicon on insulator (SOI) structure. For high quality III-V semiconductors, pre-patterning process (into stripes, FIG. 23) can aid in reducing etching time with improved surface flatness and mechanical flexibility, where the isolation and integration of InAs (from AlSb), GaAs (from AlAs), and GaN (from AlN) are demonstrated.

Example 5

Figure 24:
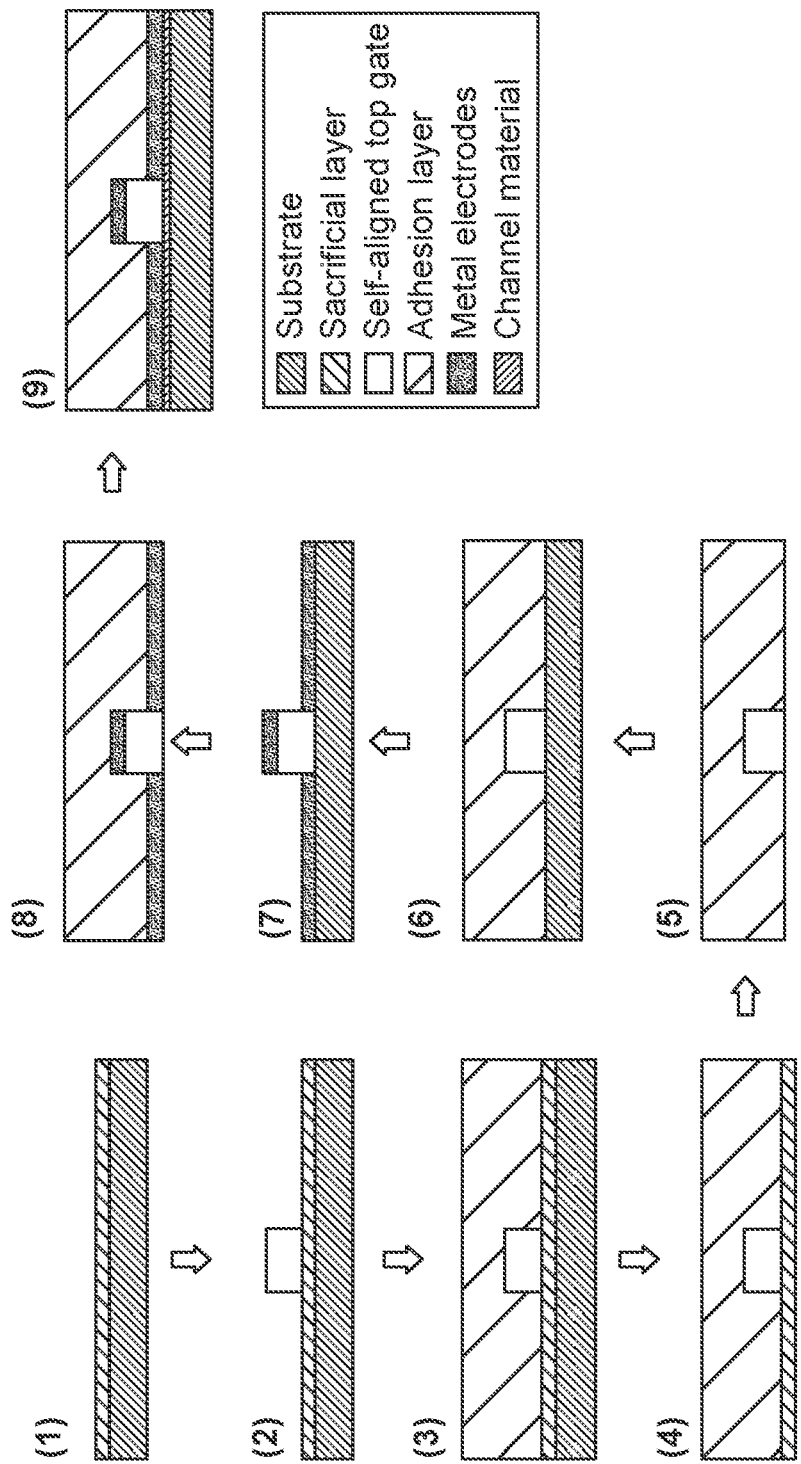
FIG. 24. Schematic of process stages of fabricating an electronic device.

Scalable Van Der Waals Integration and Transfer Lamination Fabrication of Transistors, Diodes and Solar Cell Devices Two-dimensional (2D) materials attract tremendous attention for electronic applications due to their excellent intrinsic properties, such as atomically-thin bodies, relatively high mobility and so on. However, fabrication of electronic devices without damaging its intrinsic properties during the process has remained a challenge. Here, this example sets for the design of a 'transfer process' to fabricate electronic devices. The general process flow is shown in FIG. 24: (1) Fabricate sacrificial layer (e.g., BN, Ag/Au and so on) on atomically smooth substrate using evaporation technique (e.g., electron-beam evaporation, sputtering, thermal evaporation and so on). It should be noted that the sacrificial layer should have weak interaction force with the substrate. (2) Fabricate self-aligned top gate dielectric on sacrificial layer using lithography technique (e.g., photolithography and electron-beam lithography). (3) Coating adhesion layer (e.g., polymer) on top. (4) Peel off the entire structure from the sacrificial substrate. (5) Remove the sacrificial layer. (6)

Transfer the top gate dielectric with adhesion layer on another sacrificial substrate. (7) Pattern (e.g., photolithography and electron-beam lithography) and deposit the source, drain and gate electrodes. It should be noted that the electrodes should have weak interaction force with the substrate. (8) Repeat (3)-(4) to peel off the whole structure. (9) Laminate the whole structure on a channel material.

Figure 25:
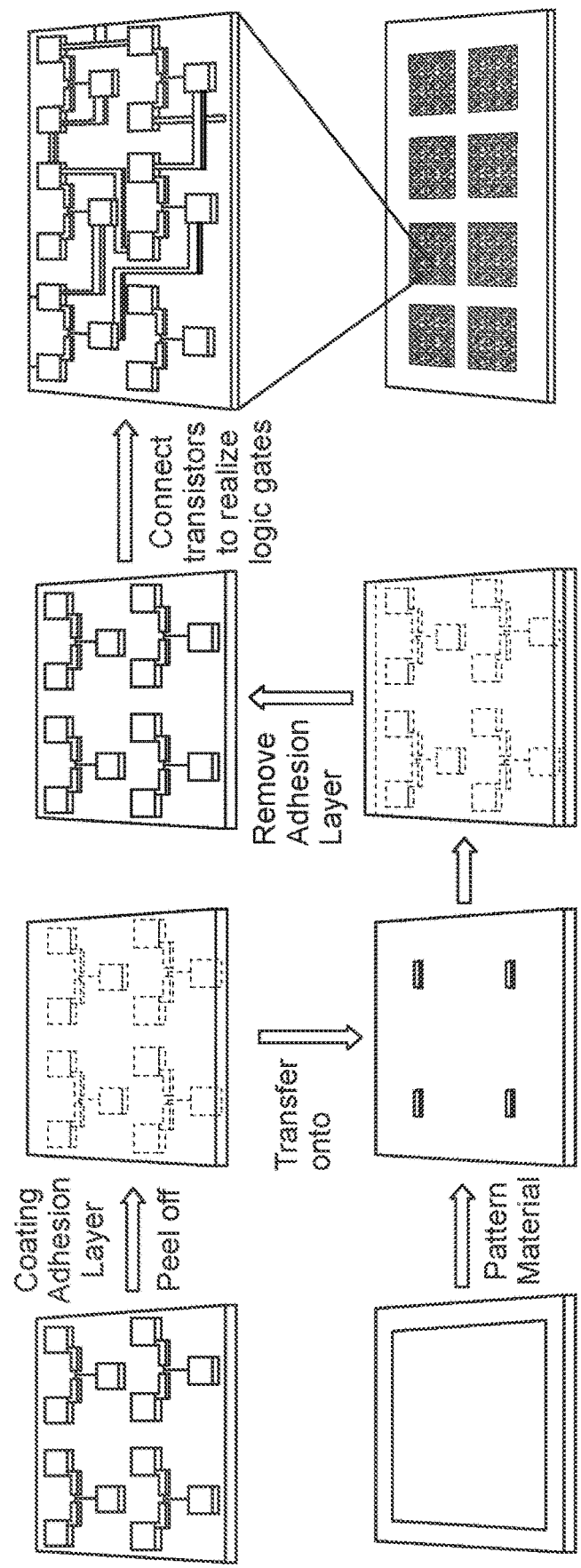
FIG. 25. Schematic of process stages of fabricating an integrated circuit.
Figure 26:
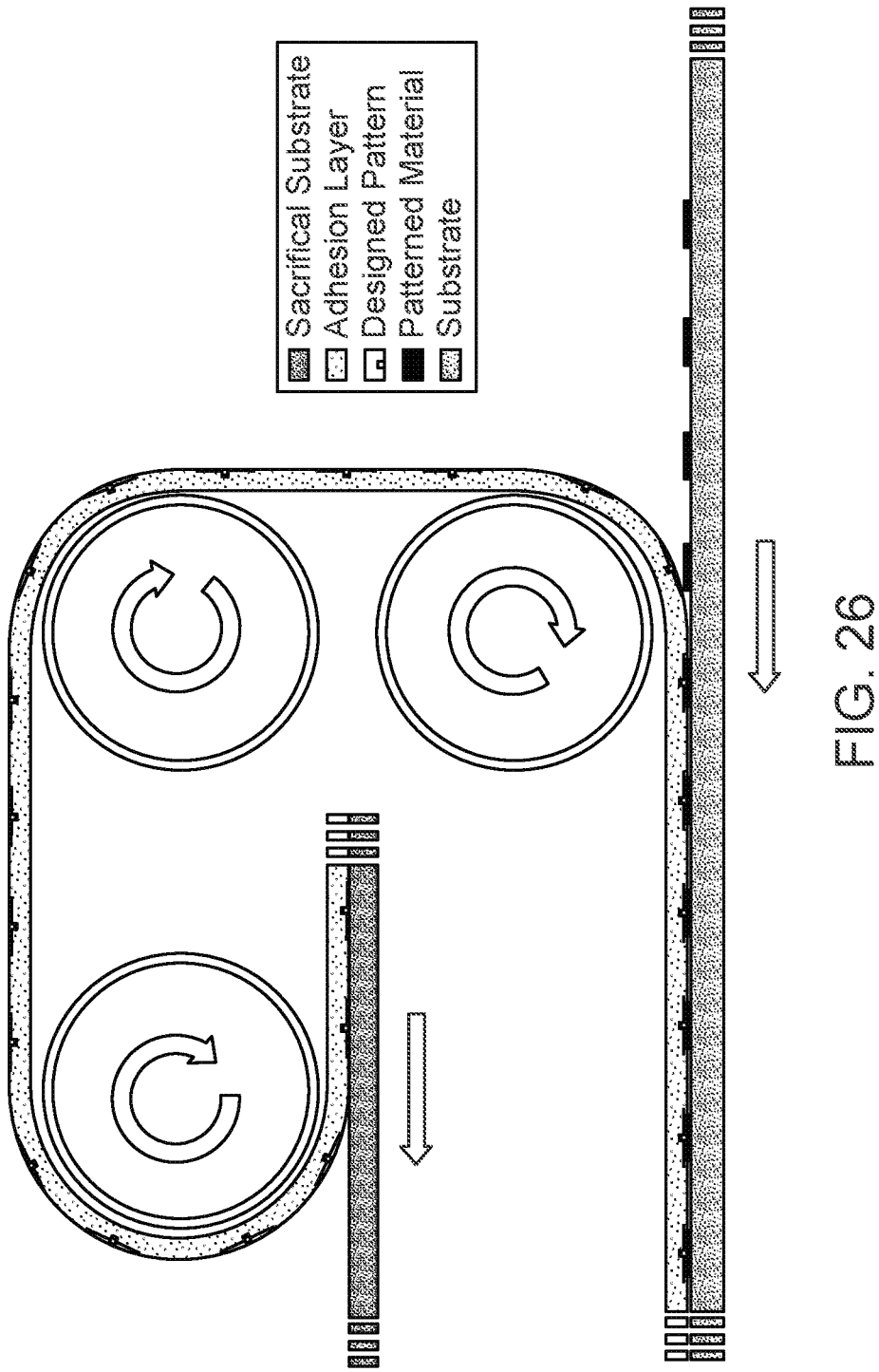
FIG. 26. Schematic of a transfer assembly line realized using a roll-to-roll method.

In addition to single device applications, this 'transfer' method can be extended to integrated circuits application as well. As shown in FIG. 25, similar to the single device fabrication, multiple pre-designed transistors can be connected in a specific sequence to realize target logic functions. Different from the single device application, a particular attention should be paid on pre-patterning a channel material. Then, the prepared circuits are transferred to these prepared samples with appropriate alignments. Furthermore, such methods can be designed in a scalable way, that is, a roll-to-roll method. As shown in FIG. 26, a transfer assembly line can be realized using a roll-to-roll method.

Beyond transistor devices, a transfer printing approach can also be used for large scale (e.g., roll-to-roll fabrication) of contact electrodes for transport barriers for electrons and holes for various thin film semiconductors, including conducting polymers, organic semiconductors, and various perovskite materials. This can be desirable for electronic devices, including transistors, circuits, or optoelectronic devices, including photovoltaic devices and light emitting devices.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to $\pm 10\%$ of that numerical value, such as less than or equal to $\pm 5\%$, less than or equal to $\pm 4\%$, less than or equal to $\pm 3\%$, less than or equal to $\pm 2\%$, less than or equal to $\pm 1\%$, less than or equal to $\pm 0.5\%$, less than or equal to $\pm 0.1\%$, or less than or equal to $\pm 0.05\%$. For example, a first numerical value can be "substantially" or "about" the same as a second numerical value if the first numerical value is within a range of variation of less than or equal to $\pm 10\%$ of the second numerical value, such as less than or equal to $\pm 5\%$, less than or equal to $\pm 4\%$, less than or equal to $\pm 3\%$, less than or equal to $\pm 2\%$, less than or equal to $\pm 1\%$, less than or equal to $\pm 0.5\%$, less than or equal to $\pm 0.1\%$, or less than or equal to $\pm 0.05\%$.

In the description of some embodiments, an object provided "on," "over," "on top of" or "below" another object can encompass cases where the former object is directly adjoining (e.g., in physical or direct contact with) the latter object, as well as cases where one or more intervening objects are located between the former object and the latter object.

Additionally, concentrations, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. An electronic or optoelectronic device comprising:
a layer of a first material; and
a layer of a second material disposed on the layer of the first material, wherein the first material is different from the second material, and the layer of the first material is spaced from the layer of the second material by a gap, wherein the gap is a non-covalent bonding gap, and wherein the gap has a non-zero thickness of 0.05 nm or more.

2. The device of claim 1, wherein the layer of the first material has a first surface, and the layer of the second material has a second surface facing the first surface and spaced from the first surface by the gap.

3. The device of claim 2, wherein the second surface has a root mean surface roughness of up to 0.5 nm.

4. The device of claim 1, wherein the first material is a semiconductor.

5. The device of claim 4, wherein the layer of the first material includes one or more monolayers of a two-dimensional atomic crystal.

6. The device of claim 5, wherein the layer of the first material includes one or more monolayers of a metal dichalcogenide.

7. The device of claim 1, wherein the first material is an organic semiconductor or a halide perovskite.

8. The device of claim 1, wherein the second material is a metal.

9. The device of claim 1, wherein the second material is a superconductor, an insulator, or a dielectric material.

10. The device of claim 1, wherein the second material is a metal, and the layer of the second material is a metal contact.

11. The device of claim 10, wherein the metal contact is a first metal contact, and the device further comprises a layer of a third material disposed on the layer of the first material, wherein the third material is different from the first material and is the same as or different from the second material, the layer of the first material is spaced from the layer of the third material by a gap, and the layer of the third material is a second metal contact.

12. The device of claim 1, wherein the first material is a semiconductor, the device is a transistor and comprises a gate stack disposed on the layer of the first material and including the layer of the second material, and the second material is a dielectric material.

13. The device of claim 12, wherein the gate stack further includes a gate electrode disposed on the layer of the second material.

14. The device of claim 13, wherein the device further comprises a layer of a third material disposed on the layer of the first material and spaced from the layer of the first material by a gap, wherein the third material is different from the first material and is different from the second material, and the layer of the third material is a metal contact.

15. The device of claim 14, wherein the metal contact is a first metal contact, and the device further comprises a layer of a fourth material disposed on the layer of the first material and spaced from the layer of the first material by a gap, wherein the fourth material is different from the first material, is different from the second material, and is the same as or different from the third material, and the layer of the fourth material is a second metal contact.

16. The device of claim 1, wherein the first material and the second material are different materials selected from semiconductors, metals, magnetic materials, superconductors, insulators, and dielectric materials.

17. A method of forming an electronic or optoelectronic device, comprising:
    forming a layer of a second material on a substrate; and
    transferring the layer of the second material from the substrate so as to be disposed on a layer of a first material and separated from the layer of the second material by a gap, wherein the gap is a non-covalent bonding gap, and wherein the gap has a non-zero thickness of 0.05 nm or more.

18. A method of forming an electronic or optoelectronic device, comprising:
    forming a layer of a second material on a first substrate;
    transferring the layer of the second material from the first substrate so as to be disposed on a second substrate;
    forming a layer of a third material on the second substrate laterally adjacent to the layer of the second material; and
    transferring the layer of the second material and the layer of the third material from the second substrate so as to be disposed on a layer of a first material.

19. The method of claim 18, wherein the device is a photovoltaic device.

20. The method of claim 18, wherein one of the first, second or third material is a high work function metal thin film, and wherein another one of the first, second or third material is a semiconductor material.

* * * * *